United States Patent
Schmidt et al.

(10) Patent No.: US 10,175,510 B2
(45) Date of Patent: Jan. 8, 2019

(54) SMART OPTICAL MATERIALS, FORMULATIONS, METHODS, USES, ARTICLES, AND DEVICES

(71) Applicant: Dow Corning Corporation, Midland, MI (US)

(72) Inventors: Randall G. Schmidt, Midland, MI (US); Lauren M. Tonge, Sanford, MI (US); Shengqing Xu, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 15/580,104

(22) PCT Filed: Jun. 7, 2016

(86) PCT No.: PCT/US2016/036167
§ 371 (c)(1),
(2) Date: Dec. 6, 2017

(87) PCT Pub. No.: WO2017/019179
PCT Pub. Date: Feb. 2, 2017

(65) Prior Publication Data
US 2018/0299705 A1   Oct. 18, 2018

Related U.S. Application Data

(60) Provisional application No. 62/197,829, filed on Jul. 28, 2015.

(51) Int. Cl.
*G02F 1/00* (2006.01)
*G02F 1/01* (2006.01)
(Continued)

(52) U.S. Cl.
CPC ............ *G02F 1/0147* (2013.01); *G02F 1/009* (2013.01); *H01L 33/502* (2013.01);
(Continued)

(58) Field of Classification Search
CPC ..... G02F 1/0147; G02F 1/009; H01L 33/502; H01L 33/507; H01L 33/56; H01L 2933/005
See application file for complete search history.

(56) References Cited

U.S. PATENT DOCUMENTS

| 2,676,182 A | 4/1954 | Daudt et al. |
| 2,823,218 A | 2/1958 | Speier et al. |

(Continued)

FOREIGN PATENT DOCUMENTS

| DE | 1951620 | 5/1971 |
| EP | 0347895 | 12/1989 |

(Continued)

OTHER PUBLICATIONS

Abstract of DE1951620 (A1).

*Primary Examiner* — Mary Ellen Bowman

(57) ABSTRACT

A smart optical material characterized in that when the material is at ambient temperature (≤30° C.), it is opaque to at least one color light in the visible light spectrum and when the material is at an elevated temperature of at least 80° C., it is substantially transparent to the at least one color light. The smart optical material is also characterized as having before thermal aging an elongation-at-break of at least 15% and after thermal aging in air at 200° C. for seven days an elongation-at-break that is unchanged or is at least 12% and has decreased by from >0% to less than 50%. Also included are related formulations, methods, uses, articles and devices.

15 Claims, 1 Drawing Sheet

(51) Int. Cl.
  *H01L 33/50* (2010.01)
  *H01L 33/56* (2010.01)

(52) U.S. Cl.
  CPC ............ *H01L 33/507* (2013.01); *H01L 33/56* (2013.01); *H01L 2933/005* (2013.01)

(56) References Cited

U.S. PATENT DOCUMENTS

| | | |
|---|---|---|
| 2,993,809 A | 7/1961 | Bueche et al. |
| 3,024,126 A | 3/1962 | Brown |
| 3,128,196 A | 4/1964 | Pierpoint |
| 3,159,601 A | 12/1964 | Ashby |
| 3,220,972 A | 11/1965 | Lamoreaux |
| 3,296,291 A | 1/1967 | Chalk |
| 3,419,593 A | 12/1968 | Willing |
| 3,516,946 A | 6/1970 | Modic |
| 3,635,743 A | 1/1972 | Smith |
| 3,715,334 A | 2/1973 | Karstedt |
| 3,814,730 A | 6/1974 | Karstedt |
| 3,847,848 A | 11/1974 | Beers |
| 3,920,865 A | 11/1975 | Laufer et al. |
| 3,923,705 A | 12/1975 | Smith |
| 3,929,718 A | 12/1975 | Kratel et al. |
| 3,948,676 A | 4/1976 | Laufer |
| 3,989,668 A | 11/1976 | Lee et al. |
| 4,068,024 A | 1/1978 | Laufer |
| 4,111,890 A | 9/1978 | Getson et al. |
| 4,164,509 A | 8/1979 | Laufer |
| 4,454,288 A | 6/1984 | Lee et al. |
| 4,584,355 A | 4/1986 | Blizzard et al. |
| 4,585,836 A | 4/1986 | Homan et al. |
| 4,591,622 A | 5/1986 | Blizzard et al. |
| 4,784,879 A | 11/1988 | Lee et al. |
| 4,985,477 A | 1/1991 | Collins et al. |
| 5,036,117 A | 7/1991 | Chung et al. |
| 5,175,325 A | 12/1992 | Brown et al. |
| 5,783,115 A | 7/1998 | Bilkadi et al. |
| 6,368,535 B1 | 4/2002 | Katsoulis et al. |
| 6,617,674 B2 | 9/2003 | Becker et al. |
| 7,551,830 B2 | 6/2009 | Degroot et al. |
| 8,593,581 B2 * | 11/2013 | McCarthy ............... G02B 5/223 349/16 |
| 8,634,137 B2 * | 1/2014 | Powers ................. G02B 5/0231 359/485.01 |
| 8,643,795 B2 * | 2/2014 | McCarthy ................. G02F 1/19 349/20 |
| 8,699,114 B2 * | 4/2014 | McCarthy ............. G02F 1/0147 359/265 |
| 8,755,105 B2 * | 6/2014 | Powers ..................... E06B 9/24 349/167 |
| 8,760,750 B2 * | 6/2014 | Powers ..................... E06B 9/24 359/288 |
| 8,796,532 B2 | 8/2014 | Ketola et al. |
| 8,867,132 B2 * | 10/2014 | McCarthy ................. G02B 5/23 349/104 |
| 8,921,493 B2 | 12/2014 | Horstman et al. |
| 8,921,494 B2 | 12/2014 | Horstman et al. |
| 8,921,495 B2 | 12/2014 | Horstman et al. |
| 8,957,147 B2 | 2/2015 | Swier et al. |
| 9,000,472 B2 | 4/2015 | Amako et al. |
| 9,006,356 B2 | 4/2015 | Horstman et al. |
| 9,006,358 B2 | 4/2015 | Horstman et al. |
| 9,012,945 B2 | 4/2015 | Ray |
| 9,045,599 B2 | 6/2015 | Colas et al. |
| 9,045,668 B2 | 6/2015 | Horstman et al. |
| 9,051,436 B2 | 6/2015 | Horstman et al. |
| 9,076,934 B2 | 7/2015 | Horstman et al. |
| 9,082,944 B2 | 7/2015 | Wirth |
| 9,150,727 B2 | 10/2015 | Horstman et al. |
| 9,181,402 B2 | 11/2015 | Horstman et al. |
| 9,212,262 B2 | 12/2015 | Horstman et al. |
| 9,346,945 B2 | 5/2016 | Fang et al. |
| 9,688,035 B2 | 6/2017 | Swier et al. |
| 2009/0219603 A1 * | 9/2009 | Xue ....................... G02B 5/285 359/288 |
| 2012/0235190 A1 | 9/2012 | Keller et al. |
| 2013/0207148 A1 * | 8/2013 | Krauter ................... H01L 33/50 257/98 |
| 2016/0009865 A1 | 1/2016 | Jiang et al. |
| 2016/0032148 A1 | 2/2016 | Amako et al. |
| 2016/0118555 A1 | 4/2016 | Swier et al. |

FOREIGN PATENT DOCUMENTS

| | | |
|---|---|---|
| WO | 2013037148 | 3/2013 |
| WO | 2013134018 | 9/2013 |
| WO | 2014104655 | 3/2014 |
| WO | 2014197617 | 12/2014 |

* cited by examiner

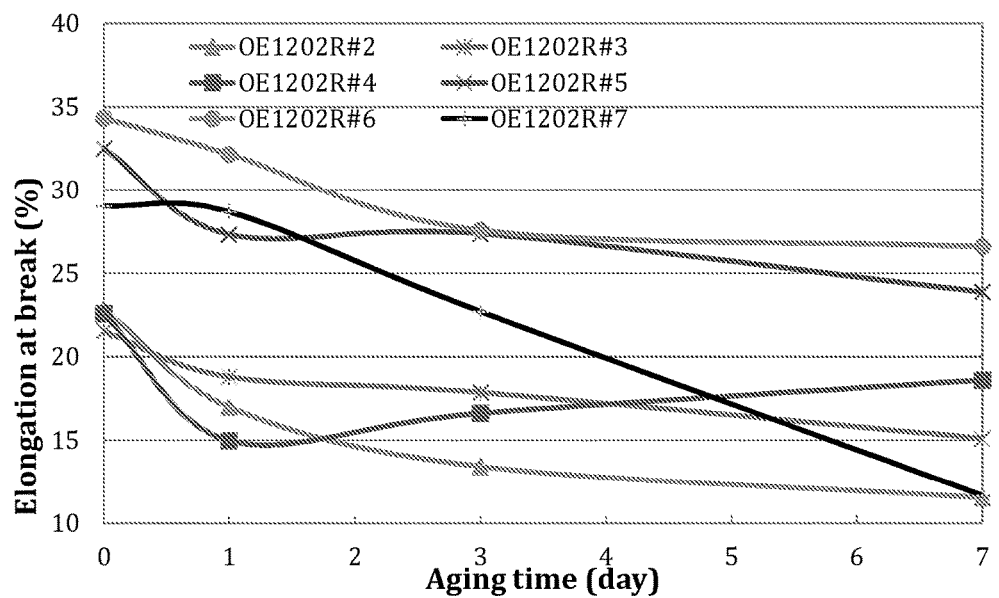

SMART OPTICAL MATERIALS, FORMULATIONS, METHODS, USES, ARTICLES, AND DEVICES

CROSS REFERENCE TO RELATED APPLICATIONS

This application is a U.S. national stage filing under 35 U.S.C. § 371 of PCT Application No. PCT/US16/036167 filed on 7 Jun. 2016, currently pending, which claims the benefit of U.S. Provisional Patent Application No. 62/197,829 filed 28 Jul. 2015 under 35 U.S.C. § 119 (e). PCT Application No. PCT/US16/036167 and U.S. Provisional Patent Application No. 62/197,829 are hereby incorporated by reference.

TECHNICAL FIELD

This invention generally relates to smart optical materials and related curable formulations, methods, uses, articles and devices.

BACKGROUND OF RELATED ART

Poor light output or transmittance efficiency is a big problem in the light-managing industry. As you would expect, prior formulators have not contemplated using hazy or cloudy materials as optical encapsulants, waveguides or connectors. Logically, they match the refractive indexes of the constituents of their formulations to maximize their transparency.

Refractive index-matched materials for LED packages are mentioned in US 2012/0235190 A1 to B. Keller. Keller is concerned with a problem of light scattering in a light emitting diode (LED) package containing an encapsulant containing a thixotropic agent having an index of refraction that is different from that of the encapsulant. He said that untreated fumed silica can have an index of refraction of approximately 1.46, and can be mixed in a conventional encapsulant such as a silicone that has an index or refraction of 1.51 or more. Keller states that this difference in index of refraction between the thixotropic agent and the encapsulant can result in the encapsulant exhibiting scattering characteristics for the light passing through the encapsulant from the LED. The refractive index mismatch gave the encapsulant a cloudy (i.e., not clear) appearance, which can reduce emission package efficiency by reducing total light output from the package. Keller's solution is an LED package containing an encapsulant with refractive index matched thickening or thixotropic agent. The LED package exhibits a reduction or elimination of encapsulant clouding and an increase in package emission efficiency. This allows the thickening or thixotropic agent to alter certain properties (e.g. mechanical or thermal) while not significantly altering the optical properties of the encapsulant.

Refractive index matching of constituents of optical formulations is the standard not just for optical encapsulants, but also for waveguides and connectors. Formulators use refractive index matching to maximize light transmittance in waveguides as described in U.S. Pat. No. 7,551,830 B2 to J. DeGroot et al. and in optical connectors as mentioned in U.S. Pat. No. 5,783,115 to Z. Bilkadi et al.

Refractive index matching is also used for solar modules in WO 2010/141697A2 to B. Ketola et al. Ketola et al. are concerned with varying optical properties of the components of a photovoltaic module based on selection or manipulation of the material. In one embodiment, it may be desirable to select a superstrate material such as glass and an encapsulant material that provide a small (i.e., <0.05) mismatch between their refractive indices to reduce the amount of reflection at the glass-encapsulant interface. The encapsulant may comprise a silicone material having a refractive index within a specific range of that of glass such as within ±0.05 of glass refractive index. In another embodiment, the refractive index of the encapsulant material is selected to be greater than the refractive index of the superstrate material to reduce escape cone losses as described therein.

Refractive index matching is used for display devices in KR 2014-085250 A to K. S. Beom et al. Beom et al. are concerned with a problem of an organic plastic substrate for certain display devices exhibiting yellowness and cloudiness or haze. They use a composite sheet of a polysiloxane-polycarbonate copolymer matrix and a reinforcing material, wherein the difference in refractive index of the reinforcing material and that of the matrix can be less than 0.01. The composite sheet had improved transparency, optical permeability, flexure resistance, and surface strength.

As you can see, prior formulators viewed hazy or cloudy optical materials as problems to be avoided. To maximize transparency at room temperature and above, they discarded hazy or cloudy materials and matched refractive indices of the constituents of the materials. Their cloudy or hazy material, which used an untreated filler, might slightly obscure, but could not hide, phosphors in an off-state optical device. And the untreated filler would decrease cracking resistance of the material after thermal aging, and thus it might decrease light transmittance of the material and light output or transmittance efficiency of the optical device in its on-state.

Other formulators used camouflage to trick the eye into overlooking an unattractive feature. A technique for camouflaging phosphors in off-state LED devices is mentioned in US 2014/0203316 A1 to W. J. Ray. Ray is concerned with a problem of adjusting the off-state color of LED light emitting structures containing a phosphor layer, such as an yttrium aluminum garnet (YAG) phosphor layer, so the off-state color is more aesthetically pleasing. In the off-state, white ambient light, such as sunlight, impinges on the phosphor layer and energizes the phosphor particles so the entire surface of the light emitting structure appears yellow. Ray uses an LED die that contains a blue LED and a mixture of a transparent binder, yellow phosphor powder, magenta-colored glass beads, and cyan-colored glass beads. Ray prints the mixture over the light emitting surface and cures it to form a wavelength conversion layer. When the LED dies are powered on, the combination of the yellow phosphor light and the blue LED light creates white light. When the LED dies are powered off, ambient light, such as sunlight, causes the conversion layer to appear to be a mixture of yellow light, magenta light, and cyan light. Ray selects the percentage of magenta and cyan beads in the mixture to create a desired off-state color, such as a neutral color, for the conversion layer for aesthetic purposes. The phosphors in Ray's device are visible, but camouflaged and thus harder for observers to distinguish separately as such.

SUMMARY OF THE INVENTION

We (the present inventors) desired a material to cover or hide wavelength converters such as phosphors in off-state optical devices and increase light output or transmittance efficiency of the devices when powered on. The material should be opaque at room temperature, but have good light transmittance when heated, and resist cracking after thermal aging.

Hazy or cloudy materials exhibit a slight obscuration, typically caused by suspended fine particles. Light and fuzzy images can pass through them, but not detailed images; objects behind the materials can been seen, but not in sharp distinction. Thus, hazy or cloudy materials cannot solve our problems.

Camouflage cannot solve our problems either. A phosphor is still visible in the off-state device, and the camouflaging material (e.g., colored glass beads) alters the binder's color and may worsen its cracking resistance.

After researching, testing and initially failing, we happily report our successful and inventive solution to our problem. The solution has uses in and beyond lighting.

The present invention generally provides smart optical materials that solve our problem by virtue of a combination of properties that is not predictable from the art. The smart optical material can cover or hide wavelength converters such as phosphors in off-state optical devices and increase light output from or light transmittance efficiency of such optical devices when they are powered on. The smart optical material is opaque at 25° C., but has good light transmittance when heated, and resists cracking after thermal aging. The most basic composition of the smart optical material is colorless to an unaided human eye. The composition of the smart optical material is distinct from the composition of the wavelength converters such as phosphors. The present invention also provides curable formulations useful for making the smart optical materials, methods of making the smart optical materials, methods of using the smart optical materials in optical and non-optical applications, optical and non-optical articles composed of the smart optical materials, optical devices using the smart optical materials, and methods of using the optical devices in optical applications.

BRIEF DESCRIPTION OF THE DRAWING(S)

Embodiments of the invention and certain advantages may be illustrated and described by referring to the accompanying drawing(s).

FIG. 1 shows a plot of elongation-at-break of examples of inventive smart optical material and one comparative non-inventive material, all being measured before thermal aging (day 0) and after having been thermally aged in air at 200° C. for from 1 to 7 days.

DETAILED DESCRIPTION OF THE INVENTION

The Brief Summary and the Abstract are incorporated here by reference. This invention is described herein in an illustrative manner by disclosing a plurality of representative, non-limiting embodiments and examples.

In some embodiments the invention is any one of the following numbered aspects.

Aspect 1. An optical device that is configured with a smart optical material that is opaque according to the Opaqueness Test Method 1 at a temperature less than 30 degrees Celsius (° C.) and optically transparent at a temperature of from 80° to 200° C. and the smart optical material has an elongation-at-break, according to the Elongation-at-Break Test Method, before thermal aging at day 0 of at least 15% and after thermal aging in air at 200° C. for 7 days at day 7 of at least 12% and the elongation-at-break of the thermally aged smart optical material would decrease from day 0 to day 7 by less than 50%; the device comprising a light emitting element; a heat generating element, which may be the same as or different than the light emitting element and which is in thermal communication (via indirect or direct contact) with the smart optical material; a wavelength converter in independent optical communication with the light emitting element and the smart optical material (e.g., the smart optical material may comprise a light pathway between the light emitting element and the wavelength converter); and the smart optical material, which hides the wavelength converter when the smart optical material is at a temperature less than 30° C. and transmits light from the light emitting element and/or from the wavelength converter when the smart optical material is at a temperature from 80° to 200° C. In some aspects, the smart optical material is characterized by T % of at $\lambda$ 600 nm according to the Transmittance Test Method (described later) at 80° C. of at least 50%, alternatively at least 54%, alternatively at least 57%, alternatively any one of the foregoing T % and at most 59%. In some aspects, the smart optical material is characterized by T % of at $\lambda$ 600 nm according to the Transmittance Test Method (described later) at 100° C. of at least 53%, alternatively at least at least 60%, alternatively at least 65%, alternatively any one of the foregoing T % and at most 70%. In some aspects, the smart optical material is characterized by T % of at $\lambda$ 600 nm according to the Transmittance Test Method (described later) at 125° C. of at least 60%, alternatively at least 65%, alternatively at least 69%, alternatively at least 75%, alternatively any one of the foregoing T % and at most 80%. In some aspects, the smart optical material is characterized by T % of at $\lambda$ 600 nm according to the Transmittance Test Method (described later) at 150° C. of at least 65%, alternatively at least 73%, alternatively at least 80%, alternatively any one of the foregoing T % and at most 85%. In some aspects, the smart optical material is characterized by T % of at $\lambda$ 600 nm according to the Transmittance Test Method (described later) at 200° C. of at least 70%, alternatively at least 75%, alternatively at least 78%, alternatively any one of the foregoing values and at most 82%.

Aspect 2. The optical device of aspect 1 wherein the optical device comprises a wavelength converter comprising at least one wavelength converting element or a wavelength converting layer comprising a plurality of wavelength converting elements.

Aspect 3. The optical device of aspect 2 wherein the device is configured such that the smart optical material is disposed in direct contact with the wavelength converter.

Aspect 4. The optical device of aspect 2 wherein the device is configured such that the smart optical material is spaced apart from the wavelength converter so as to define a gap between the smart optical material and the wavelength converter.

Aspect 5. The optical device of aspect 4, wherein the gap is filled with a gas.

Aspect 6. The optical device of any one of aspects 1 to 5 wherein the wavelength converter comprises a phosphor or a phosphor layer comprising a plurality of phosphors. Plurality of phosphors comprises phosphor particles.

Aspect 7. The optical device of any one of aspects 1 to 6, wherein the wavelength converter is a material that upon exposure to visible light responsively emits a yellow or orange light or red or green light. In some aspects the emitted light is yellow or orange, alternatively yellow, alternatively orange, alternatively green or red, alternatively green, alternatively red.

Aspect 8. The optical device of any preceding aspect wherein the light emitting element is a light emitting diode (LED).

Aspect 9. The optical device of aspect 8 wherein the light emitting element and the heat generating element are the same.

Aspect 10. The optical device of any preceding aspect further comprising a power supply and thereby having an unpowered off-state and a powered on-state such that in the powered on-state the smart optical material is heated to a temperature of from 80° to 200° C. The unpowered off-state may be converted to the powered on-state by turning the power supply on, and the powered on-state may be converted to the unpowered off-state by turning the power supply off.

Aspect 11. The optical device of aspect 10 wherein when the optical device is in its unpowered off-state the smart optical material is at a temperature of less than 30° C. and wherein when the optical device is in its powered on-state the smart optical material is at a temperature of from 100° to <120° C., from 120° to <150° C., from 150° to <180° C., or from 180° to 200° C.

Aspect 12. A method of blocking and/or transmitting light using the optical device of any one of aspects 1-11, the method comprising: Exposing the optical device to visible light when the smart optical material is at a temperature of from −40° to 30° C. such that the smart optical material blocks enough visible light from reaching the wavelength converter and/or blocks enough converted light from the wavelength converter from exiting the optical device so as to hide the wavelength converter; or Powering the optical device when the smart optical material is at a temperature of at least 80° C. such that the light emitting element is emitting light at a first wavelength, which is then transmitted to the wavelength converter, which responsively emits a light at a second wavelength, which is transmitted through at least a portion of the smart optical material to a light receiver, wherein the first wavelength is different than the second wavelength; or Performing both the exposing and powering steps at different times.

Aspect 13. The method of aspect 12 wherein the wavelength converter is a phosphor that responsively emits yellow or orange light such that the second wavelength is from 570 to 600 nm; or wherein the light receiver is a photodetector, a surface in need of illumination, or an eye.

Aspect 14. A smart optical material as described in any preceding aspect.

Aspect 15. The smart optical material of aspect 14 comprising a first composition of a thermo-optical matrix and a second composition of an athermo-optical filler as a finely divided solid particulate that is dispersed in the thermo-optical matrix at a loading of from >5 to 40 weight percent (wt %) based on total weight of the smart optical material; wherein the athermo-optical filler is a treated particulate filler that has been prepared by treating an untreated particulate filler with a filler treating agent, wherein the athermo-optical filler (after filler treatment) has an average particle size (diameter) of from >8 nm to 500 nm, with the proviso that when the athermo-optical filler comprises treated silica, it is at least 50% equivalent of a treated precipitated silica or a treated fumed silica; wherein the first composition of the thermo-optical matrix has a thermo-optic coefficient, $(dn/dT)^M$, and the second composition of the athermo-optical filler has a thermo-optic coefficient, $(dn/dT)^F$, and the first and second compositions are mismatched such that the ratio $(dn/dT)^M/(dn/dT)^F$ is from >2 to 20; and wherein the first composition of the thermo-optical matrix has at 23 degrees Celsius (° C.) using light at 633 nm a refractive index, $n_{23/q}^M$, and the second composition of the athermo-optical filler has at 23° C. using light at 633 nm a refractive index, $n_{23/q}^F$, and the first and second compositions are mismatched such that $n_{23/q}^M - n_{23/q}^F \approx 0.020$ and the ratio $n_{23/q}^M/n_{23/q}^F$ is from 1.009 to 1.094; and therefore for the second composition of the athermo-optical filler having known values of $n_{23/q}^F$ and $(dn/dT)^F$, the first composition of the thermo-optical matrix is formulated to have a mismatched value for $n_{23/q}^M$ having a predetermined difference greater than $n_{23/q}^F$ such that when a test sample of the smart optical material is at 25° C. and has a thickness of 5.0 millimeters (mm), the smart optical material is opaque to light at wavelength 600 nanometers (nm) according to the Opaqueness Test Method 1 and when the test sample of the smart optical material is at an elevated temperature, $T_Z$, of 80° to 200° C., the thermo-optical matrix has a refractive index, $n_{z/q}^M$, and the athermo-optical filler has a refractive index, $n_{z/q}^F$, and $n_{z/q}^M$ and $n_{z/q}^F$ are matched such that the ratio $n_{z/q}^M/n_{z/q}^F$ is 1.000±0.008 and the smart optical material is optically transparent to light at wavelength 600 nm; and with the proviso that the smart optical material does not contain an untreated silica. In some aspects the athermo-optical matrix is a silica that has been sufficiently or fully treated such that the resulting treated silica is dispersible at loadings up to 45 wt % in the curable silicone composition. If the silica has not been sufficiently treated, it would interact too strongly with the thermo-optical matrix, resulting in crepe.

Aspect 16. The smart optical material of aspect 15: wherein the thermo-optical matrix comprises an organic polymer having $n_{23/q}^M$ of 1.470 to 1.54 and the athermo-optical filler comprises a treated precipitated or a treated fumed silica having $n_{23/q}^F$ of 1.450 to 1.465 and an average particle size from 8.5 to 300 nm; or wherein the thermo-optical matrix comprises a poly(vinyl acetate) having $n_{23/q}^M$ of 1.470 to 1.54 and the athermo-optical filler comprises a treated precipitated silica or a treated fumed silica having $n_{23/q}^F$ of 1.450 to 1.465 and an average particle size from 8.5 to 300 nm. In some aspects the average particle size of the treated precipitated or treated fumed silica is from 8.5 to 100 nm, alternatively from 8.5 to 49 nm.

Aspect 17. The smart optical material of aspect 15: wherein the thermo-optical matrix is a Si-aryl and Si-alkyl functional poly(organosiloxane) that has $n_{23/q}^M$ of 1.475 to 1.55; or wherein the athermo-optical filler comprises a treated precipitated silica or a treated fumed silica having $n_{23/q}^F$ of 1.450 to 1.465 and an average particle size from 8.5 to 300 nm; or wherein the loading of athermo-optical filler is from >5 to 35 wt % based on total weight of the smart optical material; wherein the ratio $n_{23/q}^M/n_{23/q}^F$ is from 1.010 to 1.090; or wherein the ratio $(dn/dT)^M/(dn/dT)^F$ is from >2 to 20; or wherein $T_Z$ is from 100° to 200° C.; or wherein the thermo-optical matrix is a Si-aryl and Si-alkyl functional poly(organosiloxane) that has $n_{23/q}^M$ of 1.475 to 1.55; the athermo-optical filler comprises a treated precipitated silica or a treated fumed silica having $n_{23/q}^F$ of 1.450 to 1.465 and an average particle size from greater than 8.5 to 300 nm; the loading of from >5 to 35 wt % based on total weight of the smart optical material; the ratio $n_{23/q}^M/n_{23/q}^F$ is from 1.010 to 1.090; the ratio $(dn/dT)^M/(dn/dT)^F$ is from >2 to 20; and $T_Z$ is from 100° to 200° C. In some aspects the average particle size of the treated precipitated or treated fumed silica is from 8.5 to 100 nm, alternatively from 8.5 to 49 nm.

Aspect 18. The smart optical material of aspect 17 wherein the Si-aryl and Si-alkyl functional poly(organosiloxane) of the thermo-optical matrix is represented by the general formula (I): $R_nSi_{(4-n)/2}$ (I), wherein subscript n is 1 or 2 and each R independently is $(C_6-C_{12})$aryl or $(C_1-C_{12})$alkyl, with the proviso that at least some R is the $(C_6-C_{12})$aryl and at least some R is the $(C_1-C_{12})$alkyl.

Aspect 19. The smart optical material of aspect 16 or 17: wherein $(dn/dT)^M$ is from $-2.5\times10^{-4}$/Kelvin to $-5\times10^{-4}$/Kelvin and $n_{23/q}^M$ is from 1.480 to 1.490; or wherein $(dn/dT)^M$ is from $-2.5\times10^{-4}$/Kelvin to $-5\times10^{-4}$/Kelvin and $n_{23/q}^M$ is from 1.490 to 1.510; or wherein $(dn/dT)^M$ is from $-2.5\times10^{-4}$/Kelvin to $-5\times10^{-4}$/Kelvin and $n_{23/q}^M$ is from 1.510 to 1.530; or wherein $(dn/dT)^M$ is from $-2.5\times10^{-4}$/Kelvin to $-5\times10^{-4}$/Kelvin and $n_{23/q}^M$ is from 1.530 to 1.550.

Aspect 20. The smart optical material of any one of aspects 16 to 19: wherein $(dn/dT)^F$ is <0/Kelvin; or wherein $(dn/dT)^F$ is >0/Kelvin.

Aspect 21. The smart optical material of any one of aspects 16 to 20: wherein the thermo-optical matrix is a Si-phenyl and Si-methyl functional poly(organosiloxane) that has $n_{23/q}^M$ of 1.475 to 1.54 and $(dn/dT)^M$ is from $-2.5\times10^{-4}$/Kelvin to $-5\times10^{-4}$/Kelvin; or wherein the athermo-optical filler comprises a treated fumed silica having $n_{23/q}^F$ of 1.450 to 1.465, an average particle size from 9 to 300 nm, and $(dn/dT)^F$ of from $-1.5\times10^{-5}$/Kelvin to $+1.5\times10^{-5}$/Kelvin; or wherein the loading of athermo-optical filler is from >5 to 35 wt % based on total weight of the smart optical material; or wherein the ratio $n_{23/q}^M/n_{23/q}^F$ is from 1.020 to 1.050; or the ratio $(dn/dT)^M/(dn/dT)^F$ is from >2 to 10; or wherein $T_Z$ is from 120° to 200° C.; or wherein the thermo-optical matrix is a Si-phenyl and Si-methyl functional poly(organosiloxane) that has $n_{23/q}^M$ of 1.475 to 1.54 and $(dn/dT)^M$ of from $-2.5\times10^{-4}$/Kelvin to $-5\times10^{-4}$/Kelvin; the athermo-optical filler comprises a treated fumed silica having $n_{23/q}^F$ of 1.450 to 1.465, an average particle size from 9 to 300 nm, and $(dn/dT)^F$ of from $0.5\times10^{-5}$/Kelvin to $2\times10^{-5}$/Kelvin; the loading of from >5 to 35 wt % based on total weight of the smart optical material; the ratio $n_{23/q}^M/n_{23/q}^F$ is from 1.020 to 1.050; the ratio $(dn/dT)^M/(dn/dT)^F$ is from >2 to 10; and $T_Z$ is from 120° to 200° C.

Aspect 22. The smart optical material of aspect 21 wherein the athermo-optical filler comprises a treated fumed silica having $n_{23/q}^F$ of 1.450 to 1.465, an average particle size from 9 to 49 nm, and $(dn/dT)^F$ of from $-1.5\times10^{-5}$/Kelvin to $+1.5\times10^{-5}$/Kelvin.

Aspect 23. The smart optical material of any one of aspects 16 to 22 comprising a reaction product of hydrosilylation curing a curable organosiloxane composition comprising constituents (A)-(D): (A) a Si-aryl and Si-alkyl functional organopolysiloxane containing an average, per molecule, of at least two silicon-bonded alkenyl groups; (B) a Si-aryl and/or Si-alkyl functional organosilicon compound containing an average of at least two silicon-bonded hydrogen atoms per molecule; (C) a hydrosilylation catalyst; and (D) the athermo-optical filler; wherein the athermo-optical filler is pre-formed prior to being contacted with constituents (A) to (C); wherein the athermo-optical filler is at a concentration from 1 to 45 weight percent based on total weight of the curable organosiloxane composition.

Aspect 24. The smart optical material of any one of aspects 16-23 with the proviso that the smart optical material does not contain an untreated athermo-optical filler. In some aspects the athermo-optical matrix is a silica that has been sufficiently or fully treated. Aspect 25. A method of making the smart optical material of any one of aspects 14-24, the method comprising subjecting a curable formulation comprising a uniform mixture of the athermo-optical filler widely dispersed in a mixture of two or more matrix-forming precursors to a curing condition sufficient to convert the matrix-forming precursors to the thermo-optical matrix, and thereby make the smart optical material.

Aspect 26. A lens comprising the smart optical material of any one of aspects 14-24 configured in a shape for converging or diverging light rays.

Aspect 27. A heat conductor comprising the smart optical material of any one of aspects 14-24 disposed in contact or thermal communication with a source of thermal energy.

Aspect 28. The invention of any one preceding numbered aspect, wherein the athermo-optical filler is a masterbatch treated athermo-optical filler, alternatively the athermo-optical filler is a precipitated or fumed silica In any one of the above numbered aspects 1-28, the athermo-optical filler such as the treated precipitated or treated fumed silica may be an in situ treated filler masterbatch such as an in situ treated precipitated silica or in situ treated fumed silica. In other embodiments, the athermo-optical filler such as the treated precipitated or treated fumed silica may a pretreated filler such as a pretreated precipitated silica or pretreated treated fumed silica.

The present invention provides smart optical materials and related curable formulations, methods, uses, articles and devices. The smart optical material is comprised of a thermo-optical matrix and an athermo-optical filler. The smart optical material is characterized in that when the material is at 25° C., it is opaque to at least one color light in the visible light spectrum and when the material is at an elevated temperature of at least 80° C., it is substantially transparent to the at least one color light. The smart optical material is also characterized as having before thermal aging an elongation-at-break of at least 15% and after thermal aging in air at 200° C. for seven days an elongation-at-break that is unchanged or is at least 12% and has decreased by from >0% to less than 50%. The most basic composition of the smart optical material is colorless to an unaided human eye. The composition of the smart optical material is distinct from the composition of the wavelength converters such as phosphors.

The smart optical material has a number of advantages and benefits and enables optical devices having a number of advantages and benefits. The smart optical material is suitable for use in numerous end uses and applications, including lighting and non-lighting applications. For example, lighting applications include optical encapsulants and non-lighting applications include sealants.

The inventive articles comprise the smart optical material. The methods include methods of shaping the smart optical materials into a shaped article (e.g., a dome, lens, film, slab, and other shapes). The uses include using the smart optical materials as an optical encapsulant, a waveguide, or an optical connector. The uses also include non-optical uses such as building materials. The optical devices comprise the smart optical material and an optical element in contact therewith. The inventive aspects are suitable for use in numerous end uses and applications, including lighting, building and other applications.

All U.S. patent application publications and patents referenced below, or a portion thereof if only the portion is referenced, are hereby incorporated herein by reference to the extent that the incorporated subject matter does not conflict with the present description, which would control in any such conflict.

The description of this invention uses certain abbreviations. Unit abbreviations: ° is degrees; ° C. is degrees Celsius; g is gram(s); K is Kelvin; λ or lambda is light wavelength; μm is micrometer; mm is millimeters; mol is mole(s); nm is nanometers; % is percent; T % is percent transmittance; n is refractive index; TOC or dn/dT is thermo-optic coefficient; wt is weight; wt % is weight percent.

The description of this invention uses certain terms and expressions. As used herein, "alternatively" refers to a separate and distinct embodiment. As used herein, "contacting" means bringing into physical contact. "Operative" means functionally effective, wherein the effect may be a direct effect, alternatively an indirect affect. For example, reactants may be brought into direct physical contact in a reaction thereof, with or without a catalyst; and components of an article or device may be brought into "operative contact," which includes direct physical touching, alternatively indirect touching via one or more intermediary components. "Optionally" means is absent, alternatively is present. Any Markush group comprising a genus and subgenus therein includes the subgenus in the genus, e.g., in "R is hydrocarbyl or alkenyl," R may be alkenyl, alternatively R may be hydrocarbyl, which includes, among other subgenuses, alkenyl. As used herein, "may" confers a choice, not an imperative. All "molecular weight" of a macromolecular material, such as a number average molecular weight ($M_n$) or weight average molecular weight ($M_w$) of a polymer, is determined using gel permeation chromatography and polystyrene standards unless noted herein otherwise. The term "silicone" includes linear, branched, or a mixture of linear and branched polyorganosiloxane macromolecules. All "wt %" (weight percent) are, unless otherwise noted, based on total weight of all ingredients or constituents used to make the composition or formulation, which adds up to 100 wt %.

In some aspects any composition described herein may contain any one or more of the chemical elements of Groups 1 to 18 of the Periodic Table of the Elements. In some aspects at least one such chemical element is specifically excluded from the composition, except not excluded are Si, O, H, C, N, F, Cl, Br, and I; alternatively Si, O, H, C, F, and Cl. In some aspects the specifically excluded chemical elements may be: (i) at least one chemical element from any one of Groups 2 to 13 and 18, including the lanthanoids and actinoids; (ii) at least one chemical element from any one of the third to sixth rows of the Periodic Table of the Elements, including the lanthanoids and actinoids; or (iii) both (i) and (ii), except not excluding Si, O, H, C, N, F, Cl, Br, or I.

"In situ" treated means modifying surface chemistry of the untreated particulate solid by reaction of its surface functional groups thereon with a filler treating agent by contacting the untreated particulate solid (e.g., an untreated athermo-optical filler) with a mixture of the filler treating agent and some, but not all of the matrix-forming precursor(s) to selectively react the filler treating agent with the untreated particulate solid in the presence of the matrix-forming precursor(s) to yield a treatment mixture comprising an in situ treated particulate solid (e.g., an in situ treated athermo-optical filler) and the matrix-forming precursor(s). The mixture may further comprise one or more by-products from the reaction. The filler treating agent is distinct from the matrix-forming precursor(s) in at least one of functional group, reactive functional group, structure, molecular weight, or reactivity towards the free functional groups of the natural surface chemistry of the untreated particulate solid (e.g., of the untreated filler). In some aspects the amount(s) and/or composition(s) of the matrix-forming precursor(s) is/are chosen in such a way that the in situ treatment yields a treatment mixture suitable for being combined with more of the matrix-forming precursor(s) and/or with additional constituents to yield a single curable formulation. In some aspects the in situ treatment the amount(s) and/or composition(s) of the matrix-forming precursor(s) is/are chosen in such a way that the in situ treatment yields a masterbatch. In some aspects the masterbatch, after the in situ treatment, is then subdivided into smaller lots, each of which may independently be combined with more of the matrix-forming precursor(s) and/or with one or more additional constituent(s) to yield two or more different curable formulations. For example, an in situ treated fumed silica masterbatch may be prepared by simultaneously or sequentially contacting an untreated fumed silica with a filler treating agent (e.g., hexamethyldisilazane) and some or all of an aliphatically unsaturated functional constituent so as to give an in situ treated fumed silica masterbatch consisting essentially of an in situ treated fumed silica and the aliphatically unsaturated functional constituent, but lacking or being free of a SiH-functional silane or SiH-functional siloxane or hydrosilylation catalyst. A hydrosilylation curable organosiloxane composition may later be prepared by contacting the treated fumed silica masterbatch with the SiH functional silane or SiH functional siloxane, or the SiH functional silane and a hydrosilylation catalyst or the SiH functional siloxane and a hydrosilylation catalyst to give the hydrosilylation curable organosiloxane composition. Alternatively, the treated fumed silica masterbatch may be subdivided into two or more lots, and each lot may independently be contacted with different amounts and/or different compositions of the SiH functional silane or SiH functional siloxane, or the SiH functional silane and a hydrosilylation catalyst or the SiH functional siloxane and a hydrosilylation catalyst to give two or more hydrosilylation curable organosiloxane compositions.

"Opaque" generally means not able to be seen through. As used herein, the term "opaque" means having, at 25° C., a rating of "0 (invisible yellow/orange)" in the Opaqueness Test Method 1 or 2 described later. In some embodiments opaque means having a rating of "0 (invisible yellow/orange)" in the Opaqueness Test Method 1; alternatively having a rating of "0 (invisible yellow/orange)" in the Opaqueness Test Method 2; alternatively having a rating of "0 (invisible yellow/orange)" in the Opaqueness Test Method 1 and in the Opaqueness Test Method 2. In contrast, a rating of "1 (slightly visible yellow/orange)" is obtained for hazy or cloudy materials and a rating of "2 (visible yellow/orange)" is obtained for clear materials.

"Pretreated" means modifying surface chemistry of the untreated particulate solid, and isolating the resulting treated particulate solid as a powder before contacting the resulting treated particulate solid powder with any matrix-forming precursors. The in situ treated athermo-optical filler and the pretreated athermo-optical filler are distinct from each other in at least one aspect such as surface chemistry, covalent bonding to a matrix or not, extent of surface treatment, extent of agglomeration or aggregation.

"Refractive index" is also known as absolute refractive index or index of refraction and is a measurement that indicates how light at a particular wavelength propagates through a medium at a particular temperature. Refractive index is represented by a dimensionless number, n. When refractive index, n, is reported for a material obtained from a commercial supplier, it typically has been measured at 20° C. or 22° C. using light having either a Fraunhofer line for helium having a wavelength of 588 nanometers (nm), e.g., 587.5618 nm, and it is designated, $n_{20/f}$ or $n_{22/f}$, respectively; or when measured at 20° C. or 22° C. using light having a sodium D line having a wavelength of 589.3 nm, and it is designated, $n_{20/d}$ or $n_{22/d}$, respectively. When refractive index, n, is reported for a material synthesized or prepared as described herein, it typically has been measured at 23° C. using light having a wavelength of 633 nm and it is designated, $n_{23/q}$. It is expected that $n_{23/q}$ would be substantially the same as $n_{22/d}$. For example, for untreated fumed silica $n_{22/d}$ minus $n_{23/q}$ may be 0.0014. When refractive index, n, is measured at the present elevated operating temperature, $T_Z$, using light having a wavelength of 633 nanometers, it is designated, $n_{z/q}$. The $n_{20/d}$, $n_{20/\beta}$, $n_{23/q}$ and $n_{z/q}$ measurements may be made on a Prism coupler, Metricon 2010 instrument (Metricon Company, Pennington, N.J., USA).

"Thermo-optic coefficient" (TOC or dn/dT) means a change (i.e., delta or d) in a refractive index, n, with change (i.e., delta or d) in temperature (T), or dn/dT, from 23° to 100° C. Temperature is expressed in Kelvin (K). For example, a dn/dT of $-1.0 \times 10^{-4}$ K$^{-1}$ is the same as $-1.0 \times 10^{-4}$/K and means that for every 1.0 K increase in temperature, n decreases by 0.0001. Conversely, a dn/dT of $+1.0 \times 10^{-5}$/K means that for every 1.0 K increase in temperature, n increases by 0.00001. The dn/dT may be valid from 20° C. up to an optical device operating temperature, $T_Z$, of at least 80° C. Maximum $T_Z$ may be any one of the maximum operating temperatures, $T_Z$, described later. As used herein, the term "athermo-optic" means having a dn/dT of from 0 K$^{-1}$ to $<-2.0 \times 10^{-4}$ K$^{-1}$; alternatively from 0 K$^{-1}$ to $<-1.6 \times 10^{-4}$ K$^{-1}$; alternatively from >0 K$^{-1}$ to $-1.0 \times 10^{-4}$ K$^{-1}$. As used herein, the term "thermo-optic" means having a dn/dT of greater than or equal to $-2.0 \times 10^{-4}$ K$^{-1}$, alternatively $\geq -2.5 \times 10^{-4}$ K$^{-1}$, alternatively $\geq -3.0 \times 10^{-4}$ K$^{-1}$.

"Treated" as independently applied to a particulate solid (e.g., particulate solid fillers and phosphors) means modifying surface chemistry of the particulate solid by way of contacting the particulates with a reactant called a filler treating agent (or, simply, treating agent, which is described later) such that most, substantially all, or all, surface groups on the particulates (e.g., SiOH groups on fumed silica) are functionalized so as to modify the interaction between the particulates and a host material (e.g., a matrix, e.g., the thermo-optical matrix), and typically without decreasing the refractive index of the particulates. The surface groups may be functionalized by bonds to the filler treating agent, wherein the bonds may be covalent bonds or van der Waals bonds. E.g., the agent may be covalently bonded or tightly absorbed onto the surface of the particulates. In such aspects treated may mean in situ treated or pretreated.

"Untreated" as independently applied to a particulate solid (e.g., silica or phosphors) means having a naturally formed surface chemistry as obtained from manufacture thereof. E.g., an untreated fumed silica may have naturally formed surface chemistry obtained from manufacture thereof via flame pyrolysis of silicon tetrachloride or quartz sand, where the naturally formed surface chemistry consists essentially of free SiOH groups. Once manufactured, an untreated fumed silica, if exposed to air, may absorb water molecules on its surface, but such silica would still be untreated. In non-invention aspects, an untreated particulate solid may be mixed with matrix forming precursors to give a non-invention curable composition consisting essentially of the untreated particulate solid and the matrix-forming precursors, but lacking or free of a constituent that functions as a filler treating agent. The particulate solid remains untreated, even after curing the matrix forming precursors, as long as there is no filler treating agent. A "filler treating agent" is typically an organic or Si-based compound (not water) that preferentially reacts with free functional groups of the natural surface chemistry of the untreated particulate solid rather than with matrix forming precursors. The filler treating agent is distinct from the matrix-forming precursors in functional group, reactive functional group, structure, molecular weight, or reactivity towards the free functional groups of the natural surface chemistry of the untreated particulate solid (e.g., of the untreated filler). The non-invention curable composition may then be cured, in the absence of any filler treating agent, to give the untreated particulate solid disposed in a matrix, wherein the untreated particulate solid may be, or may not be, covalently bonded at some, but not all surface functional groups to a functional group of the matrix.

As used herein, "visible light" means electromagnetic radiation in the spectrum detectable by the unaided human eye, typically from 380 nm to 750 nm. The visible light spectrum is composed of violet, blue, green, yellow, orange, and red light. As used herein, violet light means electromagnetic radiation of from 380 to 450 nm; blue light is from 450 to 495 nm; green light is from 495 to 570 nm; yellow light is from 570 to 590 nm; orange light is from 590 to 620 nm; and red light is from 620 to 750 nm.

Aspects of this invention encompass using any type of treated athermo-optical filler, including a pretreated athermo-optical filler or an in situ treated athermo-optical filler, or any mixture of at least one pretreated athermo-optical filler and at least one in situ treated athermo-optical filler. In some embodiments, certain types of treated athermo-optical filler may be preferred. Some aspects use a pretreated athermo-optical filler, alternatively an in situ treated athermo-optical filler, alternatively a combination of a pretreated athermo-optical filler and an in situ treated athermo-optical filler. Any such pretreated athermo-optical filler and/or in situ treated athermo-optical filler may be in the form of a masterbatch as described above. For most embodiments, we believe that the in situ treated athermo-optical filler will perform better than, and is preferred over, using the pretreated athermo-optical filler. Regarding using the pretreated athermo-optical filler, the curable formulation is prepared by mixing its constituents, including the filler treating agent, which mixing generates processing shear, which in turn would undesirably open up untreated areas on a pretreated athermo-optical filler, whereas when preparing the in situ masterbatch treated athermo-optical filler that same mixing works to our advantage by opening up untreated areas on the untreated athermo-optical filler that can then react with the filler treating agent. Suitable in situ masterbatch treatment methods and pretreatment methods are generally known and readily adoptable herein. For example, suitable in situ masterbatch treatment methods for preparing masterbatch treated silicas are described in WO 2013/037148A1 to Fang, et al. and in WO 2014/124362A1 to Jiang, et al. Pretreated athermo-optical fillers are commercially available from suppliers or readily prepared by known methods.

The smart optical material is characterized as "smart" because when the material is at ambient temperature (the environment surrounding an optical device in its off-state, typically e.g., 30° C., e.g., from −10° to 30° C.), it is opaque to at least one color light in the visible light spectrum, but when the material is at an elevated temperature of at least 80° C., alternatively at least 100° C., alternatively at least 120° C., alternatively at least 150° C., alternatively at least 180° C., alternatively from any one of the foregoing temperatures to 220° C., alternatively 200° C., it is substantially transparent to the at least one color light. For example as described below, the smart optical material may be designed in any way that enables the aforementioned "smart" functionality such that when the smart optical material is at 25°

C., it is opaque to yellow or orange light according to the Opaqueness Test Method 1 or 2 described later and when the smart optical material is at the elevated operating temperature, $T_Z$, of at least 80° C., it is substantially transparent to the yellow or orange light (e.g., 600 nm). The smart optical material itself may be substantially colorless or colorless at 25° C. The smart optical material may lack a colorant, which is different and distinct from the wavelength converter such as a phosphor in composition. Alternatively, the smart optical material may further comprise a colorant, as described later.

Advantageously, the smart optical material is tunable to maximize light transmittance at an expected operating temperature, and the invention includes a method of "tuning" the smart optical material. The tuning adjusts or adapts the constituents of the smart optical material to perform a covering function at ambient temperature and an enhanced (optimized) transmittance function at its expected operating temperature, $T_Z$. For example, the smart optical material goes from being opaque at 25° C. according to the Opaqueness Test Method 1 or 2 to being substantially more transmitting up to optically clear at $T_Z$. This tuning ensures the "smart" characteristic or property is imparted to the smart optical material.

The tuning cannot be done randomly, but is scientifically based. This is because randomly formulated encapsulants would not necessarily be opaque at 25° C. (e.g., see comparative slabs later) and those that might happen by chance to be opaque at 25° C. would not necessarily turn optically clear at $T_Z$. For example, if the thermo-optic coefficients of the constituents of the randomly formulated encapsulants were approximately the same or insignificantly different, then that encapsulant which would start out opaque at 25° C. would remain opaque at $T_Z$.

The tuning may be done by more than one way, including adjusting primary factors such as by mismatching solubilities and/or mismatching refractive indexes and thermo-optic coefficients of one or more of the constituent(s) of the smart optical material. In addition to adjusting primary factors, if desired secondary factors may be adjusted for fine tuning as described later. All such ways are included herein. One of the primary ways to tune the smart optical material is by adjusting solubilities of its different constituents to enable the aforementioned "smart" functionality. For example, in such aspects the smart optical material may comprise an opaque dispersion of two constituents, one comprising a continuous phase and the other a discontinuous phase dispersed therein at ambient temperature, wherein at the elevated operating temperature, $T_Z$, the discontinuous phase dissolves in the continuous phase so as to form in situ a homogeneous, optically clear solution at $T_Z$. Upon cooling of the solution down to ambient temperature, the discontinuous phase may precipitate so as to reform the opaque dispersion. Another of the primary ways to tune the smart optical material by adjusting solubilities is using a constituent (e.g., a thermo-optical matrix) comprising a collection of macromolecules, each having two phase domains covalently bonded to each other. One phase domain may comprise a discontinuous phase portion and the other a continuous phase portion. An example of such a multi-phase domain material is a block organosiloxane polymer containing linear blocks and non-linear blocks, which include the block organosiloxanes described in EP 1074574A1, WO 2012/040302, WO 2012/040305, WO 2012/040367, WO 2012/040453, WO 2012/040457, WO 2013/082451, WO 2013/109607, WO 2013/130574, WO 2013/134018, WO 2013/138089, WO 2013/142138, WO 2013/142140, WO 2013/142252, WO 2013/148979, WO 2013/154718, WO 2014/150841, WO 2014/186556, and WO 2014/197617.

Another of the primary ways to tune the smart optical material is by adjusting refractive indices at 23° C. ($n_{23/q}^M$ and $n_{23/q}^F$, respectively) and thermo-optic coefficients ($(dn/dT)^M$ and $(dn/dT)^F$, respectively). This tuning comprises formulating its constituents (e.g., the thermo-optical matrix and the athermo-optical filler) to have mismatched thermo-optic coefficients ($(dn/dT)^M$ and $(dn/dT)^F$, respectively) and mismatched refractive indices at 23° C. ($n_{23/q}^M$ and $n_{23/q}^F$, respectively) and matched refractive indices at $T_Z$ ($n_{z/q}^M$ and $n_{z/q}^F$, respectively). These mismatches are done in such a way that can be characterized using a 5.0 millimeter (mm) thick test sample of the smart optical material. Particularly, the $n_{23/q}$ mismatching is done such that the test sample of the smart optical material is opaque to light at a wavelength of 600 nanometers (nm) at 25° C. The dn/dT mismatching and resulting $n_{z/q}$ matching is done such that the test sample is at least 50% more transmitting, up to and including being clear (T %=100%), to such light at the $T_Z$ (e.g., from T %=<50% at 25° C. to T %≥60% at $T_Z$). Remarkably, especially given the difficulty in the lighting art to design optical encapsulants that can be operated at high temperature (e.g., $T_Z$ 120° C. or higher) with satisfactory light output and/or light transmittance efficiency over time, the smart optical material is beneficially characterized by high light output and/or light transmittance efficiency at 120° C. or higher than at 80° to 100° C., or at 25° C., and typically is beneficially characterized by high light output and/or light transmittance efficiency at 150° C. than at 120° C.

Typically the starting point for the refractive index-based tuning method embodiments includes using an athermo-optical filler having a known refractive index at 23° C. (i.e., $n_{23/q}^F$) and using a thermo-optical matrix having a refractive index at 23° C. (i.e., $n_{23/q}^M$) that is at least 0.0200 higher, alternatively at least 0.025 higher, alternatively at least 0.030 higher, alternatively at least 0.040 higher, alternatively at least 0.050 higher, alternatively at least 0.055 higher than the filler's $n_{23/q}^F$. The starting point also includes having the athermo-optical filler's thermo-optic coefficient (i.e., $(dn/dT)^F$) that is an insignificant value relative to the thermo-optical matrix's thermo-optic coefficient (i.e., $(dn/dT)^M$). E.g., as absolute numbers, $|(dn/dT)^F| \leq 0.1 \times |(dn/dT)^F|$. The athermo-optical filler's thermo-optic coefficient (i.e., $(dn/dT)^F$) has an insignificant effect on its refractive index, $n_{z/q}^F$, over a +60° to +180° C. temperature change (e.g., from 25° C. to 85° C. to 205° C.). E.g., the athermo-optical filler's refractive index at $T_Z$, $(n_{z/q})^F$, is not lower than its refractive index at 23° C., $(n_{23/q})^F$, by more than 0.005, alternatively 0.0020, alternatively 0.0010. Further, the starting point for refractive index-based tuning also includes using a thermo-optical matrix having a thermo-optic coefficient (i.e., $(dn/dT)^M$) that gives a decrease in its refractive index from $(n_{23/q})^M$ to $(n_{z/q})^M$ that is at least an order of magnitude greater (≥10× greater) than the decrease in the athermo-optical filler's refractive index from $(n_{23/q})^F$ to $(n_{z/q})^F$ due to its thermo-optic coefficient, $(dn/dT)^F$. E.g., the filler's $(dn/dT)^F$ may be from 0/K to ≤−1×10⁻⁵/K and the matrix's $(dn/dT)^M$ may be from −1×10⁻⁴/K to −1×10⁻³/K.

Refractive index-based aspects of the tuning method may include adjusting the thermo-optical matrix's thermo-optic coefficient ($(dn/dT)^M$). The $(dn/dT)^M$ is adjustable by an ordinary skilled artisan by modifying the composition, but big changes in composition do not result in commensurately big changes in $(dn/dT)^M$ so the adjusting is limited in scope to being within a relatively narrow range of from 1.1-fold to 3-fold (i.e., a 1.1× to 3× range), e.g., a 2× range such as from −2.5×10$^{-4}$/K to −5×10$^{-4}$/K for silicone thermo-optical matrixes. The (dn/dT)$^M$ adjusting may be accomplished by changing the chemical composition of the thermo-optical matrix, while preferably keeping the chemical composition of the athermo-optical filler the same. The chemical composition of the thermo-optical matrix may be changed for purposes of adjusting its (dn/dT)$^M$ by altering the chemical composition of matrix-forming precursors that are used to synthesize the thermo-optical matrix as described later.

When refractive index-based tuning embodiments of the smart optical material for use at a particular expected or intended device operating temperature $T_Z$, the extent to which the thermo-optical matrix's thermo-optic coefficient (dn/dT)$^M$ is to be mismatched to the athermo-optical filler's thermo-optic coefficient (dn/dT)$^F$, or vice versa, is based in part on the relative differences in their respective refractive indexes, $n_{23/q}^M$ and $n_{23/q}^F$, at 23° C. All other things being equal for a given set of choices of thermo-optical matrix materials having a same $n_{23/q}^M$ and for a particular athermo-optical filler, the filler's thermo-optic coefficient (dn/dT)$^F$ may be set equal to 0 K$^{-1}$ for performing calculations for this purpose. The higher the expected device operating temperature $T_Z$, the higher the expected operating temperature of the smart optical material, and so the thermo-optical matrix with the greater (dn/dT)$^M$ is chosen (in the sense that (dn/dT)$^M$=−5×10$^{-4}$ K$^{-1}$ (−0.0005 K$^{-1}$) indicates a greater change in refractive index $(n_{z/q})^M$ with change in temperature than is the change indicated by (dn/dT)$^M$=−1×10$^{-4}$ K$^{-1}$ (−0.0001 K$^{-1}$)). In some aspects, the thermo-optical matrix's (dn/dT)$^M$ and the athermo-optical filler's (dn/dT)$^F$ independently are negative numbers and the thermo-optical matrix's (dn/dT)$^M$ is mismatched to the athermo-optical filler's (dn/dT)$^F$, or vice versa, such that the ratio (dn/dT)$^M$/(dn/dT)$^F$ is from >2 to 20, alternatively >2.5, alternatively >3, alternatively >4, alternatively >5, alternatively >6, alternatively >7, alternatively >8, alternatively >9, alternatively >10; and independently <20, alternatively <18, alternatively <15, alternatively <12, alternatively <10. In some aspects the ratio (dn/dT)$^M$/(dn/dT)$^F$ is from 2 to 10. In other aspects, the thermo-optical matrix's (dn/dT)$^M$ is a negative number and the athermo-optical filler's (dn/dT)$^F$ is positive number and the foregoing values for the ratio (dn/dT)$^M$/(dn/dT)$^F$, are absolute values, |(dn/dT)$^M$/(dn/dT)$^F$|. The thermo-optical matrix composition, or the matrix-forming precursors used to make same, is chosen for its (dn/dT)$^M$ in such a way that upon heating the embodiment of the smart optical material to the device's operating temperature, the $n_{23/q}^M$ at 23° C. would have converged to give an $n_1$ at the operating temperature $T_Z$ that is within ±0.014, alternatively to within ±0.010, alternatively to within ±0.005, alternatively to within ±0.002, alternatively to within ±0.001, alternatively to within ±0.0005 of the $n_{z/q}^F$ at the expected device operating temperature $T_Z$ (or as a first approximation the $n_{23/q}^F$ at 23° C.).

Likewise, when refractive index-based tuning embodiments of the smart optical material for use at a particular expected device operating temperature $T_Z$, the extent to which the thermo-optical matrix's refractive index $n_{23/q}^M$ is to be mismatched to the athermo-optical filler's refractive index $n_{23/q}^F$, or vice versa, is based in part on the relative differences in their respective thermo-optic coefficients (dn/dT)$^M$ and (dn/dT)$^F$. All other things being equal for a given set of choices of thermo-optical matrix materials having a same thermo-optic coefficient (dn/dT)$^M$ and for a particular athermo-optical filler and setting the filler's thermo-optic coefficient (dn/dT)$^F$=0 for making calculations for this purpose, the higher the expected device operating temperature $T_Z$, the higher the expected operating temperature of the smart optical material, and the thermo-optical matrix with the higher $n_{23/q}^M$ at 23° C. is chosen. The $n_{23/q}^M$ at 23° C. is chosen in such a way that upon heating the embodiment of the smart optical material to its operating temperature, the $n_{23/q}^M$ at 23° C. would have converged to give an $n_{z/q}^M$ at the operating temperature $T_Z$ that is within ±0.014, alternatively to within ±0.010, alternatively to within ±0.005, alternatively to within ±0.002 of the $n_{z/q}^F$ at the same operating temperature $T_Z$ (or as a first approximation the $n_{23/q}^F$ at 23° C.). An operating temperature for characterizing the smart optical material may be $T_Z$=120° or 150° C., and thus $n_{z/q}^M$ at that temperature is $n_{120/q}^M$ or $n_{150/q}^M$, respectively, and $n_{z/q}^F$ at that temperature is $n_{120/q}^F$ or $n_{150/q}^F$, respectively.

In some aspects, the thermo-optical matrix's refractive index $n_{23/q}^M$ is mismatched to the athermo-optical filler's refractive index $n_{23/q}^F$, or vice versa, such that the refractive index of the thermo-optical matrix $(n_{23/q}^M)$ is from 0.02 to 0.2 higher than the refractive index of the athermo-optical filler $(n_{23/q}^F)$. That is, the difference $n_{23/q}^M$−$n_{23/q}$F is from 0.02 to 0.2. In some aspects, $n_{23/q}$M is from 0.025 to 0.15 higher, alternatively from 0.03 to 0.13 higher, alternatively from 0.03 to 0.10 higher than $n_{23/q}^F$. In some aspects, $n_{23/q}^M$ is higher than $n_{23/q}^F$ by at least 0.029, alternatively at least 0.035, alternatively at least 0.04, alternatively at least 0.05, alternatively at least 0.06, alternatively at least 0.07. In some aspects, the refractive index, $n_{23/q}^M$, of the thermo-optical matrix and the refractive index, $n_{23/q}^F$, of the athermo-optical filler are mismatched such that the ratio $n_{23/q}^M/n_{23/q}^F$ is from 1.009 to 1.094.

In some aspects, the refractive index, $n_{23/q}^M$, of the thermo-optical matrix and the refractive index, $n_{23/q}^F$, of the athermo-optical filler are mismatched such that the ratio $n_{23/q}^M/n_{23/q}^F$ is from 1.009 to 1.094 and the ratio (dn/dT)$^M$/(dn/dT)$^F$ (or |(dn/dT)$^M$/(dn/dT)$^F$|) is from 2 to 10. In some aspects, the refractive index, $n_{23/q}^M$, of the thermo-optical matrix and the refractive index, $n_{23/q}^F$, of the athermo-optical filler are mismatched such that the ratio $n_{23/q}^M/n_{23/q}^F$ is from 1.009 to 1.094 and the ratio (dn/dT)$^M$/(dn/dT)$^F$ (or |(dn/dT)$^M$/(dn/dT)$^F$|) is from 2 to 10 and when at the elevated operating temperature, $T_Z$, the refractive index, $n_{z/q}^M$, of the thermo-optical matrix and the refractive index, $n_{z/q}^F$, of the athermo-optical filler are matched such that the ratio $n_{z/q}^M/n_{z/q}^F$ is from 0.995 to 1.005, alternatively from 0.0999 to 1.0005. In some of the foregoing aspects have the proviso that the smart optical material does not contain any untreated silica, alternatively any untreated silica or partially-pretreated silica. In some aspects the athermo-optical filler consists of pretreated athermo-optical filler or in situ treated athermo-optical filler, alternatively pretreated athermo-optical filler, alternatively a combination of in situ treated athermo-optical filler and pretreated athermo-optical filler. In some such aspects the pretreated and/or in situ treated filler is in the form of a masterbatch.

In some embodiments the thermo-optical matrix has at 23° C. a refractive index, $n_{23/q}$, of from 1.480 to 1.56, alternatively from 1.480 to 1.540, alternatively from 1.485 to 1.540, alternatively from 1.485 to 1.499, alternatively from 1.516 to 1.540, all at a wavelength of 633 nm; and the athermo-optical filler has at 23° C. a refractive index, $n_{23/q}$, of from 1.450 to 1.460, alternatively from 1.451 to 1.459, alternatively from 1.4570 to 1.4590, alternatively from 1.4580 to 1.4589, all at a wavelength of 633 nm. In other such embodiments the thermo-optical matrix has at 20° C. a refractive index, $n_{20/d}$, of from 1.480 to 1.56, alternatively from 1.480 to 1.540, alternatively from 1.485 to 1.540, alternatively from 1.485 to 1.499, alternatively from 1.516 to 1.540, all at a wavelength of 589 nm; and the athermo-optical filler has at 20° C. a refractive index, neo/d, of from 1.450 to 1.460, alternatively from 1.451 to 1.459, alternatively from 1.4570 to 1.4590, alternatively from 1.4580 to 1.4589, all at a wavelength of 589 nm.

Although the refractive index-based method of tuning produces the mismatched thermo-optic coefficients (($dn/dT)^M$ and $(dn/dT)^F$) and mismatched refractive indices ($n_{23/q}^M$ and $n_{23/q}^F$) for a given operating temperature, $T_Z$, as described above, different compositions of the smart optical material may be conveniently distinguished from one another by their overall refractive index, which is a blend of the refractive indices of their constituents, including the $n_{23/q}^M$ and $n_{23/q}^F$, weighted for relative amounts thereof. Likewise in some embodiments wherein two or more different thermo-optical matrix materials are used in the smart optical material, the $n_{23/q}^M$ used in the method of tuning is equal to the blended $n_{23/q}^M$ values of the different thermo-optical matrix materials. Likewise in some embodiments wherein two or more different athermo-optical fillers are used in the smart optical material, the $n_{23/q}^F$ used in the method of tuning is equal to the blended $n_{23/q}^F$ values of the different athermo-optical fillers. While in some aspects the smart optical material such as a smart optical material having a silicone thermo-optical matrix may have an overall refractive index, of 1.51, in some embodiments it, or a constituent thereof, does not have a refractive index, $n_{23/q}$, of 1.505 to 1.515. In some embodiments the thermo-optical matrix may have a refractive index, $n_{23/q}$, of 1.465 to 1.504 or 1.516 to 1.56, alternatively 1.465 to 1.504, alternatively 1.516 to 1.554, alternatively from 1.475 to 1.504, alternatively from 1.516 to 1.540. Alternatively or additionally, the refractive index, $n_{23/q}^M$, of the thermo-optical matrix and the refractive index, $n_{23/q}^F$, of the athermo-optical filler are mismatched such that the ratio $n_{23/q}^{M/F}$ is from 1.009 to 1.027 or from 1.042 to 1.094, alternatively from 1.009 to 1.027, alternatively from 1.042 to 1.094.

Advantageously, as expected operating temperature $T_Z$ increases, the refractive index-based aspects of the tuning method become easier and, thus, the smart optical material becomes better able to be opaque at 25° C. according to the Opaqueness Test Method 1 or 2 and substantially more (>50%) transmitting or clear at $T_Z$. That is, embodiments of the smart optical material that are tuned for use at $T_Z$ 200° C. may be more "smart" than embodiments that are tuned for use at $T_Z$ 180° C., which in turn may be more smart than embodiments that are tuned for use at $T_Z$ 170° C., which in turn may be more smart than embodiments that are tuned for use at $T_Z$ 160° C., which in turn may be more smart than embodiments that are tuned for use at $T_Z$ 150° C., which in turn may be more smart than embodiments that are tuned for use at $T_Z$ 140° C., which in turn may be more smart than embodiments that are tuned for use at $T_Z$ 130° C., which in turn may be more smart than embodiments that are tuned for use at $T_Z$ 120° C., and so on. Therefore, in some embodiments, $T_Z$ is from 100° to 200° C., alternatively from 120° to 200° C., alternatively ≥125°, alternatively ≥130°, alternatively ≥140°, alternatively ≥150°, alternatively from 150° to 200° C.

In some aspects, the composition of the smart optical material is tuned using the refractive index-based method such that when the smart optical material is at a temperature of 25° C. the smart optical material is opaque according to the Opaqueness Test Method 1 or 2; and when the smart optical material is at elevated operating temperature, $T_Z$, of at least 120° C., the smart optical material is substantially more transmitting up to, and including, being 100% transmitting at $T_Z$. The useful operating temperature of the smart optical material may equal the operating temperature, $T_Z$, of a light-emitting diode (LED) device. Thus in some aspects, the operating temperature of the smart optical material is at least 125° C., alternatively at least 130° C., alternatively at least 140° C., alternatively at least 150° C. Typically, the operating temperature of the smart optical material is at most 250° C., alternatively at most 210° C., alternatively at most 200° C., alternatively at most 180° C. Typically, the operating temperature of the smart optical material is from 120° to 180° C., alternatively from 120° to 160° C., alternatively from 120° to 150° C.

To illustrate the refractive index-based aspects of the method of tuning the smart optical material by way of a non-limiting embodiment, the adjusting may be performed when the thermo-optical matrix of the smart optical material is a polymeric material containing alkyl and aryl groups such as ($C_1$-$C_6$)alkyl groups and ($C_6$-$C_{12}$)aryl groups, and optionally further containing other groups such as aliphatically unsaturated hydrocarbyl groups such as alkenyl or alkynyl groups, halo, and/or hydroxyl groups. ($C_1$-$C_6$)alkyl may be ($C_1$-$C_4$)alkyl, methyl, ethyl, a propyl, or a butyl; alternatively trifluoropropyl; alternatively methyl or ethyl, alternatively methyl. ($C_6$-$C_{12}$)aryl may be phenyl, naphthyl, or biphenyl; alternatively phenyl. The adjusting may be done by changing the molar ratio of aryl groups to alkyl groups (Ar/Alkyl ratio) in the polymeric material, thereby adjusting the refractive index of the matrix comprising the polymeric material based on the Ar/Alkyl ratio. The higher the Ar/Alkyl ratio, the higher the $n_{23/q}^M$ of the polymeric material. The changing of the Ar/Alkyl ratio may be done by adjusting the composition of matrix precursors used in the curable formulation. The composition may be adjusted by changing molar amounts of aryl-containing matrix precursors compared to molar amounts of alkyl-containing matrix precursors, and/or by choosing a matrix precursor with higher or lower aryl content relative to alkyl content. For example, when the alkyl and aryl groups are methyl and phenyl groups, the adjusting may be done by changing the molar ratio of phenyl to methyl groups (Ph/Me ratio) in the polymeric material, and thereby adjusting the refractive index of the matrix comprising the polymeric material based on the Ph/Me ratio. The higher the Ph/Me ratio, the higher the $n_{23/q}^M$ of the polymeric material.

For example, in one embodiment, the thermo-optical matrix may consist of a polymeric material that comprises methyl groups and phenyl groups in varying proportions to each other so as to give a thermo-optical matrix having at 23° C. a refractive index, $n_{23/q}$, of from 1.480 to 1.56, alternatively from 1.480 to 1.540, alternatively from 1.485 to 1.540, alternatively from 1.485 to 1.499, alternatively from 1.516 to 1.540, all at a wavelength of 633 nm. In another embodiment, the thermo-optical matrix may consist of a polymeric material that comprises a phenyl-based polymeric material that is free of alkyl groups. In yet another embodiment, the thermo-optical matrix may consist of a polymeric material that comprises a copolymer of methyl-based polymeric segment that is free of aryl groups and a methyl/phenyl-based polymeric segment. In still another embodiment the thermo-optical matrix may consist of a polymeric material that comprises a mixture of a methyl-based polymeric material that is free of aryl groups and a phenyl-based polymeric material that is free of alkyl groups. In these embodiments the optical properties of the thermo-optical matrix would depend on the relative amounts of methyl and phenyl groups in its overall composition. In some aspects, such a thermo-optical matrix also has a thermo-optic coefficient in a narrow 2× range of $(dn/dT)^M$ from $-2.5\times10^{-4}/K$ to $-5\times10^{-4}/K$. In some of the foregoing embodiments the thermo-optical matrix is a silicone thermo-optical matrix.

Using the above method, the refractive index, $(n_{23/q})^M$, of the silicone thermo-optical matrix may be tuned or variably formulated according to the aforementioned method of Ketola et al. (WO 2010/141697A2) to have a refractive index that varies based on its chemical composition. Generally the silicone thermo-optical matrix may comprise alkyl and aryl-substituted polysiloxanes, which optionally may further contain other groups such as aliphatically unsaturated hydrocarbyl groups such as alkenyl or alkynyl groups. Alkyl may be $(C_1\text{-}C_6)$alkyl and aryl may be $(C_6\text{-}C_{12})$aryl. The $(C_1\text{-}C_6)$alkyl may be $(C_1\text{-}C_4)$alkyl, methyl, ethyl, a propyl, or a butyl; alternatively methyl or ethyl, alternatively methyl. The $(C_6\text{-}C_{12})$aryl may be phenyl, naphthyl, or biphenyl; alternatively phenyl. Optionally, the polysiloxanes may further comprise alkenyl, alkynyl, halo, and/or hydroxyl groups.

For example, in one embodiment, the silicone thermo-optical matrix may comprise methyl groups and phenyl groups in varying proportions to each other to form a polymethylphenylsiloxane (PMPS) having at 23° C. a refractive index, $(n_{23/q})^M$ of from 1.480 to 1.56, alternatively from 1.480 to 1.540, alternatively from 1.485 to 1.540, alternatively from 1.485 to 1.499, alternatively from 1.516 to 1.540, all at a wavelength of 633 nm. In another embodiment, the silicone thermo-optical matrix may comprise a polydiphenylsiloxane (PDPS). In yet another embodiment, the silicone thermo-optical matrix may comprise a copolymer of polydimethylsiloxane (PDMS) and PMPS, or a mixture of PDMS polymers and PMPS polymers and/or PDPS polymers with optical properties depending on the relative amounts of methyl and phenyl groups in the overall composition of the silicone thermo-optical matrix. The silicone thermo-optical matrix also has a thermo-optic coefficient in a narrow 2× range of $(dn/dT)^M$ from $-2.5\times10^{-4}/K$ to $-5\times10^{-4}/K$.

Table I below illustrates the foregoing refractive index-based tuning method using embodiments of the silicone thermo-optical matrix comprising phenyl-containing T-type units of formula $[PhSiO_{3/2}]$, abbreviated T(Ph), and standard D units of formula $[(CH_3)_2SiO_{2/2}]$, abbreviated D(Me$_2$). The embodiments differ from each other by varying phenyl/methyl ("Ph/Me") molar ratios. The Ph/Me molar ratio of a given embodiment of the silicone thermo-optical matrix is the number of moles of Ph groups in the T(Ph) units to the number of moles of Me groups in the D(Me$_2$) units thereof. Typically these embodiments are free of standard T units of formula $[CH_3SiO_{3/2}]$ and are free of phenyl-substituted D units of formula $[(CH_3)(Ph)SiO_{2/2}]$ or formula $[(Ph)_2SiO_{2/2}]$. These embodiments may also comprise, alternatively may be free of, standard M units of formula $[(CH_3)_3SiO_{1/2}]$ and/or phenyl-substituted M units of formula $[(CH_3)_{3-y}(Ph)_y SiO_{1/2}]$, wherein each y independently is 1, 2, or 3. In these embodiments, the compositions all have a $(dn/dT)^M$ of $-3.4\times10^{-4}/K$ and use an in situ treated fumed silica (e.g., a masterbatch thereof) as the athermo-optical filler with a $(dn/dT)^F=-1.2\times10^{-5}/K$ and a $n_{23/q}^F$ of 1.4584. As Table I shows, embodiments of the silicone smart optical material may be prepared for maximum light transmittance at higher and higher $T_Z$ by tuning the silicone thermo-optical matrix compositions by increasing their Ph/Me molar ratios, thereby increasing the silicone thermo-optical matrix composition's $n_{23/q}^M$ to higher and higher values as the intended $T_Z$ is increased. The in situ treated fumed silica's $(dn/dT)^F=-1.2\times10^{-5}/K$ is insignificant relative to the silicone thermo-optical matrix's $(dn/dT)^M$ of $-3.4\times10^{-4}/K$ in tuning the silicone smart optical material. The embodiments are listed below in Table I.

TABLE I

Refractive index-based tuning illustration:

| Smart Optical Material Embodiment | Intended $T_Z$ (° C.) | Matrix's Ph/Me Molar Ratio* | Matrix's Tuned $n_{23/q}^M$ | Maximum light Transmittance Temperature (° C.) |
|---|---|---|---|---|
| a | 90-100 | 0.35 | 1.480 | 91 |
| b | 100-110 | 0.38 | 1.483 | 101 |
| c | 120-130 | 0.44 | 1.490 | 122 |
| d | 130-140 | 0.48 | 1.495 | 137 |
| e | 140-150 | 0.51 | 1.497 | 143 |
| f | 150-160 | 0.54 | 1.500 | 152 |
| g | 160-180 | 0.63 | 1.507 | 173 |
| h | 180-200 | 0.67 | 1.510 | 183 |
| i | 200-210 | 0.76 | 1.516 | 201 |
| j | 210-220 | 0.84 | 1.520 | 213 |
| k | 220-250 | 1.06 | 1.530 | 244 |
| l | 250-300 | 1.37 | 1.540 | 274 |
| m | 300-310 | 1.84 | 1.550 | 305 |

*Ph/Me molar ratio is the moles of Ph groups in T(Ph) to the moles of Me groups in D(Me$_2$).

In some aspects, the smart optical material is any one of embodiments a to m, alternatively any one of embodiments b to m, alternatively any one of embodiments c to m, alternatively embodiment a or b, alternatively any one of embodiments c to e, alternatively any one of embodiments f to h, alternatively embodiment i or j, alternatively any one of embodiments k to m, alternatively embodiment m; alternatively embodiments a to m wherein any one embodiment is deleted.

At 25° C., the particular appearance or opaqueness of the smart optical material (e.g., according to the Opaqueness Test Method 1 or 2) depends on its extent of light scattering. In turn, the extent of light scattering primarily depends on the aforementioned mismatched thermo-optic coefficients ($(dn/dT)^M$ and $(dn/dT)^F$) and mismatched refractive indices ($n_{23/q}^M$ and $n_{23/q}^F$) as described above for the method of tuning. Yet in some aspects the extent of light scattering further depends, in small part, on one or more secondary factors. Fine tuning the smart optical material for one or more secondary factors that may nudge one way or the other the extent of light scattering, and thus extent of transmittance, of the smart optical material at 25° C. include: particle sizes of the athermo-optical filler relative to the wavelength(s) of light used to visualize the opaqueness of the smart optical material; the extent of any aggregation or agglomeration of the particles of the athermo-optical filler; the particular wavelength(s) of light used to visualize the opaqueness of the smart optical material; the chemical compositions of the constituents, particularly of the thermo-optical matrix; the relative proportions of the constituents (e.g., the loading of the athermo-optical filler in the thermo-optical matrix); and the thickness of the smart optical material (i.e., the length of the light pathway through the smart optical material).

In some additional embodiments, fine tuning of the composition of the smart optical material may be performed using the refractive index-based aspects of the tuning method by adjusting the composition and/or particle size of the athermo-optical based on the composition of a given thermo-optical matrix. The adjusting may be performed on the athermo-optical filler by choosing a different treating agent. The filler treatment may adjust the surface composition of the athermo-optical filler and modify the athermo-optical filler for dispersion in the matrix-forming precursors and/or in the thermo-optical matrix formed by curing the curable formulation containing same. The foregoing secondary factors are contingent on not reducing the light transmittance of the smart optical material at operating temperature, $T_Z$; for example particle sizes of the athermo-optical filler are as defined elsewhere herein, but may be adjusted within the definition in relation to the wavelength of light being transmitted in or through the smart optical material so long as the light transmittance is not decreased.

If, as in comparative non-invention aspects, the athermo-optical filler is not treated well enough, it may be difficult to disperse the athermo-optical filler widely in the thermo-optical matrix, and instead the untreated or partially athermo-optical filler would not disperse uniformly and would instead exist as agglomerates therein or would absorb matrix-forming precursors, which absorption can negatively affect processability or curing of the curable formulation. Such aggregates or agglomerates may cause the resulting non-inventive optical material containing same to block too much visible light and the resulting optical material would not be expected to be "smart" because it would not have sufficient percent transmittance (T %) at $T_Z$. Further, the elongation at break of the resulting non-inventive optical material would be expected to be below 15% before thermal aging and/or would decrease by more than 50%, alternatively by more than 55% after thermal aging at 200° C. in air for seven days. For a given filler and filler treating agent, a skilled artisan would be able to optimize performance of the athermo-optical filler in the smart optical material.

Alternatively or additionally, the method of fine tuning the smart optical material may include adjusting the average particle size of the athermo-optical filler and/or surface area of the athermo-optical filler and/or loading of the athermo-optical filler in the smart optical material. For example, when the smart optical material is spaced apart from (by an air gap) a phosphor layer in an LED optical device and in thermal communication with the LED thereof, the loading of the athermo-optical filler may be from 5 wt % to 40 wt % of the smart optical material. Alternatively, when the smart optical material is in direct contact with the phosphor layer in the LED optical device, the loading of the athermo-optical filler may be from >10 wt % to 35 wt %, alternatively from >10% to 30% of the smart optical material. The average particle size of the athermo-optical filler may be as described below. Adjusting for average particle size, surface area, and filler loading in filled optical materials is a technique that is generally well known in art and readily adoptable herein.

In the additional embodiments of fine tuning of the composition of the smart optical material, the average particle size of the athermo-optical filler, i.e., after filler treatment, may be adjusted to be from >8 nm to 500 nm, alternatively from >8.5 nm to 200 nm, alternatively from >8.5 nm to 250 nm, alternatively from 8.5 nm to <100 nm, alternatively from >8 nm to 49 nm, alternatively from 8.5 nm to 49 nm, alternatively from 9 nm to 44 nm, alternatively from 10 nm to 40 nm (e.g., 10 nm, 15 nm, 20 nm, or 30 nm). If the average particle size of the athermo-optical filler is from 300 to 400 nm, the smart optical material may be useful for transmitting near ultraviolet light, which has a wavelength of from 300 to 400 nm. If the average particle size of the athermo-optical filler is from 200 to 300 nm, the smart optical material may be useful for transmitting middle ultraviolet light, which has a wavelength of from 200 to 300 nm. If the average particle size of the athermo-optical filler is from 100 to 200 nm, the smart optical material may be useful for transmitting far ultraviolet light, which has a wavelength of from 100 to 200 nm. If the average particle size of the athermo-optical filler is from 10 to 100 nm, alternatively from 9 to 49 nm, the smart optical material may be useful for transmitting extreme ultraviolet light, which has a wavelength of from 10 to 100 nm. Particle sizes around 10 nm typically are primary particle sizes, whereas particle sizes of about 200 nm or greater may be aggregate particle size. The average particle size is determined according to the Particle Size Test Method described later. Techniques for adjusting average particle size are generally known and include fuming, milling, precipitating, and sieving. Such techniques are readily adoptable herein.

If the average particle size of the athermo-optical filler (after filler treatment) is 500 nm or greater, the resulting smart optical material would be expected to disadvantageously have lower elongation-at-break before thermal aging and/or after thermal aging at 200° C. for 7 days than if the average particle size of the athermo-optical filler is 500 nm or less.

If the average aggregate particle size of the athermo-optical filler (after filler treatment) is 7.4 nm or less, the resulting optical material (containing the athermo-optical filler) would not be expected to be "smart" because it would not cover a wavelength converting material such as a Nd:YAG phosphor at 25° C. according to Opaqueness Test Method 1 or 2. If the average particle size of the athermo-optical filler (after filler treatment) is greater than 500 nm, the resulting optical material (containing the athermo-optical filler) would be expected to block too much visible light and the resulting optical material would not be expected to be "smart" because it would not have sufficient percent transmittance at $T_Z$ to reveal the wavelength converting material such as a Nd:YAG phosphor.

By design different aspects of the smart optical material may be tuned as described above to be opaque to at least yellow or orange light at ambient temperature according to the Opaqueness Test Method 1 or 2, and yet at elevated operating temperature, $T_Z$, of at least 80° C. the material is optically transparent to the one or more different colors, alternatively optically transparent to all colors, i.e., across the yellow or orange. Thus, the smart optical material can cover or hide reflected or emitted yellow or orange light, and optionally other colors of visible light, when the material is at ambient temperature, according to the Opaqueness Test Method 1 or 2. Although the smart optical material is characterized by yellow or orange light, the smart optical material may be used in unpowered off-state optical devices to block transmittance of any colored light, including violet, blue, green, yellow, orange, or red light or non-visible light and may be used in powered on-state optical devices to transmit any colored light, including violet, blue, green, yellow, orange, or red light or non-visible light. The light blocked by the smart optical material when the device is in its unpowered off-state may be the same as or different than the light transmitted by the smart optical material when the device is in its powered on-state.

For example, in some aspects the smart optical material is opaque to yellow or orange light (according to the Opaqueness Test Method 1 or 2), orange light, and red light; and contains a phosphor that absorbs visible light, and responsively emits at least one of violet light, blue light, green light, yellow light, orange light, and red light, respectively, such that the phosphor would not be visible in the embodiment of the smart optical material at ambient temperature and light conditions. In some aspects, the at least one light is violet light, alternatively blue light, alternatively green light, alternatively yellow light, alternatively orange light, alternatively red light. In such aspects, the at least one phosphor absorbs visible light and responsively emits at least one of violet light, alternatively blue light, alternatively green light, alternatively yellow light (e.g., a YAG phosphor, or a Nd:YAG phosphor), alternatively orange light, alternatively red light, respectively. The at least one phosphor would not be visible in the smart optical material at ambient temperature.

For the reasons described above, the smart optical material is "smart" because it responds optically to temperature change in a designed way for at least one color light in the visible light spectrum. For example, at ambient temperature 30° C., e.g., from −10° to 30° C.) the smart optical material may be opaque to the yellow or orange light according to the Opaqueness Test Method 1 or 2, and therefore hides (prevents a human observer from seeing) objects that reflect or emit such a color, such as wavelength converters (e.g., phosphors or a phosphor layer) encapsulated therein or disposed in contact therewith when the smart optical material is at ambient temperature. Using light at wavelength 600 nm and a test sample that is a 1.65 mm thick slab of the smart optical material at 25° C., the smart optical material may have a percent transmittance (T %) through the thickness of less than or equal to 55%, alternatively <50%, alternatively <45%, alternatively <40%, alternatively <35%, alternatively <30%. When the smart optical material is heated at an elevated temperature, $T_Z$, it is transformed from the opaque state to substantially more transmitting up to and including an optically clear state and allows transmittance of the at least yellow or orange light in the visible light spectrum. Further, at the elevated temperature, $T_Z$, the smart optical material has significantly enhanced clarity (e.g., reduced haze or increased light transmission) at elevated temperature, $T_Z$, compared to non-invention comparative material made of matrix and optical filler with matched refractive indexes, $n_{23/q}$, as in the aforementioned lighting art. Therefore, when it is used in an optical device in its unpowered off-state, the smart optical material covers or hides objects such as phosphors encapsulated therein and when the same optical device is in its powered on-state, the smart optical material enables enhanced light output therefrom or light transmittance efficiency thereof.

Advantageously, we discovered that the smart optical material performs better at higher operating temperatures, $T_Z$, of the optical device in its on-state compared to the ambient temperature of the optical device in its off-state or compared to temperatures below $T_Z$. That is, the higher in its aforementioned range $T_Z$ goes, the better the light output or light transmittance efficiency of the optical device having the smart optical material. In some embodiments, the smart optical materials, including smart optical materials having silicone thermo-optical matrices, are smart because the starting T % at 25° C. is less than 50%, making it possible for the smart optical materials to hide a yellow or orange phosphor when the materials are at 30° C. or lower, according to the Opaqueness Test Method 1 or 2. Also, the smart optical materials, including smart optical materials having silicone thermo-optical matrices, are beneficial because in some embodiments the T % at 100° C. or higher (e.g., T % at 125° C. or 150° C.) are substantially better than, and in some instances are more than 50% greater than, the T % at 25° C., which means the clarity of the smart optical materials advantageously increases with increasing temperature. Thus, the smart optical material can both hide a yellow or orange phosphor in optical devices in their unpowered off-states and increase light output or light transmittance efficiency of optical devices in their powered on-states. When the smart optical material is at an elevated temperature of at least 100° C., alternatively at least 120° C., alternatively at least 150° C., alternatively at least 180° C., alternatively from any one of the foregoing temperatures to 200° C., it is substantially transparent to the at least one color light. Many phosphors lose considerable efficiency when they are above 150° C., and so in some embodiments wherein the smart optical material is being used in an optical device that also has a phosphor or phosphor layer that loses considerable efficiency above 150° C., the $T_Z$ is from 100° to 150° C.

In addition to its "smart" optical property, the smart optical material achieves good mechanical performance sufficient to prevent cracking of thereof if it, or the optical device in which it is disposed, receives an external mechanical force such as vibrations or impact. The smart optical material may resist cracking at 120° C. using the Cracking Resistance Test Method described later.

The smart optical material is characterized in that it has an elongation-at-break according to the Elongation-at-Break Test Method (described later) before thermal aging at Day 0 of at least 15% and after thermal aging in air at 200° C. for 7 days at Day 7 of at least 12%. Also, the elongation-at-break of the thermally aged smart optical material would remain unchanged from Day 0 or is at least 12% and has decreased from Day 0 to Day 7 by from >0% to less than 50%. For example, this advantage may be demonstrated by elongation-at-break testing with the smart optical material before thermal aging (Day 0) and after being heated in air at 200° C. for from 1 to 7 days, wherein the elongation-at-break before thermal aging is greater than 15%, e.g., from >15% to <40%, alternatively from 20% to 35%, alternatively from 20% to 34%; and the elongation-at-break after thermal aging in air at 200° C. is at least 12%, alternatively at least 15%, alternatively at least 20%, alternatively at least 24%, alternatively at least 26%. Further, the elongation-at-break of the thermally aged smart optical material would remain unchanged from Day 0 or would decrease from Day 0 to Day 7 by less than 50%, alternatively by less than 35%, alternatively by less than 33%, alternatively by less than 30%, alternatively by less than 27%, alternatively by from 15% to 49%, alternatively by from 20% to 49%, alternatively by from 15% to 35% alternatively by from 20% to 33%, alternatively by from 20% to 29%. This means the thermally aged smart optical material is unlikely to eventually crack, tear or both when or shortly after it receives the external mechanical force, and is more likely to achieve an advantageously long operating lifetime, relative to a comparative non-invention material having untreated athermooptical filler. Elongation-at-break is measured according to the Elongation-at-Break Test Method described later.

Therefore, the smart optical material enables aspects of the inventive composite optical device to have aesthetically pleasing appearance when not in operation, an improved light output and light transmittance efficiency when in operation, a satisfactory or improved operating lifetime, and flexibility for directing light output. Further, the smart optical material achieves good mechanical performance sufficient to prevent cracking of thereof if it, or the optical device in which it is disposed, receives an external mechanical force such as vibrations or impact. The smart optical material may resist cracking at 120° C. using the Cracking Resistance Test Method described later. This designed combination of features and advantages was not previously found in optical materials in the lighting art.

The thermo-optical matrix of the smart optical material may be composed of any macromolecular material such as an organic polymer, a silicone material, or a combination thereof that is suitable for transmitting light at elevated temperature, $T_Z$, and has a lower refractive index at that elevated temperature than its refractive index at 23° C.

In some embodiments the thermo-optical matrix has at 23° C. a refractive index, $n_{23/q}$, of from 1.480 to 1.56, alternatively from 1.480 to 1.540, alternatively from 1.485 to 1.540, alternatively from 1.485 to 1.499, alternatively from 1.516 to 1.540, all at a wavelength of 633 nm. In other embodiments the thermo-optical matrix has at 20° C. a refractive index, $n_{20/d}$, of from 1.480 to 1.56, alternatively from 1.480 to 1.540, alternatively from 1.485 to 1.540, alternatively from 1.485 to 1.499, alternatively from 1.516 to 1.540, all at a wavelength of 589 nm.

The composition of the thermo-optical matrix of the smart optical material may be any material that has a coefficient of thermal expansion (CTE) sufficient to provide a thermo-optic coefficient $(dn/dT)^M$ of greater than or equal to $-2.0 \times 10^{-4}$ K$^{-1}$, alternatively $\geq -2.5 \times 10^{-4}$ K$^{-1}$, alternatively $\geq -3.0 \times 10^{-4}$ K$^{-1}$. In some aspects, $(dn/dT)^M$ is from $-2.5 \times 10^{-4}$ K$^{-1}$ to $-6 \times 10^{-4}$ K$^{-1}$; alternatively from $-2.5 \times 10^{-4}$ K$^{-1}$ to $-5.5 \times 10^{-4}$ K$^{-1}$; alternatively from $-3.0 \times 10^{-4}$ K$^{-1}$ to $-5.5 \times 10^{-4}$ K$^{-1}$; alternatively from $-3.1 \times 10^{-4}$ K$^{-1}$ to $-5 \times 10^{-4}$ K$^{-1}$; alternatively from $-3.2 \times 10^{-4}$ K$^{-1}$ to $-4.9 \times 10^{-4}$ K$^{-1}$. Further, the thermo-optical matrix's $(dn/dT)^M$ is less than the athermo-optical filler's $(dn/dT)^F$; e.g., the $(dn/dT)^M$ is $-4 \times 10^{-4}$ K$^{-1}$ (0.0004 K$^{-1}$) and $(dn/dT)^F$ is $-1 \times 10^{-4}$ K$^{-1}$ (0.0001 K$^{-1}$).

Typically the thermo-optical matrix comprises, consists essentially of, or consists of a polymeric material that is (at least substantially) optically transparent at the operating temperature $T_Z$ of the device. The polymeric material of the thermo-optical matrix may have a CTE sufficient to provide any one of the foregoing values for $(dn/dT)^M$. The polymeric material may have a glass transition temperature ($T_g$) below the operating temperature $T_Z$ of the device. Any thermo-optical matrix material that is developed in the future and found to have any one of the foregoing values for $(dn/dT)^M$ is contemplated as well.

Typically, the thermo-optical matrix is composed of an organic polymer or a silicone material. The organic polymer may be a poly(vinyl acetate), a poly(ethylene-co-vinyl acetate), a poly(ethylene-co-vinyl alcohol), a poly(vinyl butyral), a polycarbonate ($n_{23/q}$ 1.5860), a polyester (e.g., poly(ethylene terephthalate) or poly(butylene terephthalate), or a polyacrylate (e.g., a poly(methyl methacrylate, $n_{23/q}$ 1.4893; or a poly(styrene-co-methyl methacrylate). More typically, the thermo-optical matrix is composed of a poly(vinyl acetate) or a silicone material, alternatively a silicone material. The organic polymer may be a poly(vinyl acetate), alternatively a poly(vinyl acetate) having $n_{23/q}^M$ 1.4665. The organic polymer may be useful at operating temperature, $T_Z$, of from 80° to 150° C., alternatively 100° to 150° C., alternatively 120° to 150° C. The silicone material may be a silicone polymer, silicone resin, or a combination of silicone polymer and silicone resin. The silicone material may be tuned or variably formulated according to the aforementioned method of Ketola et al. (WO 2010/141697A2). The silicone material may be useful at $T_Z$, of from 80° to 225° C., alternatively 100° to 200° C., alternatively 120° to 180° C.

In some aspects the thermo-optical matrix is an organic polymer, an (organo)inorganic polymer, or an organic-(organo)inorganic copolymer. Examples of suitable organic-(organo) inorganic copolymers are poly(vinyl acetate)-organopolysiloxane block copolymers. "(Organo)inorganic polymer" means a macromolecule having an inorganic backbone substituted with pendant and/or terminal organic groups. "Organic-(organo)inorganic copolymer" means a macromolecule having a plurality of repeat units having an inorganic backbone substituted with pendant and/or terminal organic groups and having a plurality of repeat units having an organic backbone substituted with hydrogen atoms or organic groups, wherein the repeat units may be in any order, although typically in segments of like repeat units.

In some aspects the thermo-optical matrix is the (organo) inorganic polymer. Examples of suitable (organo)inorganic polymers are a polyorganosilane, a polyorganosilzane, a polyorganosiloxane, or a copolymer of any two or more thereof.

In some aspects the thermo-optical matrix of the smart optical material is an organopolysiloxane. Such a thermo-optical matrix is referred to herein as a silicone thermo-optical matrix. The silicone thermo-optical matrix may be a Si-aryl and Si-alkyl functional poly(organosiloxane) such as a Si-phenyl and Si-methyl functional poly(organosiloxane. The Si-phenyl and Si-methyl functional poly(organosiloxane may have a molar ratio of Si-phenyl groups to Si-methyl groups of from 0.20 to 0.90, alternatively from 0.20 to 0.70; alternatively from 0.20 to 0.50.

The silicone thermo-optical matrix may be prepared by curing a curable formulation via any suitable curing method to give a cured silicone product. The curable formulation comprises a mixture of two or more matrix-forming precursors that are useful for forming a cured silicone product by a suitable curing method. Examples of suitable curing methods are condensation curing, free radical curing, and hydrosilylation curing. In some embodiments the silicone thermo-optical matrix is prepared by condensation curing a condensation curable organosiloxane formulation, alternatively by free radical curing a free radical curable organosiloxane formulation. In other embodiments the curable formulation may be a dual cure system curable by hydrosilylation curing and condensation or free radical curing, all as would generally be well known in the art and readily adoptable herein.

In some embodiments the silicone thermo-optical matrix is prepared by hydrosilylation curing a hydrosilylation curable organosiloxane formulation. Examples of the two or more matrix-forming precursors suitable for hydrosilylation curing are constituents (A) and (B) of the hydrosilylation curable formulation described in detail later. In some embodiments the curing by hydrosilylation reaction is initiated by heating the curable formulation. In some embodiments, the hydrosilylation catalyst is a photoactivatable hydrosilylation catalyst and the curing is initiated by exposing the photoactivatable hydrosilylation catalyst to radiation such as ultraviolet and/or visible light, thereby activating the catalyst, and heating the curable formulation, thereby starting the hydrosilylation curing. Upon curing, a cured product is prepared that is the silicone thermo-optical matrix. Typically, the radiation is either broadband ultraviolet light or I-line (365 nm) UV light.

In some aspects is a hydrosilylation curable formulation useful for making the smart optical material, the hydrosilylation curable formulation comprising: constituents (A) to (D). Constituent (A) is an organopolysiloxane containing an average, per molecule, of at least two alkenyl groups. Constituent (B) is an organosilicon compound containing an average, per molecule, of at least two silicon-bonded hydrogen atoms (SiH-functional organosilicon compound); Constituent (C) is a hydrosilylation catalyst. Constituent (D) is an athermo-optical filler The particular constituents (A) and (B) may be selected from those described below such that the thermo-optical matrix prepared therefrom enables tuning of the smart optical material by adjusting refractive indices at 23° C. ($n_{23/q}^M$ and $n_{23/q}^F$, respectively) and thermo-optic coefficients (($dn/dT)^M$ and $(dn/dT)^F$, respectively). This tuning comprises formulating the hydrosilylation curable formulation's constituents (e.g., (A) and (B)) to cure to give a thermo-optical matrix having, relative to the athermo-optical filler, mismatched thermo-optic coefficients (($dn/dT)^M$ and $(dn/dT)^F$, respectively) and mismatched refractive indices at 23° C. ($n_{23/q}^M$ and $n_{23/q}^F$, respectively) and matched refractive indices at $T_Z$ ($n_{z/q}^M$ and $n_{z/q}^F$, respectively). The tuning method is described earlier.

Constituent (A), the organopolysiloxane containing an average, per molecule, of at least two alkenyl groups, is also referred to as Constituent (A) or the organopolysiloxane. The organopolysiloxane's structure may be linear, branched, resinous, or a combination of at least two thereof. For example, such a combination structure may be a so-called resin-linear organopolysiloxane. The organopolysiloxane can be a homopolymer or a copolymer. The alkenyl groups typically have from 2 to 10 carbon atoms and are exemplified by, but not limited to, vinyl, allyl, butenyl, and hexenyl. The butenyl may be 1-buten-1-yl, 1-buten-2-yl, 2-buten-1-yl, 1-buten-4-yl, or 2-methylpropen-3-yl. The hexenyl may be 1-hexen-1-yl, 1-hexen-2-yl, 2-hexen-1-yl, 1-hexen-6-yl, or 2-methylpenten-5-yl. The alkenyl groups may be located at terminal, pendant, or both terminal and pendant positions in the organopolysiloxane. The organopolysiloxane typically lacks SiH functionality such that silicon valencies other than those bonded to the alkenyl groups or to oxygen (of the siloxane portion of the organopolysiloxane) are bonded to saturated and/or aromatic organic groups, i.e., organic groups, represented by $R^1$, other than unsaturated aliphatic groups. The saturated and/or aromatic organic groups $R^1$ in the organopolysiloxane are independently selected from monovalent hydrocarbon and monovalent halogenated hydrocarbon groups free of aliphatic unsaturation. Each $R^1$ typically independently has from 1 to 20, alternatively from 1 to 10, alternatively from 1 to 6 carbon atoms. Examples of $R^1$ groups are alkyl, cycloalkyl, aryl, arylalkyl, alkylaryl, and halogenated substituted derivatives thereof. Each halogen of the halogenated substituted derivative independently is fluoro, chloro, bromo, or iodo; alternatively fluoro, chloro, or bromo; alternatively fluoro or chloro; alternatively fluoro; alternatively chloro. Examples of alkyl are methyl, ethyl, propyl, pentyl, octyl, undecyl, and octadecyl. Examples of cycloalkyl are cyclopentyl and cyclohexyl. Examples of aryl are phenyl and naphthyl. Examples of alkylaryl are tolyl and xylyl. Examples of arylalkyl are benzyl and 2-phenylethyl. Examples of the halogenated substituted derivatives thereof are 3,3,3-trifluoropropyl, 3-chloropropyl, and dichlorophenyl.

The organopolysiloxane may be a single organopolysiloxane or a mixture of two or more organopolysiloxanes that differ in at least one of the following properties: structure, viscosity (kinematic, 25° C.), average molecular weight (number average or weight average), siloxane unit composition, and siloxane unit sequence.

Constituent (A) the organopolysiloxane may have a kinematic viscosity at 25° C. that varies with molecular weight and structure of the organopolysiloxane. The kinematic viscosity may be from 0.001 to 100,000 pascal-seconds (Pa·s), alternatively from 0.01 to 10,000 Pa·s, alternatively from 0.01 to 1,000 Pa·s, alternatively from 1 to 500 Pa·s.

Examples of Constituent (A) that are suitable linear organopolysiloxanes are polydiorganosiloxanes having any one of the following formulas (1) to (6): $M^{Vi}D_aM^{Vi}$ (1); $M^{Vi}D_{0.25a}D^{Ph}_{0.75a}M^{Vi}$ (2); $M^{Vi}D_{0.95a}D^{Ph,Ph}_{0.05a}M^{Vi}$ (3); $M^{Vi}D_{0.98a}D^{Vi}_{0.02a}M^{Vi}$ (4); $MD_{0.95a}D^{Vi}_{0.05a}M$ (5); and $M^{Ph,Vi}D_aM^{Ph,Vi}$ (6); wherein subscript "a" has a value such that the kinematic viscosity of the polydiorganosiloxane is from 0.001 to 100,000 Pa·s.; each M unit is of formula $[((CH_3)_3SiO_{1/2}]$; each $M^{Vi}$ unit is a vinyl-monosubstituted M unit and is of formula $[((CH_3)_2(CH=CH_2)SiO_{1/2}]$; each $M^{Ph,Vi}$ unit is a phenyl-monosubstituted and vinyl-monosubstituted M unit and is of formula $[((CH_3)(Ph)(CH=CH_2)SiO_{1/2}]$; each D unit is of formula $[((CH_3)_2SiO_{2/2}]$; each $D^{Vi}$ unit is a vinyl-monosubstituted D unit and is of formula $[((CH_3)(CH=CH_2)SiO_{2/2}]$; each $D^{Ph}$ unit is a phenyl-monosubstituted D unit and is of formula $[((CH_3)(Ph)SiO_{2/2}]$; each $D^{Ph,Ph}$ unit (i.e., $D^{Ph_2}$) is a phenyl-disubstituted D unit and is of formula $[((Ph)_2SiO_{2/2}]$.

Examples of Constituent (A) that are branched organopolysiloxanes are polydiorganosiloxanes having any one of the following formulas (1) to (6): $M^{Vi}DD'D_aM^{Vi}$ (1); $M^{Vi}D'D_{0.25a}DD'D^{Ph}_{0.75a}M^{Vi}$ (2); $M^{Vi}DD'D_{0.95a}DD'D^{Ph,Ph}_{0.05a}M^{Vi}$ (3); $M^{Vi}DD'D_{0.98a}DD'D^{Vi}_{0.02a}M^{Vi}$ (4); $MDD'D_{0.95a}DD'D^{Vi}_{0.05a}M$ (5); and $M^{Ph,Vi}DD'D_aM^{Ph,Vi}$ (6); wherein subscript a has a value such that the kinematic viscosity of the polydiorganosiloxane is from 0.001 to 100,000 Pa·s.; each M unit is of formula $[((CH_3)_3SiO_{1/2}]$; each $M^{Vi}$ unit is a vinyl-monosubstituted M unit and is of formula $[((CH_3)_2(CH=CH_2)SiO_{1/2}]$; each $M^{Ph,Vi}$ unit is a phenyl-monosubstituted and vinyl-monosubstituted M unit and is of formula $[((CH_3)(Ph)(CH=CH_2)SiO_{1/2}]$; each D unit is of formula $[((CH_3)_2SiO_{2/2}]$; each D' unit is of formula $[(CH_3)RSiO_{2/2}]$, where each R independently is —$CH_3$, —$(CH_2)_nCH_3$, —$(CH_2)_nCH=CH_2$, —O—Si(Me$_2$)$_n$—OSi(Me,H)$_m$—O—SiMePhCH=CH$_2$, —O—Si(MeH)$_n$—O—SiMePhCH=CH$_2$, or —O—Si(Me$_2$)$_n$—O—SiMePhCH=CH$_2$, and subscripts n and m independently are integers from 1 to 9; each $D^{Vi}$ unit is a vinyl-monosubstituted D unit and is of formula $[((CH_3)(CH=CH_2)SiO_{2/2}]$; each $D^{Ph}$ unit is a phenyl-monosubstituted D unit and is of formula $[((CH_3)(Ph)SiO_{2/2}]$; and each $D^{Ph,Ph}$ unit is a phenyl-disubstituted D unit and is of formula $[((Ph)_2SiO_{2/2}]$.

Examples of Constituent (A) that are suitable organopolysiloxanes resins are alkenyl-substituted MQ resins, alkenyl-substituted TD resins, alkenyl-substituted MT resins, alkenyl-substituted MTD resins, and combinations of any two or more thereof. The organopolysiloxane may be the organopolysiloxane resin, wherein the organopolysiloxanes resin is the alkenyl-substituted MQ resin, alkenyl-substituted TD resin, alkenyl-substituted MT resin, or alkenyl-substituted MTD resin; alternatively the alkenyl-substituted TD resin, alkenyl-substituted MT resin, or alkenyl-substituted MTD resin; alternatively the alkenyl-substituted MQ resin, alkenyl-substituted MT resin, or alkenyl-substituted MTD resin; alternatively the alkenyl-substituted MQ resin; alternatively the alkenyl-substituted TD resin; alternatively the alkenyl-substituted MT resin; alternatively the alkenyl-substituted MTD resin. The alkenyl-substituted MQ resin contains $M^{alkenyl}$-type units of formula $[(alkenyl)(R^1)_2SiO_{1/2}]_v$, wherein subscript v is a mole fraction of the $M^{alkenyl}$-type units in the resin. The Q-type units are of formula $[SiO_{4/2}]_q$, wherein subscript q is a mole fraction of the Q-type units in the resin. The alkenyl-substituted MT resins may contain one or more of the $M^{alkenyl}$-type units and/or $T^{alkenyl}$-type units, which are of formula [alkenyl-SiO$_{3/2}$]$_t$, wherein subscript t is a mole fraction of the T-type units in the MT resin.

The organopolysiloxane may comprise the alkenyl-substituted MTD resin. The alkenyl-substituted MTD resin consists essentially of M-type units, T-type units, D-type units, and at least one of $M^{alkenyl}$-type units, $D^{alkenyl}$-type units, and $T^{alkenyl}$ units. That is, the phrase "consists essentially of" in this context means the alkenyl-substituted MTD resin is substantially free of (i.e., from 0 to <0.10 mole fraction) or completely free of (i.e., 0.00 mole fraction) Q units. The M-type units are of formula $[((R^1)_3SiO_{1/2}]_{m1}$, wherein subscript m1 is a mole fraction of the M-type units in the resin. The $M^{alkenyl}$-type units are of formula [(alkenyl)$(R^1)_2SiO_{1/2}]_v$, wherein subscript v is a mole fraction of the $M^{alkenyl}$-type units in the resin. The D-type units are of formula $[(R^1)_2SiO_{2/2}]_d$, wherein subscript d is a mole fraction of the D-type units in the resin. The $D^{alkenyl}$-type units are of formula $[(R^1)(alkenyl)SiO_{2/2}]_d$, wherein subscript d is a mole fraction of the $D^{alkenyl}$-type units in the resin. The T-type units are of formula $[R^1SiO_{3/2}]_t$, wherein subscript t is a mole fraction of the T-type units in the resin. The $T^{alkenyl}$-type units are of formula [alkenyl$SiO_{3/2}]_t$, wherein subscript t is a mole fraction of the T-type units in the resin.

The organopolysiloxane may comprise the alkenyl-substituted MT resin. The alkenyl-substituted MT resin consists essentially of M-type units, T-type units, and at least one of $M^{alkenyl}$-type units and $T^{alkenyl}$ units. That is, the phrase "consists essentially of" in this context means the alkenyl-substituted MT resin is substantially free of (i.e., from 0 to <0.10 mole fraction) or completely free of (i.e., 0.00 mole fraction) D units and Q units. The M-type units, $M^{alkenyl}$-type units, T-type units, and $T^{alkenyl}$-type units independently are as described above.

The organopolysiloxane may comprise the alkenyl-substituted TD resin. The alkenyl-substituted TD resin consists essentially of T-type units, D-type units, and at least one of $D^{alkenyl}$-type units and $T^{alkenyl}$ units. That is, the phrase "consists essentially of" in this context means the alkenyl-substituted TD resin is substantially free of (i.e., from 0 to <0.10 mole fraction) or completely free of (i.e., 0.00 mole fraction) M and Q units. The D-type units, $D^{alkenyl}$-type units, T-type units, and $T^{alkenyl}$-type units are as defined above.

The organopolysiloxane may comprise the alkenyl-substituted MQ resin. The alkenyl-substituted MQ resin consists essentially of M-type units, $M^{alkenyl}$-type units, and Q units. That is, the phrase "consists essentially of" in this context means the alkenyl-substituted MQ resin is substantially free of (i.e., from 0 to <0.10 mole fraction) or completely free of (i.e., 0.00 mole fraction) T-type units and Q units. The M-type units and $M^{alkenyl}$-type units are as defined above. The Q units are of formula $[SiO_{4/2}]_q$, wherein subscript q is a mole fraction of the Q units in the resin. The mole ratio of the M-type units to the Q units may be from 0.6 to 1.9.

The organopolysiloxane resin may contain an average of from 3 to 30 mol % of alkenyl groups. The mol % of alkenyl groups in the resin is the ratio of the number of moles of alkenyl-containing siloxane units in the resin to the total number of moles of siloxane units in the resin, multiplied by 100.

The organopolysiloxane resin may be prepared by methods well known in the art and readily adoptable herein. For example, the alkenyl-substituted MQ resin may be prepared by preparing a resin copolymer by the silica hydrosol capping process of U.S. Pat. No. 2,676,182 to Daudt et al., and then treating the resin copolymer with at least an alkenyl-containing endblocking reagent to give the organopolysiloxane resin. Examples of the alkenyl-containing endblocking reagent are silazanes, siloxanes, and silanes such as those exemplified in U.S. Pat. No. 4,584,355 to Blizzard et al.; U.S. Pat. No. 4,591,622 to Blizzard et al.; and U.S. Pat. No. 4,585,836 to Homan et al. A single endblocking reagent or a mixture of two or more such reagents may be used to prepare the alkenyl-substituted MQ resin.

The process of Daudt et al. involves reacting a silica hydrosol under acidic conditions with a hydrolyzable triorganosilane such as trimethylchlorosilane (an example of a silicon monomer), an organosiloxane such as hexamethyldisiloxane (an example of a silicon oligomer), or a mixture thereof; and then recovering a resin copolymer having M and Q units. The resin copolymer generally contains from 2 to 5 weight percent of silicon-bonded hydroxyl (SiOH) groups. Reacting the resin copolymer with the alkenyl-containing endblocking reagent (e.g., $(H_2C=C(H))(CH_3)_2$SiCl), or with a mixture of the alkenyl-containing endblocking reagent and an endblocking agent free of aliphatic substitution (e.g., a mixture of $(H_2C=C(H))(CH_3)_2$SiCl and $(CH_3)_3$SiCl) then gives the alkenyl-substituted MQ resin having from 0 to less than 2 wt % SiOH groups and typically from 3 to 30 mol % alkenyl groups (e.g., $H_2C=C(H)-$).

In some aspects the smart optical material may contain untreated silicone resin particles, such as untreated silicone resin particles containing T and/or Q units (e.g., MQ resins, MT resins, MDQ resins, MDT resins, MTQ resins). Examples of such resins are described above. In other aspects the smart optical material lacks or is free of untreated silicone resin particles.

Constituent (B) of the hydrosilylation curable formulation is the organosilicon compound containing an average, per molecule, of at least two silicon-bonded hydrogen atoms, which is also referred to herein as Constituent (B) or the SiH-functional organosilicon compound. The silicon-bonded hydrogen atoms may be located at terminal, pendant or both terminal and pendant positions in the SiH-functional organosilicon compound. The SiH-functional organosilicon compound may be a single compound or a mixture of two or more such compounds that differ in at least one of the following properties: structure, average molecular weight (number or weight average), viscosity (kinematic, 25° C.), silane unit composition, siloxane unit composition, and unit sequence. The organosilicon compound contains saturated and/or aromatic organic groups, i.e., organic groups, represented by $R^1$, other than unsaturated aliphatic groups. The saturated and/or aromatic organic groups $R^1$ in the organosilicon compound are independently selected from monovalent hydrocarbon and monovalent halogenated hydrocarbon groups free of aliphatic unsaturation. Each $R^1$ typically independently is as defined above.

The SiH-functional organosilicon compound may be an organohydrogensilane or an organohydrogensiloxane. The organohydrogensilane may be an organomonosilane, organodisilane, organotrisilane, or organopolysilane containing organic groups and SiH groups. The organohydrogensiloxane may be an organohydrogendisiloxane, organohydrogentrisiloxane, or organohydrogenpolysiloxane. For example, the SiH-functional organosilicon compound may be an organohydrogensiloxane, alternatively an organohydrogenpolysiloxane. The structure of the SiH-functional organosilicon compound may be linear, branched, cyclic, or resinous; alternatively linear; alternatively branched; alternatively cyclic; alternatively resinous. At least 50 mol % of the organic groups in the SiH-functional organosilicon compound may be methyl, and any remaining organic groups may be ethyl and/or phenyl.

Examples of suitable organohydrogensilanes for use as the SiH-functional organosilicon compound are organomonosilanes such as diphenylsilane and 2-chloroethylsilane; organodisilanes such as 1,4-bis(dimethylsilyl)benzene, bis[(4-dimethylsilyl)phenyl] ether, and 1,4-dimethyldisilylethane; organotrisilanes such as 1,3,5-tris(dimethylsilyl)benzene and 1,3,5-trimethyl-1,3,5-trisilane; and organopolysilanes such as poly(methylsilylene)phenylene and poly(methylsilylene)Methylene.

Examples of suitable organohydrogensiloxanes for use as the SiH-functional organosilicon compound are disiloxanes such as 1,1,3,3-tetramethyldisiloxane and 1,1,3,3-tetraphenyldisiloxane; trisiloxanes such as phenyltris(dimethylsiloxy)silane and 1,3,5-trimethylcyclotrisiloxane; and polysiloxanes such as a trimethylsiloxy-terminated poly(methylhydrogensiloxane), a trimethylsiloxy-terminated poly(dimethylsiloxane/methylhydrogensiloxane), a dimethylhydrogensiloxy-terminated poly(methylhydrogensiloxane), and a MDQ-type resin consisting essentially of $H(CH_3)_2SiO_{1/2}$ units, $(CH_3)_2SiO_{2/2}$ units, and $SiO_{4/2}$ units. That is, in this context the phrase "consisting essentially of" means the MDQ-type resin is substantially free of (i.e., from 0 to <0.10 mole fraction) or completely free of (i.e., 0.00 mole fraction) T units and M and D units other than the respective $H(CH_3)_2SiO_{1/2}$ units and $(CH_3)_2SiO_{2/2}$ units.

Methods of preparing constituent (B) the SiH-functional organosilicon compound are well known in the art and readily adoptable herein. For example, organopolysilanes may be prepared by a reaction of organochlorosilanes in a hydrocarbon solvent in the presence of sodium metal or lithium metal (an example of the so-called Wurtz reaction). Organopolysiloxanes may be prepared by hydrolysis and condensation of organohalosilanes.

Each unit subscript described herein is independently defined. Each $R^1$ described herein independently is as defined above for the organopolysiloxane. To ensure compatibility of constituents (A) and (B), the predominant $R^1$ in each constituent (A) and (B) is of the same type (e.g., predominantly alkyl or predominantly aryl). In some embodiments the predominant $R^1$ group in each constituent (A) and (B) is alkyl, alternatively methyl. The remaining $R^1$ groups, if any, may be ethyl and/or phenyl. The alkenyl groups are as defined above for the organopolysiloxane. Typically each alkenyl group independently is vinyl, allyl, 1-buten-4-yl, or 1-hexen-6-yl; alternatively vinyl, allyl, or 1-buten-4-yl; alternatively vinyl or allyl; alternatively vinyl or 1-buten-4-yl; alternatively vinyl; alternatively allyl; alternatively 1-buten-4-yl; alternatively 1-hexen-6-yl.

The amount of constituent (B) in the hydrosilylation curable formulation is a concentration sufficient to cure the formulation. The formulation may be considered to be cured by the extent of hydrosilylation reaction between the alkenyl groups of constituent (A) and the SiH groups of constituent (B) in a cured silicone product prepared therefrom. The concentration of constituent (B) in the hydrosilylation curable formulation may be readily adjusted by a person of ordinary skill in the art to obtain a desired extent of cure in the cured silicone product. Typically, the concentration of constituent (B) in the formulation is sufficient to provide from 0.5 to 3, alternatively from 0.7 to 1.2, SiH groups per alkenyl group of constituent (A). When the sum of the average number of alkenyl groups per molecule of constituent (A) and the average number of silicon-bonded hydrogen atoms per molecule of constituent (B) is greater than four, crosslinking occurs and the cured silicone product may be characterized by an extent of crosslinking or crosslink density therein. All other things being equal, as the sum is increased (e.g., from >4 to 4.5, 5, or 6, such as by selecting embodiments of constituents (A) and (B) with higher average numbers of alkenyl groups per molecule and higher numbers of SiH groups per molecule, respectively), the extent of crosslinking or crosslink density in the cured silicone product prepared therefrom is increased. Separately, all other things being equal, as the concentration of constituent (B) in the formulation is increased, the extent of crosslinking or crosslink density in the cured silicone product prepared therefrom is increased. The sum and/or concentration may be readily adjusted by a person of skill in the art to achieve a desire extent of crosslinking in the cured silicone product.

The constituents (A) and (B) may be proportioned in the hydrosilylation curable formulation (and thus in the silicone thermo-optical matrix) in such a way so as to configure the formulation with a SiH-to-alkenyl ratio (e.g., a SiH-to-vinyl molar ratio, SiH/Vi ratio). The SiH-to-alkenyl ratio (e.g., SiH/Vi ratio) may be measured using infrared (IR) or proton nuclear magnetic resonance ($^1$H-NMR) spectroscopy, e.g., using an Agilent 400-MR NMR spectrophotometer at 400 megahertz (MHz). The hydrosilylation curable formulation may be proportioned to any desired SiH-to-alkenyl ratio (e.g., SiH/Vi ratio), e.g., from 0.01 to 1,000; alternatively from 0.05 to 100; alternatively from 0.1 to 10. The SiH-to-alkenyl ratio may be tailored for a particular application or use. In some aspects the constituent (A) the organopolysiloxane contains an average, per molecule, of at least three alkenyl groups; alternatively the constituent (B) the SiH-functional organosilicon compound contains an average, per molecule, of at least three SiH functional groups; or both.

Constituent (C) of the hydrosilylation curable formulation is a hydrosilylation catalyst, typically a photoactivatable hydrosilylation catalyst. The hydrosilylation catalysts, other than the photoactivatable hydrosilylation catalyst, may be any hydrosilylation catalyst capable of catalyzing the hydrosilylation of component (A) with component (B) upon heating of the formulation. The photoactivatable hydrosilylation catalyst may be any hydrosilylation catalyst capable of catalyzing the hydrosilylation of component (A) with component (B) upon/after exposing the catalyst to radiation having a wavelength comprising I-line radiation (e.g., 365 nm), and heating of the formulation. Typically, the radiation is either broadband ultraviolet light or only I-line (365 nm) UV light. The hydrosilylation curable formulation may be heated before, concurrently with, or after the exposing to radiation step. Typically, the hydrosilylation catalyst comprises a metal, e.g., a platinum group metal. The metal may be palladium, platinum, rhodium, ruthenium, or a combination of any two or more thereof. The metal may be palladium, alternatively platinum, alternatively rhodium, alternatively ruthenium, alternatively a combination of platinum and at least one of palladium, rhodium, and ruthenium. The metal may be part of a metal-ligand complex. The ligand of the metal-ligand complex may be any monodentate ligand, multidentate ligand, or a combination thereof. The constituent (C) may be colorless, or in aspects wherein constituent (C) is colored (e.g., Rh catalysts may be red), the color does not interfere with the intended use of the smart optical material.

In some embodiments the hydrosilylation catalyst may be a Rh catalyst. Such a Rh catalyst is [Rh(cod)$_2$]BF$_4$ wherein cod is 1,5-cyclooctadiene, Wilkinson's catalyst (Rh(PPh$_3$)$_3$Cl wherein Ph is phenyl), Ru($\eta^6$-arene)Cl$_2$]$_2$ wherein arene is benzene or para-cymene, wherein para-cymene is 1-methyl-4-(1-methylethyl)benzene, a Grubb's catalyst (e.g., Ru=CHPh(PPh$_3$)$_2$Cl$_2$ wherein Ph is phenyl), or

[Cp*Ru(CH$_3$CN)$_3$]PF$_6$) wherein Cp* is 1,2,3,4,5-pentamethylcyclopentadiene anion. Alternatively, the hydrosilylation catalyst may be a Pt catalyst. Examples of the Pt catalyst is Speier's catalyst (H$_2$PtCl$_6$; U.S. Pat. No. 2,823,218 and U.S. Pat. No. 3,923,705) or Karstedt's catalyst (Pt[H$_2$C═CH—Si(CH$_3$)$_2$]$_2$O); U.S. Pat. No. 3,715,334 and U.S. Pat. No. 3,814,730). Alternatively platinum catalysts include, but are not limited to, the reaction product of chloroplatinic acid and an organosilicon compound containing terminal aliphatic unsaturation, including the catalysts described U.S. Pat. No. 3,419,593. Alternatively, the hydrosilylation catalysts include Pt complexes with bidentate ligands such as 1,3-butadiene, alternatively acetylacetonate. Hydrosilylation catalysts also include neutralized complexes of platinum chloride and divinyl tetramethyl disiloxane, as described in U.S. Pat. No. 5,175,325. Also, suitable hydrosilylation catalysts are described in U.S. Pat. No. 3,159,601; U.S. Pat. No. 3,220,972; U.S. Pat. No. 3,296,291; U.S. Pat. No. 3,516,946; U.S. Pat. No. 3,989,668; U.S. Pat. No. 4,784,879; U.S. Pat. No. 5,036,117; U.S. Pat. No. 5,175,325; and EP 0 347 895 B1.

Examples of suitable photoactivatable hydrosilylation catalysts are those described in U.S. Pat. No. 6,617,674 B2, column 6, line 65, to column 7, line 25; which catalysts are hereby incorporated herein by reference. Some of the photoactivatable hydrosilylation catalysts described therein are also described in the preceding paragraph. The photoactivatable hydrosilylation catalysts may be prepared by methods well known in the art and readily adoptable herein, such as described in U.S. Pat. No. 6,617,674 B2, column 7, lines 39 to 48.

In some embodiments (C) the hydrosilylation catalyst is the photoactivatable hydrosilylation catalyst and the method comprises radiating the catalyst with light having a wavelength from 300 to 800 nm to give an irradiated silicone formulation, and heating the irradiated silicone formulation to give the cured silicone product that is the silicone thermo-optical matrix. The light may be I-line radiation (365 nm) or broadband radiation (which contains I-line radiation).

The catalytic amount of (C) the hydrosilylation catalyst used in the hydrosilylation curable formulation may be characterized as any atomic amount greater than 0 parts per million (ppm) of the metal derived from the hydrosilylation catalyst. The atomic amount of the metal may be from greater than 0 to 1000 ppm based on total weight of the hydrosilylation curable formulation. The atomic amount of the metal may be from 0.1 to 500 ppm, alternatively from 0.5 to 200 ppm, alternatively from 0.5 to 100 ppm, alternatively from 1 to 25 ppm. The metal may be any one of the platinum group metals, e.g., platinum.

Constituent (D) of the hydrosilylation curable formulation is the athermo-optical filler.

The athermo-optical filler may be composed of any particulate material such as an inorganic particulate material, an organic particulate material or a silica particulate material that is suitable for transmitting light at elevated temperature, $T_Z$, and has substantially the same refractive index at that elevated temperature as its refractive index at 23° C. The athermo-optical filler is amorphous and when widely dispersed in the thermo-optical matrix is unagglomerated has an average particle size as described below. The athermo-optical filler is distinct from silicone resin particles in particle size, composition, or molecular weight.

In some embodiments the athermo-optical filler has at 23° C. a refractive index, $n_{23/q}$, of from 1.450 to 1.460, alternatively from 1.451 to 1.459, alternatively from 1.4570 to 1.4590, alternatively from 1.4580 to 1.4589, all at a wavelength of 633 nm. In some embodiments the athermo-optical filler has at 20° C. a refractive index, $n_{20/d}$, of from 1.450 to 1.460, alternatively from 1.451 to 1.459, alternatively from 1.4570 to 1.4590, alternatively from 1.4580 to 1.4589, all at a wavelength of 589 nm.

The composition of the athermo-optical filler may be any material that has a poor coefficient of thermal expansion (CTE) such that its thermo-optic coefficient $(dn/dT)^F$ is $>-1.0 \times 10^{-4}$ K$^{-1}$ ($-0.0001$ K$^{-1}$), alternatively $>-5 \times 10^{-5}$ K$^{-1}$ ($-0.00005$ K$^{-1}$), alternatively $>-2 \times 10^{-5}$ K$^{-1}$ ($-0.00002$ K$^{-1}$). For clarity, $-2 \times 10^{-5}$ K$^{-1} > -5 \times 10^{-5}$ K$^{-1} > -1.0 \times 10^{-4}$ K$^{-1}$. Further, the thermo-optical matrix's $(dn/dT)^M$ is less than the athermo-optical filler's $(dn/dT)^F$; e.g., the $(dn/dT)^M$ is $-4 \times 10^{-4}$ K$^{-1}$ ($-0.0004$ K$^{-1}$) and $(dn/dT)^F$ is $-1.2 \times 10^{-5}$ K$^{-1}$ ($-0.000012$ K$^{-1}$).

The athermo-optical filler may comprise a treated particulate solid such as a treated silica. The treated silica may be a pretreated silica, alternatively an in situ treated silica, alternatively a combination of pretreated silica and an in situ treated silica. The treated silica may be a treated fumed silica. The treated particulate solid may be prepared by contacting a corresponding untreated particulate solid with a treating agent such that functional groups (e.g., HO—groups on particle, i.e., HO-particle) at the surface of the untreated particulate solid reacts with the treating agent to yield the treated particulate solid wherein the functional groups have formed a covalent bond to a portion of the treating agent (e.g., R$_3$SiCl+HO-particle→R$_3$Si—O-particle, wherein each R independently is an alkyl or alkoxy group). The treated particulate solid may be prepared as a masterbatch containing at least some of at least one other constituent of the curable formulation. The untreated particulate solid and treated particulate solid each independently has an average particle size. The average particle size of the (treated) athermo-optical filler (e.g., treated precipitated or treated fumed silica) may be from >8 nm to 500 nm, alternatively from 8.5 nm to 350 nm, alternatively from 8.5 nm to 250 nm, alternatively from 9 nm to 250 nm, alternatively from 8.5 nm to <100 nm, alternatively from 9 nm to 44 nm, alternatively from 9 nm to 40 nm (e.g., 10 nm, 15 nm, 20 nm, or 30 nm). Analogously, the average particle size of the athermo-optical filler (e.g., a pretreated fumed silica and/or in situ treated fumed silica) may be from >8 nm to 500 nm, alternatively from 8.5 nm to <100 nm, alternatively from 9 nm to 44 nm, alternatively from 9 nm to 40 nm (e.g., 10 nm, 15 nm, 20 nm, or 30 nm).

The athermo-optical filler is a treated particulate solid and has increased dispersability in the thermo-optical matrix, or in a matrix-forming precursor used to make the thermo-optical matrix, or in both, compared to its parent untreated particulate solid. The increased dispersability helps prevent agglomeration of aggregates to form agglomerates or helps prevent matrix adsorption, which disadvantageously leads to crepe hardening. The treated particulate solid, however, typically does not dissolve, and does not need to dissolve, in the thermo-optical matrix to enable the "smart" functionality of the smart optical material.

Typically the athermo-optical filler is composed of a solid inorganic particulate that has been surface treated with a filler treating agent (e.g., organic or silicon-containing filler treating agent) that is effective for chemically compatibilizing the athermo-optical filler with the thermo-optical matrix such that the filler may be widely and finely dispersed in the matrix. Alternatively, the filler treating agent is effective for chemically compatibilizing the athermo-optical filler with a mixture of two or more matrix-forming precursors, which are then polymerized in the presence of the filler to give the thermo-optical matrix having the treated athermo-optical filler widely and finely dispersed therein. For present purposes, the refractive index at 20° C. of the athermo-optical filler before treatment with the filler treating agent may be equal to the refractive index of the athermo-optical filler after treatment with the filler treating agent.

Constituent (D) the athermo-optical filler may be a treated silica, alternatively an in situ treated silica or a pretreated silica, alternatively a pretreated silica, alternatively an in situ treated silica, alternatively a combination or mixture of a pretreated silica and an in situ treated silica. The treated silica may be a treated fumed silica. Typically the athermo-optical filler consists of a treated silica, such as a masterbatch treated precipitated silica, a masterbatch treated fumed silica, or a mixture thereof. In some embodiments the athermo-optical filler is a masterbatch treated precipitated silica. Typically, the athermo-optical filler is prepared as an in situ treated masterbatch of fumed silica. The athermo-optical filler may be a treated particulate solid, which is different than the untreated particulate solid from which it has been prepared (by contacting the latter with a filler treating agent to yield the former) in at least one characteristic of particle size, surface area, composition, refractive index (overall), dn/dT (overall), agglomeration character or lack thereof, dispersability in constituents (A) and/or (B), or dispersability in the thermo-optical matrix.

In some embodiments the smart optical material does not contain an untreated silica; alternatively the smart optical material does not contain any untreated athermo-optical filler. In such embodiments the untreated athermo-optical filler includes, but is not limited to, an untreated silica and the partially-treated athermo-optical filler includes, but is not limited to, a partially-treated silica. In other aspects the smart optical material lacks or is free of both untreated silica and untreated silicone resin particles, alternatively the smart optical material lacks both untreated athermo-optical filler and untreated silicone resin particles.

The pretreated silica may be prepared in a preliminary step, and then mixed with constituents (A)-(C) to form the hydrosilylation curable formulation. Typically, the in situ treated silica may be prepared in the presence of constituent (A), but not constituent (B) or (C), and then once it has been prepared it may be mixed with constituents (B) and (C) to form the hydrosilylation curable formulation. In any preparation the filler treating agent is used to treat untreated silica to prepare the treated silica. The effective amount of athermo-optical filler in the smart optical material may be from >5 to 45 wt %, alternatively from >5 to 10 wt %, alternatively from 10 to 45 wt %, alternatively from 15 to 35 wt %, alternatively from 20 to 30 wt %, all based on total weight of the smart optical material. The treated fumed silica when at 23° C. may have a refractive index $n_{23/q}^{M}$ of 1.455 to 1.460 and a thermo-optic coefficient $(dn/dT)^{F}$ of $-1 \times 10^{-5}$. Alternatively, some untreated fumed silicas may have a positive thermo-optic coefficient $(dn/dT)^{F}$ of up to $+1 \times 10^{-5}$ to $+1.5 \times 10^{-5}$. (The positive thermo-optic coefficient for fumed silica means its refractive index increases with increasing temperature.)

The treated athermo-optical filler may be formed by contacting an untreated filler with a constituent (E) a filler treating agent, which is useful for chemically modifying the untreated filler so as to yield the athermo-optical filler. The filler treating agent contains at least one functional group that is reactive with functional groups on the untreated athermo-optical filler. For example, an untreated silica contains hydroxyl groups, and so a hydroxyl-functional organosiloxane may be used to treat untreated silica, whereas an organosiloxane that contains only aliphatically unsaturated reactive groups such as vinyl groups cannot be used to treat untreated silica. The athermo-optical filler may be prepared by the pretreatment method, alternatively the in situ treatment method. The (E) filler treating agent functions to compatibilize the untreated filler, which may not be dispersible in the thermo-optical matrix and/or in a mixture of two or more matrix-forming precursors thereto in untreated form without aggregating, agglomerating and/or settling. The contacting step produces the athermo-optical filler as a treated filler that is chemically modified, at least at surface functional groups, such that the athermo-optical filler may be finely divided and widely dispersed in the thermo-optical matrix and in any matrix-forming precursors thereto. The particular filler treating agent used may be readily determined by an ordinary skilled artisan based on factors such as the composition of the thermo-optical matrix and/or matrix forming precursors thereto, the composition of the untreated filler, and the particular filler treating agent used. Silica particles and particulate phosphors independently may be treated with silane-based or siloxane-based filler treating agents to form covalent bonded surface groups on the particulates. Such filler treating agents and methods are well known even from prior to 1992 and readily adoptable herein: e.g., see U.S. Pat. No. 2,993,809; U.S. Pat. No. 3,024,126; U.S. Pat. No. 3,128,196; DE 1951620; U.S. Pat. No. 3,635,743; GB 1371218; U.S. Pat. No. 3,847,848; U.S. Pat. No. 3,920,865; U.S. Pat. No. 3,929,718; U.S. Pat. No. 4,111,890; U.S. Pat. No. 4,454,288; and U.S. Pat. No. 4,985,477. Certain filler treating agents are described below.

The amount of constituent (E) will vary depending on factors such as the type of filler treating agent selected and the type and amount of particulates (such as constituents (D) and/or phosphor particles) to be treated, and whether the particulates are only treated particles or whether the particles are a mixture of treated and untreated particles as described herein. Constituent (E) may be used in an amount ranging from 0.01% to 20%, alternatively 0.1% to 15%, alternatively 0.5% to 10%, and alternatively 0.5% to 5%, based on the weight of all ingredients or constituents in the composition. Particulates, such as the athermo-optical filler, the physical drying agent, certain flame retardants, when present, may optionally be surface treated with constituent (E). Particulates may be treated with constituent (E) before being added to the composition, or in situ. Constituent (E) may comprise an alkoxysilane, an alkoxy-functional oligosiloxane, a cyclic polyorganosiloxane, a hydroxyl-functional oligosiloxane such as a dimethyl siloxane or methyl phenyl siloxane, or a fatty acid. Examples of fatty acids include stearates such as calcium stearate.

Some representative organosilicon filler treating agents that can be used as constituent (E) include compositions normally used to pretreat silica fillers such as organochlorosilanes, organosiloxanes, organodisilazanes such as hexaalkyl disilazane, and organoalkoxysilanes such as $C_6H_{13}Si(OCH_3)_3$, $C_8H_{17}Si(OC_2H_5)_3$, $C_{10}H_{21}Si(OCH_3)_3$, $C_{12}H_{25}Si(OCH_3)_3$, $C_{14}H_{29}Si(OC_2H_5)_3$, and $C_6H_5CH_2CH_2Si(OCH_3)_3$. In some aspects the constituent (E) is an organodisilazane such as a hexaalkyldisilazane. Other filler treating agents that can be used include alkylthiols, fatty acids, titanates, titanate coupling agents, zirconate coupling agents, and combinations thereof. Such filler treating agents may also be used to treat untreated silica in situ.

Alternatively, constituent (E) may comprise an alkoxysilane having the formula: $R^{11}_m Si(OR^{12})_{(4-m)}$, where subscript m may have a value ranging from 1 to 3, alternatively subscript m is 3. Each $R^{11}$ is independently a monovalent organic group, such as a monovalent hydrocarbon group of 1 to 50 carbon atoms, alternatively 8 to 30 carbon atoms, alternatively 8 to 18 carbon atoms. $R^{11}$ is exemplified by alkyl groups such as hexyl, octyl, dodecyl, tetradecyl, hexadecyl, and octadecyl; and aromatic groups such as benzyl and a phenylethyl. $R^{11}$ may be saturated or unsaturated, and branched or unbranched. Alternatively, $R^{11}$ may be saturated and unbranched.

Each $R^{12}$ is independently a saturated hydrocarbon group of 1 to 4 carbon atoms, alternatively 1 to 2 carbon atoms. Alkoxysilanes suitable for use as constituent (E) are exemplified by hexyltrimethoxysilane, octyltriethoxysilane, decyltrimethoxysilane, dodecyltrimethoxysilane, tetradecyltrimethoxysilane, phenylethyltrimethoxysilane, octadecyltrimethoxysilane, octadecyltriethoxysilane, and combinations thereof.

Alkoxy-functional oligosiloxanes may also be used as (E) filler treating agents. For example, suitable alkoxy-functional oligosiloxanes include those of the formula (V): $(R^{13}O)_n Si(OSiR^{14}_2 R^{15})_{(4-n)}$. In this formula, subscript n is 1, 2 or 3, alternatively subscript n is 3. Each $R^{13}$ may be an alkyl group. Each $R^{14}$ may be an unsaturated monovalent hydrocarbon group of 1 to 10 carbon atoms. Each $R^{15}$ may be an unsaturated monovalent hydrocarbon group having at least 10 carbon atoms.

Certain particulates, such as metal fillers may be treated with (E) filler treating agents that are alkylthiols such as octadecyl mercaptan; fatty acids such as oleic acid and stearic acid; and a combination thereof.

Filler treating agents (E) for alumina or passivated aluminum nitride may include alkoxysilyl functional alkylmethyl polysiloxanes (e.g., partial hydrolysis condensate of $R^{16}_o R^{17}_p Si(OR^{18})_{(4-o-p)}$ or cohydrolysis condensates or mixtures), or similar materials where the hydrolyzable group may comprise silazanyl, acyloxy or oximo. In all of these, a group tethered to Si, such as $R^{16}$ in the formula above, is a long chain unsaturated monovalent hydrocarbon or monovalent aromatic-functional hydrocarbon. Each $R^{17}$ is independently a monovalent hydrocarbon group, and each $R^{18}$ is independently a monovalent hydrocarbon group of 1 to 4 carbon atoms. In the formula above, subscript o is 1, 2, or 3 and subscript p is 0, 1, or 2, with the proviso that a sum (o+p) is 1, 2, or 3.

Other filler treating agents (E) include alkenyl functional polyorganosiloxanes. Suitable alkenyl functional polyorganosiloxanes include, but are not limited to:

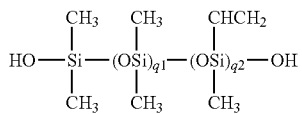

where subscript q1 is ≥0, subscript q2 is >1, and the sum q1+q2 has a value up to 1.50. Other filler treating agents include mono-endcapped alkoxy functional polydiorganosiloxanes, i.e., polydiorganosiloxanes having an alkoxy group at one end. Such filler treating agents are exemplified by the formula: $R^{25}R^{26}_2 SiO(R^{26}_2 SiO)_u Si(OR^{27})_3$, where subscript u has a value of 0 to 100, alternatively 1 to 50, alternatively 1 to 10, and alternatively 3 to 6. Each $R^{25}$ is independently selected from an alkyl group, such as Me, Et, Pr, Bu, hexyl, and octyl; and an alkenyl group, such as Vi, allyl, butenyl, and Hex. Each $R^{26}$ is independently an alkyl group such as Me, Et, Pr, Bu, hexyl, and octyl. Each $R^{27}$ is independently an alkyl group such as Me, Et, Pr, and Bu. Alternatively, each $R^{25}$, each $R^{26}$, and each $R^{27}$ is Me. Alternatively, each $R^{25}$ is Vi. Alternatively, each $R^{26}$ and each $R^{27}$ is Me.

Alternative, a polyorganosiloxane capable of hydrogen bonding is useful as filler treating agent (E). This strategy takes advantage of multiple hydrogen bonds, either clustered or dispersed or both, as the means to tether the compatibilization moiety to the filler surface. The polyorganosiloxane capable of hydrogen bonding has an average, per molecule, of at least one silicon-bonded group capable of hydrogen bonding. The group may be selected from: an organic group having multiple hydroxyl functionalities or an organic group having at least one amino functional group. The polyorganosiloxane capable of hydrogen bonding means that hydrogen bonding is the primary mode of attachment for the polyorganosiloxane to a filler. The polyorganosiloxane may be incapable of forming covalent bonds with the filler. The polyorganosiloxane capable of hydrogen bonding may be selected from the group consisting of a saccharide-siloxane polymer, an amino-functional polyorganosiloxane, and a combination thereof. Alternatively, the polyorganosiloxane capable of hydrogen bonding may be a saccharide-siloxane polymer.

Any unreacted, residual or remaining (E) filler treating agent, which is used to treat the untreated athermo-optical filler as described above and prepare the treated athermo-optical filler, may be left in the treated athermo-optical filler, including the in situ treated filler masterbatch as long as it does not prevent curing of the curable formulation, although typically none is left in the pretreated athermo-optical filler, especially if the pretreated filler is obtained from a commercial supplier or if the filler treating agent is a material, such as a silazane, that could function as an inhibitor of constituent (C) the hydrosilylation catalyst. The pretreated athermo-optical filler may be later mixed with the matrix forming precursors to prepare the curable formulation. For example, any unreacted, residual or remaining (E) filler treating agent may be left in the pretreated fumed silica, and the pretreated fumed silica may be later mixed with the constituents (A), (B) and (C) to prepare the hydrosilylation curable formulation. Alternatively, after the pretreated athermo-optical filler has been made, any unreacted, residual or remaining (E) filler treating agent may be separated therefrom to give a pretreated athermo-optical filler that is free of (i.e., does not contain) any unreacted, residual or remaining (E) filler treating agent. The pretreated athermo-optical filler that is free of unreacted, residual or remaining (E) filler treating agent may then be later mixed with the matrix forming precursors to prepare the curable formulation. For example, after the pretreated fumed silica has been made, any unreacted, residual or remaining (E) filler treating agent may be separated therefrom to give a pretreated fumed silica that is free of (i.e., does not contain) any unreacted, residual or remaining (E) filler treating agent. The pretreated fumed silica that is free of unreacted, residual or remaining (E) filler treating agent may then be later mixed with the constituents (A), (B), (C), and (D) to prepare the hydrosilylation curable formulation. Thus although the filler treating agent is used to prepare the athermo-optical filler, when the latter is the pretreated athermo-optical filler, the (E) filler treating agent is an optional constituent of the curable formulation such as the hydrosilylation curable formulation, and thus of the cured product made therefrom such as the hydrosilylation cured product. When the athermo-optical filler is an in situ treated filler masterbatch, the curable formulation may further comprise unreacted, residual or remaining (E) filler treating agent, if any.

In some of the foregoing embodiments the untreated athermo-optical filler is an untreated precipitated silica, alternatively an untreated fumed silica; and the treated athermo-optical filler is a masterbatch treated precipitated silica, alternatively a masterbatch treated fumed silica, respectively.

In preparing the hydrosilylation curable formulation, mixtures of the constituents (A), (B), and (C) may begin to cure at ambient temperature, e.g., 25°±3° C. To obtain a longer working time or "pot life" for the formulations, the activity of (C) the hydrosilylation catalyst under ambient conditions may optionally be retarded or suppressed by lowering the temperature of the formulations and/or by the addition of at least one constituent (F) a suitable inhibitor thereof. A platinum catalyst inhibitor retards curing of the formulations at ambient temperature, but does not prevent the formulations from curing at elevated temperatures (e.g., from 40° to 250° C.). Suitable platinum catalyst inhibitors include various "ene-yne" systems such as 3-methyl-3-penten-1-yne and 3,5-dimethyl-3-hexen-1-yne; acetylenic alcohols such as 3,5-dimethyl-1-hexyn-3-ol, 1-ethynyl-1-cyclohexanol, and 2-phenyl-3-butyn-2-ol; maleates and fumarates, such as dialkyl, dialkenyl, and dialkoxyalkyl fumarates and maleates; and cyclovinylsiloxanes. In some embodiments the inhibitor may comprise an acetylenic alcohol.

The concentration of optional constituent (F) the catalyst inhibitor in the hydrosilylation curable formulation is sufficient to retard curing of the formulation at ambient temperature without preventing or excessively prolonging cure at elevated temperatures. This concentration may vary depending on the particular inhibitor used, the nature and concentration of the hydrosilylation catalyst, and the nature of the constituent (B). Inhibitor concentrations as low as one mole of inhibitor per mole of platinum group metal will in some instances yield a satisfactory storage stability and cure rate. In other instances, inhibitor concentrations of up to 500 or more moles of inhibitor per mole of platinum group metal may be required. If desired, the optimum concentration for a particular inhibitor in a given formulation may be readily determined by routine experimentation.

The hydrosilylation curable formulation optionally may further comprise (G) a solvent such as a silicone fluid or an organic solvent such as an alkane (e.g., heptane), an arene (e.g., toluene or xylenes), a ketone (e.g., methyl ethyl ketone), or a carboxylic ester (e.g., ethyl acetate). When present, the concentration of constituent (G) the solvent in the formulation may be from >0 to 50 wt % based on total weight of the formulation. The solvent may be removed before the formulation is hydrosilylation cured or during curing.

Optionally, the hydrosilylation curable formulation independently may further comprise one or more additional constituents other than constituents (A) to (D) and the independently optional constituents (E) to (G). Examples of suitable additional constituents are (H) adhesion promoters, (I) organic fillers, (J) photosensitizers, (K) surfactants, and thermal stabilizers. In some embodiments, the hydrosilylation curable formulation further comprises a thermal stabilizer, which inhibits degradation of the thermo-optical matrix prepared from the hydrosilylation curable formulation. Examples of suitable thermal stabilizers are organic radical scavengers such as substituted phenols and inorganic radical scavengers such as iron and cerium compounds.

Any optional constituents may be added to the curable formulation used to prepare the smart optical material provided they do not fatally affect the use of the formulations in or for preparing cured silicone products, articles and devices, with the proviso that the optional constituents lack (i.e., are free of) an untreated silica or partially-treated silica, alternatively lack an untreated or partially-treated athermo-optical filler, all as described above. Thus, any constituents in the smart optical material other than the thermo-optical matrix and the athermo-optical filler would be optional and would only be included if they would not negate the method of tuning or the resulting "smart" functionality of the smart optical material. In some embodiments the smart optical material is free of (i.e., does not contain) and the curable formulation used to prepare the smart optical material is free of (i.e., does not contain) any one of optional constituents (E) to (K), alternatively any one of optional constituents (F) to (K), alternatively any one of constituents (G) to (K), alternatively all of optional constituents (E) to (K), alternatively all of optional constituents (F) to (K), alternatively all of optional constituents (G) to (K).

A cured silicone product as the silicone thermo-optical matrix is formed by hydrosilylation curing the hydrosilylation curable formulation to give the cured silicone product, which is an embodiment of the smart optical material. The hydrosilylation curable formulation typically contains the athermo-optical filler finely divided and widely dispersed therein during curing. The athermo-optical filler may be inert to the hydrosilylation curing reaction, and thus lack or be free of covalent bonds to the silicone thermo-optical matrix. Alternatively the athermo-optical filler may also react with one or more constituents of the hydrosilylation curable formulation and/or intermediates formed during said curing so as to become covalently bonded to the silicone thermo-optical matrix. In some embodiments the smart optical material has a silicone thermo-optical matrix that has been prepared by hydrosilylation curing such hydrosilylation curable formulations and a treated fumed silica widely and finely dispersed therein, wherein the treated fumed silica is not covalently bonded, alternatively is covalently bonded to the silicone thermo-optical matrix.

The hydrosilylation curable formulation independently may be a one-part formulation comprising constituents (A) through (D) in a single part or, alternatively, a multi-part formulation comprising different ones of constituents (A) through (D) in two or more parts. In a multi-part formulation, constituents (A), (B), and (C) are typically not present in the same part unless optional constituent (F) an inhibitor is also present. For example, a multi-part formulation may comprise a first part containing a portion of constituent (A), all of constituent (B), and a portion of constituent (D); and a second part containing the remaining portion of constituent (A), all of component (C), the remaining portion of constituent (D), and, if used, all of optional constituent (G).

The one-part formulation is typically prepared by combining constituents (A) through (D) and any desired optional constituents in the stated proportions at ambient temperature. Although the order of addition of the various constituents is not critical if the formulation is to be used immediately, constituent (C) the hydrosilylation catalyst is preferably added last at a temperature below about 30° C. to prevent premature curing of the resulting hydrosilylation curable formulation. The multi-part formulation may be prepared by combining the particular components designated for each part to give the two or more parts. Just before use, the two or more parts may be combined together to give the hydrosilylation curable formulation.

The smart optical material may be prepared as a stand-alone or free-standing article or as an article disposed on a substrate. The standalone article may be useful as an optical membrane in optical devices such as optical sensors, telescopes, and optical filters. In some embodiments, the smart optical material may be shaped or applied in the shape of a film, coating, slab, or bulk material. The coating or film may be patterned and used as a photoresist layer on a device wafer such as a semiconductor device wafer. The invention includes additional uses and applications for the curable formulations, articles and devices, such as sealants, adhesives, thermal and/or electrical insulating layers, and so on.

The substrate used in the some embodiments of the manufactured article may be rigid or flexible. Examples of suitable rigid substrates include inorganic materials, such as glass plates; glass plates comprising an inorganic layer; ceramics; and silicon-containing wafers, such as silicon wafers, silicon wafers having a layer of silicon carbide disposed thereon, silicon wafers having a layer of silicon oxide disposed thereon, silicon wafers having a layer of silicon nitride disposed thereon, silicon wafers having a layer of silicon carbonitride disposed thereon, or silicon wafers having a layer of silicon oxycarbonitride disposed thereon. The term "silicon wafer" used by itself (i.e., without specifying a layer of a different material thereon) may consist essentially of monocrystalline silicon or polycrystalline silicon. The phrase "consist essentially of" in this context means the silicon wafer does not contain a layer of silicon carbide, silicon nitride, silicon oxide, silicon carbonitride, silicon oxycarbonitride, sapphire, gallium nitride, or gallium arsenide. Additional examples of suitable substrate materials are sapphire, silicon wafers having a layer of gallium nitride disposed thereon, and gallium arsenide wafers. In some embodiments the substrate comprises a silicon wafer or a silicon wafer having disposed thereon a layer of silicon carbide, silicon nitride, silicon oxide, silicon carbonitride, silicon oxycarbonitride, sapphire, gallium nitride, or gallium arsenide. In some embodiments the substrate comprises a silicon wafer, alternatively a silicon wafer having disposed thereon a layer of silicon carbide, alternatively a silicon wafer having disposed thereon a layer of silicon nitride. The disposed layer may be applied, deposited or built on the silicon wafer using any suitable method such as chemical vapor deposition, which may be plasma enhanced.

In other embodiments, it may be desirable for the substrate of the certain manufactured articles to be flexible. In these embodiments, specific examples of flexible substrates include those comprising various silicone or organic polymers. From the view point of transparency, refractive index, heat resistance and durability, specific examples of flexible substrates include those comprising polyolefins (polyethylene, polypropylene, etc.), polyesters (poly(ethylene terephthalate), poly(butylene terephthalate), poly(ethylene naphthalate), etc.), polyamides (nylon 6, nylon 6,6, etc.), polystyrene, styrene copolymers such as a poly(styrene-co-methyl methacrylate), poly(vinyl chloride), polyimides, polycarbonates, polynorbornenes, polyurethanes, poly(vinyl alcohol), poly(ethylene-co-vinyl alcohol), polyacrylics, celluloses (e.g., triacetylcellulose, diacetylcellulose, cellophane, etc.), or interpolymers (e.g. copolymers) of such organic polymers. Typically, the flexible substrate is made of a material with sufficient heat resistance to survive a step of curing at an elevated temperature of from 170° to 270° C. (e.g., 180° to 250° C., e.g., about 210° C. Alternatively, from the view point of transparency, refractive index, heat resistance and durability, specific examples of flexible substrates include those comprising polyorganosiloxane formulations such as silsesquioxane-containing polyorganosiloxane formulations. As understood in the art, the organic polymers and silicone polymers recited above may be rigid or flexible.

Further, the substrate may be reinforced, e.g. with fillers and/or fibers. The substrate may have a coating thereon, as described in greater detail below. The substrate may be separated from the article to give another invention article comprising the smart optical material and lacking the substrate, if desired, or the substrate may be an integral portion of the article.

In some embodiments a 1.65 mm thick slab of the smart optical material is prepared and used to measure percent transmittance (T %) thereof for comparison purposes. At 25° C. using the light at wavelength 600 nm, the 1.65 mm thick slab of the smart optical material may have a T % through the thickness of less than or equal to 55%, alternatively <50%, alternatively <45%, alternatively <40%, alternatively <35%, alternatively <30%.

In some aspects, the curable formulation such as the hydrosilylation curable formulation, may be applied on a substrate, such as a phosphor layer or LED chip. The step of applying the hydrosilylation curable formulation on the substrate may comprise a wet coating method. Specific examples of wet coating methods suitable for the method include curtain coating, dip coating, spin coating, flow coating, spray coating, roll coating, gravure coating, sputtering, slot coating (slot die coating), web coating, and combinations thereof. The hydrosilylation curable formulation may be coated (e.g., spin coated), sprayed, calendared, or the like on a LED device wafer, the spin-coating may be done at a maximum spin speed and for a spin time sufficient to obtain a film of the hydrosilylation curable formulation of suitable thickness. The maximum spin speed may be from 400 rpm to 5,000 rpm, alternatively from 500 rpm to 4,000 rpm, alternatively from 800 rpm to 3,000 rpm.

The smart optical material may be used in the optical device. The optical device may be any light emitting device containing the smart optical material and a wavelength converter (e.g., a wavelength converting element or a wavelength converting layer comprising a plurality of wavelength converting elements) and having an operating temperature, $T_Z$, of 80° C. or higher. The optical device may lack, or be free of, a light emitting element, alternatively the optical device may further contain a light emitting element. The light emitting element may be an article or device that upon receiving an electrical current generates light. The light emitting element may be distinct and separate from the wavelength converter in function and composition. The light emitting element may be in optical communication with the wavelength converter via a light pathway that includes the smart optical material. The smart optical material has a maximum useful temperature greater than or equal to the operating temperature $T_Z$. The wavelength converter may, alternatively may not include a yellow or orange emitting element. A particular optical device's $T_Z$ will vary depending on the particular type and construction thereof. E.g., the optical device may be contain a phosphor and a light emitting element that is not an LED, and optionally heat generating element. Alternatively, the optical device may be an LED device containing an LED chip, a phosphor layer, e.g., a yellow phosphor layer, and the smart optical material functioning as a smart optical encapsulant for the LED chip and/or phosphor layer.

In some embodiments the smart optical material is intended for use at $T_Z$ from 80° to 120° C. and may employ a thermo-optical matrix that is an organic polymer (e.g., a poly(vinyl acetate having at 20° C. a refractive index, $n_{23/q}^{M}$, of 1.4665) or a silicone. The intended operating temperature of the smart optical material is the same as the optical device's particular operating temperature, $T_Z$. Currently, a main competitive advantage for silicone-based optical encapsulants versus incumbent non-smart encapsulants such as conventional organic optical encapsulants generally is found for use in optical devices with $T_Z$ of 120° C. or higher. Thus, in some embodiments the smart optical material is intended for use at $T_Z$ from 120° to 200° C. (or higher) and may employ a thermo-optical matrix that is a silicone.

The smart optical material enables additional inventive aspects. For example, the smart optical material may be configured to function as any smart optical article. The smart optical article may be a smart optical encapsulant, a smart optical waveguide, a smart optical connector, or another smart optical component. In some aspects the smart optical material is configured to function as a smart optical encapsulant, alternatively a smart optical waveguide, alternatively an optical connector, all in an optical device also containing a wavelength converter such as phosphors or a phosphor layer. As such the smart optical encapsulant, waveguide or connector covers or hides wavelength converters in off-state optical devices containing same and also increases light output from or light transmittance efficiency of such optical devices when they are powered and in their on-states. Alternatively, the smart optical material may be an optical passivation layer.

In some embodiments the smart optical material, or the optical device containing same, lacks or is free of a camouflaging material (i.e., a colored material such as colored glass beads). While in some aspects the smart optical material encapsulates, covers, or abuts a colored element of the optical device, such as a colored light emitting element or wavelength converters such as a phosphor, the smart optical material itself may lack (is free of) a camouflaging material such as a colorant (i.e., any colored constituent), which is different and distinct from the wavelength converter such as a phosphor in composition. For example, the smart optical material may be free of a constituent that is a pigment, a dye, an ink, or a tint. For example, the smart optical material may lack a white pigment such as titanium dioxide or a colored pigment such as ultramarine, which is blue. The smart optical material may also lack a dye such as an organic aniline dye. In other aspects the smart optical material may further comprise a colorant, which may be different than titanium dioxide or ultramarine.

Some additional aspects include a composite optical device containing a heat generating element; a light emitting element, which may be the same as (e.g., LED) or different than the heat generating element; and a phosphor layer; wherein the smart optical material covers the heat and light emitting element(s) and phosphor layer. The phosphor layer may be any color, e.g., a yellow phosphor layer, a blue phosphor layer, or a green phosphor layer. The composite optical device is described further later. By design the smart optical material covers or hides the phosphor layer when the composite optical device is in its off-state and increases light output from or light transmittance efficiency of the composite optical device when it is in its on-state.

In some aspects the smart optical material may be configured in a shape such that it functions as a lens. Shaped as a lens, the smart optical material may converge or diverge light being emitted from a light emitting element and/or from a wavelength converters (e.g., a phosphor or phosphor layer) so as to alter the direction of light that is ultimately emitted from an optical device containing same.

In some aspects the smart optical material may protect heat and light emitting element(s) and/or wavelength converters (e.g., a phosphor layer) encapsulated therewith from adverse conditions to which the element(s), or the composite optical device containing same, may be exposed. Such adverse conditions include adverse environmental conditions such as moisture or oxygen and/or adverse mechanical conditions such as stress forces (e.g., vibrations) and physical impact.

In some aspects the smart optical material may be configured to function as a heat conductor. As such, the smart optical material may be disposed in thermal communication with a heat generating element (e.g., a LED or LED chip) in its on-state so as to conduct heat away therefrom, thereby preventing the element from overheating. This improves its operating lifetime and that of devices containing same. In some aspects the smart optical material may further function as the heat conductor and lens.

In some aspects the smart optical material may be configured with a light source and receiver to function as a temperature sensor wherein optical clarity of the material transmitting the light source to a light receiver is correlated to temperature and the higher the transmitting the greater the measured temperature. The light receiver may be any inanimate object or animate thing in need of receiving light such as any outdoor area or surface; any indoor area or surface; any transportation vehicle; any photographic film; any photodetector; or any animal or plant. Examples of suitable outdoor areas or surfaces are a roadway or an exterior wall. Examples of suitable indoor areas or surfaces are an interior floor or wall or a display case. Examples of suitable photodetectors are an active-pixel sensor, a charge-coupled device, a LED, a photoconductor, a photovoltaic cell, a photodiode, a photomultiplier, a photoresistor, and a phototransistor.

The use of the smart optical material is not limited to optical devices. For example, the smart optical material may be used as a building material such as a caulk, glazing or sealant, such as a caulk for windows, a sealant for tiles or a glazing for windows. In such embodiments the smart optical material may function to conduct heat to or from the building material, e.g., as in radiant floor heating applications and/or to protect the building material from adverse conditions such as water damage.

In some embodiments the substrate of the certain manufactured articles comprises a wavelength converter comprising a plurality of wavelength converting elements. In some embodiments the wavelength converter is a wavelength conversion layer. In some embodiments the wavelength converting element(s) is/are phosphors and the wavelength converter is a phosphor layer. The wavelength conversion layer such as the phosphor layer may comprise the plurality of wavelength converting elements such as phosphors disposed on a substrate or in a substrate formed from an optical material. In some embodiments the substrate is the smart optical material.

In some aspects the wavelength converter of the certain manufactured articles is an untreated particulate solid, alternatively a treated particulate solid. The wavelength converter may comprise a wavelength converting layer in the optical device. An untreated particulate solid wavelength converter may be contacted with a converter treating agent suitable for modifying surface chemistry of the wavelength converter. In some embodiments the converter treating agent is the filler treating agent described earlier for treating the athermo-optical filler. Alternatively, the wavelength converter treating agent may be a nitrogen-containing base. Contacting the wavelength converter with the converter treating agent makes a treated particulate solid wavelength converter, which is distinct from the untreated wavelength converter in at least one characteristic such as composition, size, melting temperature, and surface reactivity. The wavelength converter is also different and distinct from the athermo-optical filler in at least one characteristic such as composition, size, loading level, (concentration in the material), melting temperature, and color.

In some aspects the wavelength converter of the certain manufactured articles is a phosphor layer comprising a plurality of phosphors. The phosphors may be a particulate solid. In some aspects the phosphor is an untreated particulate solid, alternatively a treated particulate solid. The particulate solid phosphor may be a nanoparticulate solid. The nanoparticulate solid phosphor may have a largest dimension or average largest dimension of from greater than 0 nm to 50 nm, alternatively from 5 to 20 nm, alternatively from 5 to 10 nm, alternatively from 1 to 5 nm. The athermo-optical filler is different and distinct from the phosphor in at least one characteristic such as composition, size, loading level, (concentration in the material), melting temperature, and color.

In some aspects the phosphor(s) of the certain manufactured articles is/are at least one of a cerium-doped phosphor, an aluminate phosphor, a silicate phosphor, a garnet phosphor, and a nitride phosphor. Any one of the foregoing phosphors may be untreated, alternatively treated. Many phosphors are known in the art and readily adoptable herein, and are generally commercially available, e.g., from Intematix Corporation, Freemont, Calif., USA. Also contemplated are phosphors that will be discovered or developed in the future.

Examples of suitable particulate/nanoparticulate phosphors for use in of the certain manufactured articles include at least one of Ce:YAG; Nd:YAG; $Zn_2SiO4$:Mn (Willemite); ZnS:Ag+(Zn,Cd)S:Ag; ZnS:Ag+ZnS:Cu+$Y_2O_2$S:Eu; ZnO: Zn; KCl; ZnS:Ag,Cl or ZnS:Zn; $(KF,MgF_2)$:Mn; (Zn,Cd)S: Ag or (Zn,Cd)S:Cu; $Y_2O_2$S:Eu+$Fe_2O_3$, ZnS:Cu,Al; ZnS: Ag+Co-on-25 $Al_2O_3$; $(KF,MgF_2)$:Mn; (Zn,Cd)S:Cu,Cl; ZnS:Cu or ZnS:Cu,Ag; $MgF_2$:Mn; $(Zn,Mg)^F{}_2$:Mn; $Zn_2SiO_4$:Mn,As; ZnS:Ag+(Zn,Cd)S:Cu; $Gd_2O_2$S:Tb; $Y_2O_2$S:Tb; $Y_3Al_5O_{12}$:Ce; $Y_2SiO_5$:Ce; $Y_3Al_5O_{12}$:Tb; ZnS: Ag,Al; ZnS:Ag; ZnS:Cu,Al or ZnS:Cu,Au,Al; (Zn,Cd)S:Cu, Cl+(Zn,Cd)S:Ag,Cl; $Y_2SiO_5$:Tb; $Y_2OS$:Tb; $Y_2(Al,Ga)_5O_{12}$: Ce; $Y_3(Al,Ga)_5O_{12}$:Tb; $InBO_3$:Tb; $InBO_3$:Eu; 30 $InBO_3$: Tb+$InBO_3$:Eu; $InBO_3$:Tb+$InBO_3$:Eu+ZnS:Ag; (Ba,Eu) $Mg_2Al_{16}O_{27}$; (Ce,Tb)$MgAl_{11}O_{19}$:Eu,Mn; $BaMg_2Al_{16}O_{27}$:Eu(II); $BaMgAl_{10}O_{17}$:Eu,Mn; $BaMg_2Al_{16}O_{27}$:Eu(II),Mn(II); $Ce_{0.67}Tb_{0.33}MgAl_{11}O_{19}$:Ce, Tb; $Zn_2SiO_4$:Mn,$Sb_2O_3$; $CaSiO_3$:Pb,Mn; $CaWO_4$ (Scheelite); $CaWO_4$:Pb; $MgWO_4$; $(Sr,Eu,Ba,Ca)_5(PO_4)_3Cl$; $Sr_5Cl(PO_4)_3$:Eu(II); $(Ca,Sr,Ba)_3(PO_4)_2Cl_2$:Eu; $(Sr,Ca,Ba)_{10}(PO_4)_6Cl_2$:Eu; $Sr_2P_2O_7$:Sn(II); $Sr_6P_5BO_{20}$:Eu; $Ca_5F(PO_4)_3$:Sb; $(Ba,Ti)_2P_2O_7$:Ti; $3Sr_3(PO_4)_2.SrF_2$:Sb,Mn; $Sr_5F(PO_4)_3$:Sb,Mn; $Sr_5F(PO_4)_3$:5 Sb,Mn; $LaPO_4$:Ce,Tb; (La,Ce,Tb)$PO_4$; (La,Ce,Tb)$PO_4$:Ce,Tb; $Ca_3(PO_4)_2.CaF_2$:Ce,Mn; $(Ca,Zn,Mg)_3(PO_4)_2$:Sn; $(Zn,Sr)_3(PO_4)_2$:Mn; $(Sr,Mg)_3(PO_4)_2$:Sn; $(Sr,Mg)_3(PO_4)_2$:Sn(II); $Ca_5F(PO_4)_3$:Sb,Mn; $Ca_2(F,Cl)(PO_4)_3$:Sb,Mn; $(Y,Eu)_2O_3$; $Y_2O_3$:Eu(III); $Mg_2(F)GeO_6$:Mn; $Mg_4(F)(Ge,Sn)O_6$:Mn; $Y(P,V)O_4$:Eu; $YVO_4$:Eu; $Y_2O_2S$:Eu; 3.5 10 MgO.0.5 $MgF_2.GeO_2$:Mn; $Mg_5As_2O_{11}$:Mn; $SrAl_2O_7$:Pb; $LaMgAl_{11}O_{19}$:Ce; $LaPO_4$:Ce; $SrAl_{12}O_{19}$:Ce; $BaSi_2O_5$:Pb; $SrFB_2O_3$:Eu(II); $SrB_4O_7$:Eu; $Sr_2MgSi_2O_7$:Pb; $MgGa_2O_4$:Mn(II); $Gd_2O_2S$:Tb; $Gd_2O_2S$:Eu; $Gd_2O_2S$:Pr; $Gd_2O_2S$:Pr,Ce,F; $Y_2O_2S$:Tb; $Y_2O_2S$:Eu; $Y_2O_2S$:Pr; Zn(0.5)Cd(0.4)S:Ag; Zn(0.4)Cd(0.6)S:Ag; $CdWO_4$; $CaWO_4$; $MgWO_4$; $Y_2SiO_5$:Ce;$YAlO_3$:Ce; 15 $Y_3Al_5O_{12}$:Ce; $Y_3(Al,Ga)_5O_{12}$:Ce; CdS:In; ZnO:Ga; ZnO:Zn; (Zn,Cd)S: Cu,Al; ZnS:Cu,Al,Au; ZnCdS:Ag,Cu; ZnS:Ag; anthracene, EJ-212, $Zn_2SiO_4$:Mn; ZnS:Cu; NaI:Tl; CsI:Tl; LiF/ZnS:Ag; LiF/ZnSCu,Al,Au; and nitrides such as $LaAl(Si_6Al_3)N_7O_3$: $Ce^{3+}$; $Ca_{0.898}Ce_{0.068}Si_9Al_3ON_{15}$; $La_{4.9}Ce_{0.1}Si_3O_{12}N$; $La_{0.96}Ce_{0.04}SiO_2N$; $La_{2.82}Ce_{0.18}Si_8O_4N_{11}$; (Ca,Sr,Ba)$Si_2O_2N_2$:$Eu^{2+}$; 20 $(Sr,Ba)YSi_4N_7$:$Eu^{2+}$; $(Ca,Sr,Ba)_2Si_5N_8$:$Eu^{2+}$; and $(Sr,Ca)AlSiN_3$:$Eu^{2+}$. Any one of the foregoing phosphors may be untreated, alternatively treated (e.g., pretreated or in situ treated).

An untreated particulate filler is different and distinct from an untreated wavelength converter such as an untreated phosphor. In some aspects the smart optical material, or the optical device, contains an untreated wavelength converter such as an untreated phosphor, but does not contain any untreated particulate filler. It follows that a treated particulate filler is different and distinct from a treated wavelength converter such as a treated phosphor. The difference and distinctiveness may be any one or more of in functional group, reactive functional group, structure, molecular weight, or reactivity.

In the optical device any heat generating element or heat-and-light emitting element (as the case may be) may be used as long as it has or is used at the aforementioned operating temperature $T_Z$ of at least 80° C. and less than the maximum operating temperature of the smart optical material, e.g., <300° C., alternatively <250° C., alternatively <200° C. Examples of suitable heat generating elements or heat-and-light emitting elements (as the case may be) metal filaments or ribbons, ceramic heating elements, composite heating elements, metal heating elements (at low enough temperature), and semiconductor devices such as a light emitting diode. Examples of suitable heat-and-light emitting elements are a light emitting diode (LED) and an organic light emitting diode (OLED), which comprises an emissive layer that is an organic compound. Unless specified as an OLED, any LED described herein is composed of an emissive material that is inorganic. In some aspects the composite optical device contains at least one heat-and-light emitting element, alternatively at least one LED or OLED, alternatively at least one OLED, alternatively at least one LED. Different light emitting elements such as LED device chips operate at different temperatures, $T_Z$, which is the optical device's steady-state operating temperature. For LEDs, $T_Z$ typically spans from 80° to 200° C. In the future LEDs that operate above 200° C. may be developed and would be included within the present invention scope.

In the optical device, the smart optical material functioning as the smart optical encapsulant may be in direct physical contact with the heat-generating or heat-and-light generating element such as the LED chip. In some embodiments the smart optical material is also in light communication with a wavelength convertor such as a phosphor layer. In some embodiments the optical device comprises an LED device comprising a LED chip, the smart optical material, and a wavelength converter, wherein the smart optical material is disposed in direct contact with the wavelength converter.

Alternatively, the smart optical material may be spaced apart from the heat-generating or heat-and-light generating element such as the LED chip such as by a gap, such as an air gap, but still in thermal communication with said element, such as the LED chip. The gap may be filled with a gas, vapor, inert liquid such as a silicone fluid, or solid such as an optical polymer. Typically, the gap is filled with a gas such as air, nitrogen, argon, or helium. (e.g., an air gap or a gap filled with a non-smart optical material). In some embodiments the smart optical material is also in light communication with a wavelength convertor such as a phosphor layer. In such an embodiment of the optical device, the LED or LED chip may be in light communication with the wavelength converter but not with the smart optical material. Alternatively, the LED or LED chip may be in light communication with the smart optical material and with the wavelength converter via the smart optical material.

In any embodiment, the wavelength converter is in optical communication with the smart optical material in such a way that the smart optical material hides the wavelength converter when the smart optical encapsulant is at 30° C. or lower. Also, when the optical device is in its powered on-state, the wavelength converter responsively emits light and independently is in optical communication with the smart optical material. The optical device may further comprise a power generating unit for powering the heat-generating and/or heat-and-light generating element of the optical device in a lighting application such that the optical device is in its powered on-state. In some embodiments the optical device in its powered on-state may have an operating temperature, $T_Z$, of at least 80° C., alternatively at least 100° C., alternatively at least 120° C., alternatively at least 140° C.

In some aspects any one of the foregoing optical devices may be designed to illuminate an environment exterior thereto, such as a wall, ceiling, floor, outside space, interior space, or the like. In other aspects the optical device may be designed to use light internally within the optical device such as in embodiments wherein the optical device further contains a waveguide for transmitting light and/or a photodetector for sensing light.

When any one of the foregoing optical devices is powered on, any heat generating element or heat-and-light emitting element, such as the LED or LED chip, emits heat and the wavelength converter receives the emitted light at a first wavelength and responsively emits a light at a second wavelength that may be viewed through the smart optical material. Such devices are said to be in their powered "on-state." The optical device in its powered on-state has the aforementioned operating temperature $T_Z$ of at least 80° C.

When any one of the foregoing optical devices is powered off (and after cooling if previously powered on), the heat generating element or any heat-and-light emitting element, such as the LED or LED chip, does not emit heat and the wavelength converter is hidden from view by the smart optical material. Such devices are said to be in their unpowered "off-state." If the optical device had previously been in its powered on-state, then the wavelength converter is hidden from view by the smart optical material after the smart optical material has cooled to 30° C. or lower.

The following test methods may be used to characterize materials.

Cracking Resistance Test Method: fill half of a 25-gram glass vial with a test sample, cap the vial, and heat its contents to 120° C. After 3 hours apply a force to the top surface of the heated test sample by a single-pointed knitting needle of size 2 mm.

Elongation-at-Break Test Method: a test sample is prepared on two hot plates at 125° C. for 30 minutes with a pressure of 5 megapascals (MPa), then at 130° C. for 12 hours at atmospheric pressure (about 101 kilopascals). A dumbbell-like specimen is cut out of the test sample using a die (D1708, ½, Fremont), and the elongation-at-break of the test sample is measured using the dumbbell-like specimen and a texture analyzer instrument (TA.HDPlus Texture Analyser, Texture Technologies Corporation, New York, USA) at 23° C.±1° C. and a pull speed of 2 mm per second. Then the test sample is placed in a 200 C oven in air for 7 days with additional elongation-at-break measurements taken after 1, 2, 3, and 7 days.

Opaqueness Test Method 1: A wavelength converter comprising a phosphor layer comprising a solid film of 50 wt % neodymium-doped yttrium-aluminum-garnet (Nd-YAG) phosphor disposed in an elastomer composed of a PhMe resin linear organosiloxane of composition (PhMe $SiO_{2/2})_{0.52}(PhSiO_{3/2})_{0.42}$ (45 wt % Phenyl-T), which was prepared by the method of Example 12 of U.S. Pat. No. 8,921,493 B2 to Horstman, et al. Separately using a hydrosilylation curable formulation, a sample of the smart optical material having a silicone thermo-optical matrix was prepared as a 5.0 mm thick slab according to the method described later (e.g., in Examples (e4) and (f4) below) to give the sample of the smart optical material having a silicone thermo-optical matrix in the form of a slab having thickness of 5.0 mm. At 25° C., the Nd-YAG phosphor layer was placed underneath and in direct contact therewith (i.e., 0 mm gap) the sample slab, and the sample slab was inspected with an unaided human eye for the visibility of a yellow or orange color from the Nd-YAG phosphor layer therethrough. The sample slab was rated a "2 (visible yellow/orange)," "1 (slightly visible yellow/orange)," or "0 (invisible yellow/orange)."

Opaqueness Test Method 2: In a manner that is the same as Opaqueness Test Method 1 except the Nd-YAG phosphor layer that is placed underneath the sample slab is spaced apart from the sample slab by an air gap of 4 mm; and the sample slab is inspected at 25° C. as before with an unaided human eye for the visibility of a yellow color from the Nd-YAG phosphor layer therethrough. The sample slab is rated a "2 (visible yellow/orange)," "1 (slightly visible yellow/orange)," or "0 (invisible yellow/orange)."

The color of the light used in the Opaqueness Test Methods 1 and 2 is referred to herein as being yellow or orange. When the Opaqueness Test Method 1 or 2 is carried out using light at 588 nm, it is said to use yellow light. Similarly, the Opaqueness Test Method 1 or 2 is said to use orange light when it is carried out using light at 600 nm. In some embodiments, Opaqueness Test Methods 1 and 2 use light at 588 nm; in other embodiments Opaqueness Test Methods 1 and 2 use light at 600 nm; in other embodiments Opaqueness Test Method 1 uses light at 588 nm and Opaqueness Test Method 2 uses light at 600 nm; and in still other embodiments Opaqueness Test Method 1 uses light at 600 nm and Opaqueness Test Method 2 uses light at 588 nm.

For convenience, consistency and ease of comparisons, the smart optical material is characterized above and below in reference to yellow or orange light. This is done because it is convenient for Opaqueness Test Methods 1 and 2 to use a Nd:YAG phosphor, which is yellow or orange. The smart optical material, however, is not limited to being characterized by, or functioning with, phosphors or with yellow or orange light. That is, in other aspects, the smart optical material may be characterized by, and it may function for opaqueness at 25° C. and its substantial transparency at 80° C. or higher with, another color light in the visible light spectrum such as violet, blue, green, orange, or red. In such other aspects, a suitably different colored phosphor may be used in place of, or in addition to, the Nd:YAG phosphor in Opaqueness Test Methods 1 and/or 2. In still other aspects, a wavelength converter other than a phosphor may be used.

Particle Size Test Method and BET Surface Area Test Method: average particle size is measured using a JEOL JEM2100F transmission electron microscope (TEM) from JEOL USA, Peabody, Mass., USA and Brunauer-Emmett-Teller (BET) surface area using a Micromeritics Tristar II 3020 Surface Area Analyzer (Micromeritics Instrument Corporation, Norcross, Ga., USA).

Refractive Index Test Method: refractive index of a material was measured on a Prism coupler, Metricon 2010 (Metricon Company, Pennington, N.J. USA) with light at wavelength 633 nm using a film of the material.

Thermo-Optic Coefficient Test Method: thermo-optic coefficients, dn/dT, were determined on a spectral reflectance interferometer, Filmetrics F-20 (Filmetrics, San Diego, Calif., USA), using a temperature-controlled enclosed sample stage in a range of from 23° to 150° C.

Transmittance Test Method: Ultraviolet-visible (UV-Vis) spectra were obtained on a Perkin Elmer Lamda 950 UV/Vis NIR spectrometer with one temperature controllable set with cell (Transmission Spectroscopy Precision Heated Cell with both $CaF_2$ windows, Ventacon, United Kingdom) to set a temperature up to 200° C. Percent transmittance (T %) of samples (e.g., slabs) was measured at different temperatures by scanning in the wavelength ($\lambda$) range of 200 to 800 nm. Data may be reported for wavelength of 588 nm, 600, or 633 nm.

List of Materials:

Untreated fumed silica 1: CAB-O-SIL MS-75D fumed silica characterized by a refractive index, $n_{20/d}^F$, 1.4585; a dn/dT-1.2×10$^{-5}$/K; a BET surface area 255 square meter per gram (m$^2$/g); and an average primary particle size (diameter) of 10 nm.

Untreated fumed silica 2: fumed silica (Aldrich Chemical, S5130) characterized by a refractive index, $n_{20/d}^F$, 1.4583; a dn/dT-1.2×10$^{-5}$/K; a BET surface area 395 m$^2$/g; and an average primary particle size 7 nm.

Untreated fumed silica 3 (prophetic): fumed silica characterized by a refractive index, $n_{20/d}^F$, 1.4580 to 1.4589; a dn/dT-1.2×10$^{-5}$/K; and an average particle size (diameter) of 40 nm.

Matrix-forming precursor: liquid vinyl-terminated poly(phenyl,methyl)siloxane.

Matrix-forming precursor: dimethylhydrogen-terminated phenylsilsesquioxane.

Matrix-forming precursor: liquid vinyl-terminated poly(dimethyl-co-diphenyl)siloxane with a mean number average molecular weight ($M_n$) of 7,500 g/mol.

Matrix-forming precursor: vinyl-terminated poly(dimethyl-co-diphenyl)siloxane with a $M_n$ of 23,000 g/mol.

Matrix-forming precursor: dimethylhydrogen-terminated phenylsilsesquioxane.

Matrix-forming precursor: vinyl-terminated phenylsilsesquioxane.

Matrix-forming precursor: vinyl-terminated poly(phenyl,methyl)siloxane.

Filler treating agent: hydroxy-terminated poly(phenyl,methyl)siloxane.

Filler treating agent: hydroxy-terminated poly(dimethyl-co-methyl,vinyl)siloxane.

Filler treating agent: hexamethyldisilazane.

Hydrosilylation catalyst: Karstedt's catalyst (Pt[$H_2C=CH-Si(CH_3)_2]_2O$).

Preparation 1: preparation of a liquid matrix-forming precursor number (LMP1). In a dental mixer was mixed liquid vinyl-terminated poly(phenyl,methyl)siloxane (100 parts) and dimethylhydrogen-terminated phenylsilsesquioxane (10.7 parts) at room temperature for 1 minute to give the LMP1 as a transparent liquid. The LMP1 had refractive index, $n_{23/q}^F$, 1.5390 and dn/dT-3.4×10$^{-4}$/K.

Preparation 2: preparation of a liquid matrix-forming precursor number 2 (LMP2). In a dental mixer was mixed liquid vinyl-terminated poly(dimethyl-co-diphenyl)siloxane with a mean number average molecular weight Mn of 7,500 g/mol (40.5 parts), vinyl-terminated poly(dimethyl-co-diphenyl)siloxane with a mean number average molecular weight Mn of 23,000 g/mol (40 parts), dimethylhydrogen-terminated phenylsilsesquioxane (12.6 parts), and vinyl-terminated phenylsilsesquioxane (6.9 parts) at room temperature for 1 minute to give the LMP2 as a transparent liquid. The LMP2 had refractive index, $n_{23/q}^F$, 1.4859 and dn/dT-3.8×10$^{-4}$/K.

Preparation 3: preparation of a liquid matrix-forming precursor number 3 (LMP3). In a dental mixer was mixed liquid vinyl-terminated poly(dimethyl-co-diphenyl)siloxane with a mean number average molecular weight Mn of 23,000 g/mol (69.1 parts), dimethylhydrogen-terminated polydiphenylsiloxane (13.8 parts), vinyl-terminated phenylsilsesquioxane (13.6 parts), and tetra(dimethylvinylsiloxane)silane (3.5 parts) at room temperature for 1 minute to give the LMP3 as a transparent liquid. The LMP3 had refractive index, $n_{23/q}^F$, 1.4965 and dn/dT-3.7×10$^{-4}$/K.

Preparation A: preparation of an in situ treated silica masterbatch of a paste of 26.8 wt % treated fumed silica in organosiloxane fluid. In a 1-quart (950 milliliter (mL)) kneader mixer was added untreated fumed silica 1 (135 grams (g)), vinyl-terminated poly(phenyl,methyl)siloxane (331 g, 65.9 wt %), hydroxy-terminated poly(phenyl,methyl)siloxane (33 g, 6.7 wt %), hydroxy-terminated poly(dimethyl-co-methyl,vinyl)siloxane (2.5 g, 0.5%), and hexamethyldisilazane (0.5 g, 0.1 wt %), and mixed, and then heated at about 160° C. for 1.5 hours to give about 503 g of the masterbatch of the in situ treated fumed silica as a white, opaque paste. The masterbatch treated fumed silica had refractive index, $n_{23/q}^F$, 1.5329 and dn/dT-2.5×10$^{-4}$/K.

Preparation B (prophetic): preparation of an in situ treated silica masterbatch of a paste of 25 wt % treated fumed silica in organosiloxane fluid. In a 1-quart (950 milliliter (mL)) kneader mixer is added untreated fumed silica 3 (135 g), vinyl-terminated poly(phenyl,methyl)siloxane (330 g, 66 wt %), hydroxy-terminated poly(phenyl,methyl)siloxane (33 g, 7 wt %), hydroxy-terminated poly(dimethyl-co-methyl,vinyl)siloxane (2.5 g, 0.5%), and hexamethyldisilazane (0.5 g, 0.1 wt %), and are mixed, and then heated at about 160° C.) for 1.5 hours to give about 500 g of the in situ treated fumed silica masterbatch as a white, opaque paste.

The following comparative samples (non-invention) are intended to illustrate certain deficiencies of non-invention compositions. They are not to be interpreted as being prior art.

Comparative Formulations ce(a), ce(b), and ce1 to ce4: preparation of comparative hydrosilylation curable formulations ce(a), ce(b), and ce1 to ce4, respectively. The preparations of Comparative Formulations ce(a) and ce(b) did not include or use any silica, and so Comparative Formulations ce(a) and ce(b) lacked (were free of) any silica. For Comparative Formulations ce1 to ce4, varying portions of the untreated fumed silica 2 and portions of the LMP2 of Preparation 2 were mixed together using a dental mixer in the presence of 2.5 parts per million (ppm) of Pt of Karstedt's catalyst (Pt[$H_2C=CH-Si(CH_3)_2]_2O$) at room temperature for 15 minutes to give the Comparative Formulations ce(a), ce(b), and ce2 to ce4. The compositions of Comparative Formulations ce(a), cd(b), and ce1 to ce4 are described later in Table A. (Mixing for 90 minutes instead of the 15 minutes is not expected to result in any significant change.)

Comparative Films (CEA-f), (CEB-f), and (CE1-f) to (CE4-f): preparation of Comparative Films (CEA-f), (CEB-f), and CE1-f to CE4-f from Comparative Formulations ce(a), ce(b), and ce1 to ce4, respectively. Portions of the Comparative Formulations ce(a), ce(b), and ce1 to ce4 in toluene (1/1 wt/wt ratio) were spin coated onto different silicon wafers and heated at 130° C. for 3 hours and allowed to cool to give samples CEA, CEB, CE1 to CE4, respectively, of Comparative Examples of non-inventive cured materials in the form of thin films designated (CEA-f), (CEB-f), and CE1-f to CE4-f, respectively, having thicknesses of from 2 to 15 μm. $n_{23/q}$ at 633 nm for each of Comparative Films (CEA-f), (CEB-f), and (CE1-f) to (CE4-f) were determined using the Refractive Index Test Method and are reported below in Table A. The films of the comparative formulations are expected to have the same $n_{23/q}$ at 633 nm as cured films of prepared by curing same.

TABLE A

Non-Invention Film $n_{23/q}$ at λ 633 nm at 23° C.

| Film Ex. | Form. Ex. | Untreated Fumed Silica* Content (wt %) | $n_{23/q}$ |
|---|---|---|---|
| (CEA-f) | ce(a) | 0.00 | 1.5390 |
| (CEB-f) | ce(b) | 0.00 | 1.4859 |
| (CE1-f) | ce1 | 4.0 | 1.4848 |
| (CE2-f) | ce2 | 6.6 | 1.4840 |
| (CE3-f) | ce3 | 9.1 | 1.4831 |
| (CE4-f) | ce4 | 13.4 | 1.4824 |

*untreated fumed silica surface area 395 m²/g, average primary particle size (diameter) of 7 nm.

As shown above in Table A, most of the comparative formulations and the comparative films prepared therefrom have $n_{23/q}$ at A 633 nm of from 1.4824 to 1.4859 and one $n_{23/q}$ is at 1.5390.

Comparative Examples (CEA-s), (CEB-s), (CE1-s) to (CE4-s): preparation of sample slabs from Comparative Formulations ce(a), ce(b), and ce1 to ce4, respectively. Portions of the Comparative Formulations ce(a), ce(b), and ce1 to ce4 were cured on a hot press machine at 125° C. for 5 minutes, then post-cured at 130° C. for 30 minutes, and then allowed to cool to room temperature to give samples CEA, CEB, CE1 to CE4, respectively, of non-inventive cured materials of Comparative Examples in the form of slabs designated (CEA-s), (CEB-s), (CE1-s) to (CE4-s), respectively, in the form of slabs independently having thicknesses of 1.65 mm. T % at 600 nm for each of Comparative Slabs (CEA-s, (CEB-s), and (CE1-s) to (CE4-s) were determined using the Transmittance Test Method and are reported below in Table B.

TABLE B

Non-Invention Slab Percent transmittance (T %) at λ 600 nm at Temperatures (i) to (vi): (i) 25° C. (ii) 80° C. (iii) 100° C. (iv) 125° C. (v) 150° C. (vi) 200° C.

| Slab Ex. | Form. Ex. | Untreated Fumed Silica* Content (wt %) | (i) T % | (ii) T % | (iii) T % | (iv) T % | (v) T % | (vi) T % |
|---|---|---|---|---|---|---|---|---|
| (CEA-s) | ce(a) | 0.00 | 90 | 89 | 89 | 90 | 87 | 88 |
| (CEB-s) | ce(b) | 0.00 | 94 | 93 | 93 | 93 | 93 | 93 |
| (CE1-s) | ce1 | 4.0 | 78 | 87 | 81 | 81 | 76 | 62 |
| (CE2-s) | ce2 | 6.6 | 76 | 88 | 85 | 82 | 75 | 59 |
| (CE3-s) | ce3 | 9.1 | 77 | 89 | 82 | 76 | 69 | 47 |
| (CE4-s) | ce4 | 13.4 | 74 | 87 | 84 | 80 | 71 | 49 |

*untreated fumed silica surface area 395 m²/g, average primary particle size of 7 nm.

As shown above in Table B, the comparative formulations and the comparative films prepared therefrom are not useful for making a smart optical material because the starting T % at 25° C. of the comparative films is greater than 70%, making it problematic for them to hide a yellow or orange phosphor when they are at 30° C. or lower. Also, the comparative formulations are deficient because their T % at 125° C. and above are no higher than, and in some instances are lower than, the T % of the comparative films at 25° C., which means the clarity of the comparative formulations does not increase with increasing temperature. That is, the transmittance of the comparative formulations at elevated temperature is essentially no better or is worse than the transmittance at room temperature. Thus, the comparative formulations cannot hide a yellow or orange phosphor in optical devices in their unpowered off-states and cannot increase light output or light transmittance efficiency of optical devices in their powered on-states. Comparative Examples (CE1-s) to (CE4-s) failed because T % at 25° C. were much higher than 50%, e.g., greater than or equal to 74%, and therefore materials ce1 to ce4 would not be capable of hiding an Nd:YAG phosphor at that temperature. This failure was due to the untreated filler used in ce1 to ce4 having an average particle size less than 8 nm. The failure for (CE1-s) was also due to loading of filler below 5 wt %. The cured materials CE1 to CE4 would also be expected to have poor elongation-at-break before thermal aging and/or after thermal aging according to the method described herein as shown later for CE1 in Table 4.

Therefore, in contrast to the smart optical material, if a conventional (not smart) optical encapsulant (with matched refractive indices) would be used in place of the smart optical material in a comparative (non-invention) optical device in its unpowered off-state, and its phosphor would be exposed to ambient light, such as sunlight or non-specific artificial light, the phosphor would be visible and appear to be colored, the exact color depending on the particular phosphor used. In such an ambient light condition, for example, an yttrium aluminum garnet (YAG) would absorb certain first wavelengths of the ambient light and responsively emit light at certain second wavelengths (in the range of 570 to 590 nm or 600 nm), appearing to be yellow when exposed to ambient light. Other phosphors may appear to be another color such as red, blue, green, cyan, or magenta. These colors may not be aesthetically pleasing, especially if the comparative optical device is a replacement for an off-state white lamp, such as a fluorescent lamp, or if the comparative optical device is intended for use in a location having a color palette that conflicts with these colors, such as against a wood cabinet or white wall. The present smart optical material solves this problem by being opaque at 25° C. and substantially light transmitting at $T_Z$.

Further, when such a comparative optical device would be powered and in its on-state, the conventional encapsulant would cause a decrease of light output therefrom or light transmittance efficiency thereof. This is because upon heating the conventional encapsulant up from 23° C. to $T_Z$, the matched refractive indexes, $n_{23/q}$, of the comparative matrix and optical filler would likely diverge from each other such that they become significantly different (mismatched) at an elevated operating temperature, $T_Z$. The mismatch would result in the heated conventional encapsulant scattering and reflecting light at $T_Z$ and reducing the light output or light transmittance efficiency of the comparative optical device. The present smart optical material solves this problem by transmitting substantially more (>50% more) light at $T_Z$ than at 25° C. (e.g., T %=40% at 25° C. vs. T %≥70% at $T_Z$).

If a comparative (non-inventive) covering material contains only a thermo-optical matrix or comprising the a thermo-optical matrix and a filler that is 100% untreated filler, we would expect the elongation-at-break of the thermally aged covering material would decrease over seven days by more than 50%, alternatively by more than 55%, and eventually crack, tear or both when or shortly after it receives the external mechanical force. For example, this disadvantage of the comparative covering material may be demonstrated by elongation-at-break testing with the material heated in air at 200° C. for 7 days, wherein the elongation-at-break before thermal aging at day 0 is about 29% and the elongation-at-break after thermal aging for 7 days (day 7) is 12%, a decrease of 58%. When a covering material's elongation-at-break has decreased more than 50%, alternatively more than 55%, after thermal aging for 7 days at 200° C. in air, the covering material could easily become too brittle to withstand mechanical forces received by an optical device having an on-state operating temperature greater than or equal to 200° C. This means the comparative covering material is significantly more likely to crack and yellow, and thereby expose environmentally sensitive components of the optical device to molecular oxygen, water vapor, and other harmful materials, which would decrease the operating lifetime of the optical device.

Therefore, the present smart optical material by virtue of its tuned design solves a number of problems and has a number of benefits and advantages relative to a conventional (not smart) encapsulant material. According to the Opaqueness Test Method 1 or 2, the smart optical material covers or hides wavelength converters such as phosphors or phosphor layers when in unpowered off-state optical devices containing same and also increases light output from or light transmittance efficiency of such optical devices when in their powered on-states. In addition to its "smart" optical property, the smart optical material achieves good mechanical performance sufficient to prevent cracking of thereof if it, or the optical device in which it is disposed, receives an external mechanical force such as vibrations or impact.

The following examples are intended to illustrate the invention and are not to be viewed in any way as limiting to the scope of the invention. Parts are parts by weight based on total weight unless otherwise indicated.

Examples 1 to 5: Preparation of Hydrosilylation Curable Formulations 1 to 5, Respectively Varying proportions of the treated fumed silica masterbatch of Preparation A and portions of the LMP1 of Preparation 1 were mixed together using a dental mixer in the presence of 2.5 parts per million (ppm) of Karstedt's catalyst $(Pt[H_2C=CH-Si(CH_3)_2]_2O)$ at room temperature for 2 minutes to give the hydrosilylation curable formulations 1 to 5, respectively. The formulations were useful for making examples of smart optical materials having silicone thermo-optical matrices. The compositions of formulations Examples 1 to 5 are described later in Table 1.

Example 6: Preparation of Hydrosilylation Curable Formulation 6

A mixture of two thirds (67 wt %) of the treated fumed silica masterbatch of Preparation A and one third (33 wt %) of untreated fumed silica 1, based on total weight of the mixture, and a portion of the LMP2 of Preparation 2 were mixed together using a dental mixer in the presence of 2.5 parts per million (ppm) of Karstedt's catalyst (Pt $[H_2C=CH-Si(CH_3)_2]_2O)$ at room temperature for 15 minutes to give the hydrosilylation curable formulation 6. The formulation 6 was useful for making examples of smart optical materials having silicone thermo-optical matrices. The composition of formulation 6 of Example 6 is described later in Table 1.

Examples 7 to 10 (Prophetic): Preparation of Hydrosilylation Curable Formulations 7 to 10

Varying proportions of the treated fumed silica masterbatch of Preparation B and a portion of the LMP3 of Preparation 3 are mixed together using a dental mixer in the presence of 2.5 parts per million (ppm) of Karstedt's catalyst $(Pt[H_2C=CH-Si(CH_3)_2]_2O)$ at room temperature for 15 minutes to give the hydrosilylation curable formulations 7 to 10 containing 6.0 wt %, 10 wt %, 20 wt %, and 25 wt % of masterbatch treated fumed silica, respectively, all based on total weight of the hydrosilylation curable formulations 7 to 10. The formulations 7 to 10 are useful for making examples of smart optical materials having silicone thermo-optical matrices.

Examples (A1) to (F1): Preparation of Sample Films of the Hydrosilylation Curable Formulations of Examples 1 to 6, Respectively Portions of the hydrosilylation curable formulations of Examples 1 to 6, respectively, in toluene (1/1 wt/wt) were spin coated on silicon wafers and heated at 130° C. for 3 hours to give films of Examples (A1) to (F1), respectively, having a thickness of from 2 to 15 μm. The $n_{23/q}$ values at A 633 nm for each of Examples (A1) to (F1) were determined using the Refractive Index Test Method and are reported below in Table 1. The curable formulations of Examples 1 to 6 are believed to be useful for making examples of smart optical materials having silicone thermo-optical matrices.

TABLE 1

| Inventive Film $n_{23/q}$ at λ 633 nm | | | |
|---|---|---|---|
| Film Ex. | Form. Ex. | Preparation A Content (wt %) | $n_{23/q}$ |
| (A1) | 1 | 5.9 | 1.5343 |
| (B1) | 2 | 10.1 | 1.5310 |
| (C1) | 3 | 15.0 | 1.5369 |
| (D1) | 4 | 20.2 | 1.5289 |
| (E1) | 5 | 24.2 | 1.5227 |
| (F1) | 6 | 32.5 | 1.5194 |

As shown above in Table 1, the inventive curable formulations and the inventive silicone smart optical materials prepared therefrom have $n_{23/q}$ at A 633 nm of from 1.5194 to 1.5369.

Examples (a1) to (f1): Preparation of Sample Slabs of Smart Optical Materials Having Silicone Thermo-Optical Matrices from the Hydrosilylation Curable Formulations of Examples 1 to 6, Respectively Portions of the hydrosilylation curable formulations of Examples 1 to 6, respectively, were cured on a hot press machine at 125° C. for 5 minutes, then post-cured at 130° C. for 30 minutes, and then allowed to cool to room temperature to give smart optical materials having silicone thermo-optical matrices of Examples (a1) to (f1), respectively, in the form of slabs independently having thicknesses of 1.65 mm. T % at 600 nm for each of slabs were determined using the Transmittance Test Method and are reported below in Table 2.

TABLE 2

Inventive Slab Percent transmittance (T %) at λ 600 nm at Temperatures (i) to (vi): (i) 25° C. (ii) 80° C. (iii) 100° C. (iv) 125° C. (v) 150° C. (vi) 200° C.

| Slab Ex. | Form. Ex. | Preparation A Content (wt %) | (i) T % | (ii) T % | (iii) T % | (iv) T % | (v) T % | (vi) T % |
|---|---|---|---|---|---|---|---|---|
| (a1) | 1 | 5.9 | 42 | 57 | 61 | 69 | 73 | 81 |
| (b1) | 2 | 10.1 | 34 | 50 | 56 | 63 | 69 | 79 |
| (c1) | 3 | 15.0 | 30 | 47 | 53 | 60 | 65 | 78 |
| (d1) | 4 | 20.2 | 35 | 48 | 54 | 62 | 66 | 75 |
| (e1) | 5 | 24.2 | 47 | 58 | 60 | 65 | 69 | 74 |
| (f1) | 6 | 32.5 | 29 | 54 | 69 | 79 | 84 | 71 |

As may be seen with the data in Table 2, the slabs of the hydrosilylation curable formulations of Examples 1 to 6 had varying athermo-optical filler (treated fumed silica masterbatch, Preparation A) content from 5.9 wt % to 32.5 wt %. and yet all had T % at 600 nm of less than 50% at 25° C. and all had T % greater than 70% at 200° C. and all had T % at 600 nm of greater than or equal to 60% at 125° C. The inventive formulations are useful for making examples of smart optical materials having silicone thermo-optical matrices because the starting T % at 25° C. is less than 50%, making it possible for the inventive formulations to prepare smart optical materials capable of hiding a yellow or orange phosphor when the inventive formulations are at 30° C. or lower. Also, the inventive formulations are beneficial because the T % at 100° C. or higher are substantially better than, and in some instances are more than 50% greater than, the T % at 25° C., which means the clarity of the inventive formulations and slabs advantageously increases with increasing temperature. Thus, the inventive formulations can both hide a yellow or orange phosphor in optical devices in their unpowered off-states and increase light output or light transmittance efficiency of optical devices in their powered on-states.

Examples (e2) to (e4) and (f2) to (f4)

In a manner similar to the method of Examples (e1) and (f1), respectively, except varying slab thickness, slabs having thicknesses of 1.65 mm, 3.30 mm, and 5.00 mm were prepared using the hydrosilylation curable formulation of Example 5 to give smart optical materials having silicone thermo-optical matrices of Examples (e2) to (e4), respectively, and using the hydrosilylation curable formulation of Example 6 to give smart optical materials having silicone thermo-optical matrices of Examples (f2) to (f4), respectively. Some of the slabs of Examples (e2) to (e4) and (f2) to (f4) were tested for opaqueness according to at least one of a number of methods that included Opaqueness Test Methods 1 and 2. Some of the slabs were tested for opaqueness using non-limiting modified versions of Opaqueness Test Method 2 wherein an air gap of 1 mm, 2 mm, or 3 mm was used in place of the air gap of 4 mm of Opaqueness Test Method 2. The 5.0 mm thick slabs of Examples (e4) and (f4) were opaque and rated "0 (invisible yellow/orange)" at room temperature according to the Opaqueness Test Method 1. The 3.30 mm thick slab of Example (e3) was opaque and rated "0 (invisible yellow/orange)" at room temperature according to the Opaqueness Test Method 2. The 1.65 mm thick slab of Example (f2) was opaque and rated "0 (invisible yellow/orange)" at room temperature according to the Opaqueness Test Method 2. Even though the opaqueness data obtained with air gaps of 1 mm, 2 mm or 3 mm using the modified versions of Opaqueness Test Method 2 are non-limiting, for completeness all these data are reported later in Table 3.

TABLE 3

Opaqueness to Nd-YAG yellow light at 25° C.

| Sample No. | Sample thickness (mm) | T % at 600 nm | Air Gap distance (mm) | Opaqueness Rating* |
|---|---|---|---|---|
| (e2) | 1.65 | 47.24 | 0 | 2 |
|  |  |  | 4 | 1 |
| (e3) | 3.30 | 25.45 | 0 | 1 |
|  |  |  | 1 | 1 |
|  |  |  | 4 | 0 |
| (e4) | 5.00 | 13.26 | 0 | 0 |
| (f2) | 1.65 | 29.22 | 0 | 2 |
|  |  |  | 2 | 2 |
|  |  |  | 3 | 1 |
|  |  |  | 4 | 0 |
| (f3) | 3.30 | 10.65 | 0 | 1 |
| (f4) | 5.00 | 3.17 | 0 | 0 |

*"2 (visible yellow/orange)," "1 (slightly visible yellow/orange)," "0 (invisible yellow/orange).

As shown in Table 3, the inventive formulations are useful for making examples of smart optical materials having silicone thermo-optical matrices because they can be configured with an Nd:YAG phosphor layer to hide the yellow Nd:YAG phosphor when the inventive formulations are at 30° C. or lower. Also, the inventive formulations are beneficial because based on the data for Examples (E1) and (F1) in Table 2, at 100° C. or higher their T % increases substantially and in some instances are more than 50% greater than, the T % at 25° C. As mentioned, this latter point means the clarity of the smart optical material advantageously increases with increasing temperature. Thus, the smart optical material can both hide a yellow phosphor or yellow phosphor layer such as the Nd:YAG phosphor layer in optical devices in their unpowered off-states and increase light output or light transmittance efficiency of optical devices in their powered on-states.

Elongation-at-break: test samples of the hydrosilylation curable formulations of Examples 2 to 5, respectively, were prepared according to the above procedure for preparation of elongation-at-break test samples. Elongation-at-break of the test samples were determined before thermal aging (Day 0) and after thermal aging in air at 200° C. for 1, 2, 3, and 7 days using the Elongation-at-Break Test Method. The results are depicted graphically in FIG. 1. Elongation-at-break data for Day 0 and Day 7, and the percent decrease from Day 0 to Day 7, are reported below in Table 4.

TABLE 4

Elongation-at-break before thermal aging (Day 0) and after thermal aging in air at 200° C. for 7 days

| Material Example No. | Day 0 Elongation at Break (%) | Day 7 Elongation at Break (%) | Change from Day 0 to Day 7 (%) |
|---|---|---|---|
| CE1 | 29 | 12 | 58 |
| Ex. 1 | 34 | 26 | 24 |

TABLE 4-continued

Elongation-at-break before thermal aging (Day 0) and
after thermal aging in air at 200° C. for 7 days

| Material Example No. | Day 0 Elongation at Break (%) | Day 7 Elongation at Break (%) | Change from Day 0 to Day 7 (%) |
|---|---|---|---|
| Ex. 2 | 32 | 24 | 26 |
| Ex. 3 | 23 | 18 | 22 |
| Ex. 4 | 22 | 15 | 32 |
| Ex. 5 | 23 | 12 | 48 |

As shown in FIG. 1 and Table 4, the inventive formulations are useful making examples of smart optical materials having silicone thermo-optical matrices because they have enhanced mechanical properties as measured by elongation-at-break. The elongation-at-break of the thermally aged smart optical material examples over seven days of thermal aging at 200° C. has decreased by from 22% to 48%, and in all but one of the examples by less than 33%, in most examples by less than 27%. This means the thermally aged smart optical material is unlikely to eventually crack, tear or both when or shortly after it receives the external mechanical force, and is more likely to achieve an advantageously long operating lifetime. In contrast the elongation-at-break of the thermally aged comparative material decreases over seven days of thermal aging at 200° C. by more than 55%.

The below claims are incorporated by reference here, and the terms "claim" and "claims" are replaced by the term "aspect" or "aspects," respectively. Embodiments of the invention also include these resulting numbered aspects.

The invention claimed is:

1. An optical device that is configured with a smart optical material that is opaque according to the Opaqueness Test Method 1 at a temperature less than 30 degrees Celsius (° C.) and optically transparent at a temperature of from 80° to 200° C. and the smart optical material has an elongation-at-break, according to the Elongation-at-Break Test Method, before thermal aging at day 0 of at least 15% and after thermal aging in air at 200° C. for 7 days at day 7 of at least 12% and the elongation-at-break of the thermally aged smart optical material would decrease from day 0 to day 7 by less than 50%; the device comprising a light emitting element; a heat generating element, which may be the same as or different than the light emitting element and which is in thermal communication with the smart optical material; a wavelength converter in independent optical communication with the light emitting element and the smart optical material; and the smart optical material, which hides the wavelength converter when the smart optical material is at a temperature less than 30° C. and transmits light from the light emitting element and/or from the wavelength converter when the smart optical material is at a temperature from 80° to 200° C.

2. The optical device of claim 1 wherein the optical device comprises a wavelength converter comprising at least one wavelength converting element or a wavelength converting layer comprising a plurality of wavelength converting elements.

3. The optical device of claim 1 wherein the wavelength converter comprises a phosphor or a phosphor layer comprising a plurality of phosphors.

4. The optical device of claim 1 wherein the light emitting element is a light emitting diode (LED).

5. The optical device of claim 1 further comprising a power supply and thereby having an unpowered off-state and a powered on-state such that in the powered on-state the smart optical material is heated to a temperature of from 80° to 200° C.

6. A method of blocking and/or transmitting light using the optical device of claim 1, the method comprising:
Exposing the optical device to visible light when the smart optical material is at a temperature of from −40° to 30° C. such that the smart optical material blocks enough visible light from reaching the wavelength converter and/or blocks enough converted light from the wavelength converter from exiting the optical device so as to hide the wavelength converter; or
Powering the optical device when the smart optical material is at a temperature of at least 80° C. such that the light emitting element is emitting light at a first wavelength, which is then transmitted to the wavelength converter, which responsively emits a light at a second wavelength, which is transmitted through at least a portion of the smart optical material to a light receiver, wherein the first wavelength is different than the second wavelength; or
Performing both the exposing and powering steps at different times.

7. A smart optical material as described in claim 1.

8. The smart optical material of claim 7 comprising a first composition of a thermo-optical matrix and a second composition of an athermo-optical filler as a finely divided solid particulate that is dispersed in the thermo-optical matrix at a loading of from >5 to 40 weight percent (wt %) based on total weight of the smart optical material; wherein the athermo-optical filler is a treated particulate filler that has been prepared by treating an untreated particulate filler with a filler treating agent, wherein the athermo-optical filler has an average particle size (diameter) of from >8 nm to 500 nm, with the proviso that when the athermo-optical filler comprises treated silica, it is at least 50% equivalent of a treated precipitated silica or a treated fumed silica; wherein the first composition of the thermo-optical matrix has a thermo-optic coefficient, $(dn/dT)^M$, and the second composition of the athermo-optical filler has a thermo-optic coefficient, $(dn/dT)^F$, and the first and second compositions are mismatched such that the ratio $(dn/dT)^M/(dn/dT)^F$ is from >2 to 20; and wherein the first composition of the thermo-optical matrix has at 23 degrees Celsius (° C.) using light at 633 nm a refractive index, $n_{23/q}^M$, and the second composition of the athermo-optical filler has at 23° C. using light at 633 nm a refractive index, $n_{23/q}^F$, and the first and second compositions are mismatched such that $n_{23/q}^M - n_{23/q}^F \geq 0.020$ and the ratio $n_{23/q}^M/n_{23/q}^F$ is from 1.009 to 1.094; and therefore for the second composition of the athermo-optical filler having known values of $n_{23/q}^F$ and $(dn/dT)F$, the first composition of the thermo-optical matrix is formulated to have a mismatched value for $n_{23/q}^M$ having a predetermined difference greater than $n_{23/q}^F$ such that when a test sample of the smart optical material is at 25° C. and has a thickness of 5.0 millimeters (mm), the smart optical material is opaque to light at wavelength 600 nanometers (nm) according to the Opaqueness Test Method 1 and when the test sample of the smart optical material is at an elevated temperature, $T_Z$, of 80° to 200° C., the thermo-optical matrix has a refractive index, $n_{z/q}^M$, and the athermo-optical filler has a refractive index, $n_{z/q}^F$, and $n_{z/q}^M$ and $n_{z/q}^F$ are matched such that the ratio $n_{z/q}^M/n_{z/q}^F$ is 1.000±0.008 and the smart optical material is optically transparent to light at wavelength 600 nm; and with the proviso that the smart optical material does not contain an untreated silica.

9. The smart optical material of claim 8:
wherein the thermo-optical matrix comprises an organic polymer having $n_{23/q}^{M}$ of 1.470 to 1.54 and the athermo-optical filler comprises a treated precipitated or treated fumed silica having $n_{23/q}^{F}$ of 1.450 to 1.465 and an average particle size from 8.5 to 300 nm; or
wherein the thermo-optical matrix comprises a poly(vinyl acetate) having $n_{23/q}^{M}$ of 1.470 to 1.54 and the athermo-optical filler comprises a treated precipitated silica or a treated fumed silica having $n_{23/q}^{F}$ of 1.450 to 1.465 and an average particle size from 8.5 to 300 nm.

10. The smart optical material of claim 8:
wherein the thermo-optical matrix is a Si-aryl and Si-alkyl functional poly(organosiloxane) that has $n_{23/q}^{M}$ of 1.475 to 1.55; or
wherein the athermo-optical filler comprises a treated precipitated silica or a treated fumed silica having $n_{23/q}^{F}$ of 1.450 to 1.465 and an average particle size from 8.5 to 300 nm; or
wherein the loading of athermo-optical filler is from >5 to 35 wt % based on total weight of the smart optical material;
wherein the ratio $n_{23/q}^{M}/n_{23/q}^{F}$ is from 1.010 to 1.090; or
wherein the ratio $(dn/dT)^{M}/(dn/dT)^{F}$ is from >2 to 20; or
wherein $T_Z$ is from 100° to 200° C.; or
wherein the thermo-optical matrix is a Si-aryl and Si-alkyl functional poly(organosiloxane) that has $n_{23/q}^{M}$ of 1.475 to 1.55; the athermo-optical filler comprises a treated precipitated silica or a treated fumed silica having $n_{23/q}^{F}$ of 1.450 to 1.465 and an average particle size from greater than 8.5 to 300 nm; the loading of from >5 to 35 wt % based on total weight of the smart optical material; the ratio $n_{23/q}^{M}/n_{23/q}^{F}$ is from 1.010 to 1.090; the ratio $(dn/dT)^{M}/(dn/dT)^{F}$ is from >2 to 20; and $T_Z$ is from 100° to 200° C.

11. The smart optical material of claim 10 wherein the Si-aryl and Si-alkyl functional poly(organosiloxane) of the thermo-optical matrix is represented by the general formula (I): $R_n Si_{(4-n)/2}$ (I), wherein subscript n is 1 or 2 and each R independently is $(C_6-C_{12})$aryl or $(C_1-C_{12})$alkyl, with the proviso that at least some R is the $(C_6-C_{12})$aryl and at least some R is the $(C_1-C_{12})$alkyl.

12. The smart optical material of claim 10:
wherein the thermo-optical matrix is a Si-phenyl and Si-methyl functional poly(organosiloxane) that has $n_{23/q}^{M}$ of 1.475 to 1.54 and $(dn/dT)^{M}$ is from $-2.5 \times 10^{-4}$/Kelvin to $-5 \times 10^{-4}$/Kelvin; or
wherein the athermo-optical filler comprises a treated fumed silica having $n_{23/q}^{F}$ of 1.450 to 1.465, an average particle size from 9 to 300 nm, and $(dn/dT)^{F}$ of from $-1.5 \times 10^{-5}$/Kelvin to $+1.5 \times 10^{-5}$/Kelvin; or
wherein the loading of athermo-optical filler is from >5 to 30 wt % based on total weight of the smart optical material; or
wherein the ratio $n_{23/q}^{M}/n_{23/q}^{F}$ is from 1.020 to 1.050; or
wherein the ratio $(dn/dT)^{M}/(dn/dT)^{F}$ is from >2 to 10; or
wherein $T_Z$ is from 120° to 200° C.; or
wherein the thermo-optical matrix is a Si-phenyl and Si-methyl functional poly(organosiloxane) that has $n_{23/q}^{M}$ of 1.475 to 1.54 and $(dn/dT)^{M}$ of from $-2.5 \times 10^{-4}$/Kelvin to $-5 \times 10^{-4}$/Kelvin; the athermo-optical filler comprises a treated fumed silica having $n_{23/q}^{F}$ of 1.450 to 1.465, an average particle size from 9 to 300 nm, and $(dn/dT)^{F}$ of from $0.5 \times 10^{-5}$/Kelvin to $2 \times 10^{-5}$/Kelvin; the loading of from >5 to 30 wt % based on total weight of the smart optical material; the ratio $n_{23/q}^{M}/n_{23/q}^{F}$ is from 1.020 to 1.050; the ratio $(dn/dT)^{M}/(dn/dT)^{F}$ is from >2 to 10; and $T_Z$ is from 120° to 200° C.

13. The smart optical material of claim 10 comprising a reaction product of hydrosilylation curing a curable organosiloxane composition comprising constituents (A)-(D): (A) a Si-aryl and Si-alkyl functional organopolysiloxane containing an average, per molecule, of at least two silicon-bonded alkenyl groups; (B) a Si-aryl and/or Si-alkyl functional organosilicon compound containing an average of at least two silicon-bonded hydrogen atoms per molecule; (C) a hydrosilylation catalyst; and (D) the athermo-optical filler; wherein the athermo-optical filler is pre-formed prior to being contacted with constituents (A) to (C); wherein the athermo-optical filler is at a concentration from 1 to 45 weight percent (wt %) based on total weight of the curable organosiloxane composition.

14. A method of making the smart optical material of claim 7, the method comprising subjecting a curable formulation comprising a uniform mixture of the athermo-optical filler widely dispersed in a mixture of two or more matrix-forming precursors to a curing condition sufficient to convert the matrix-forming precursors to the thermo-optical matrix, and thereby make the smart optical material.

15. A lens comprising the smart optical material of claim 7 configured in a shape for converging or diverging light rays.

* * * * *